United States Patent
Li et al.

(10) Patent No.: US 12,492,336 B2
(45) Date of Patent: *Dec. 9, 2025

(54) ORGANIC LIGHT-EMITTING DIODES WITH FLUORESCENT AND PHOSPHORESCENT EMITTERS

(71) Applicant: ARIZONA BOARD OF REGENTS ON BEHALF OF ARIZONA STATE UNIVERSITY, Scottsdale, AZ (US)

(72) Inventors: Jian Li, Tempe, AZ (US); Tyler Fleetham, Gilbert, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/302,880

(22) Filed: Apr. 19, 2023

(65) Prior Publication Data
US 2023/0263002 A1 Aug. 17, 2023

Related U.S. Application Data

(63) Continuation of application No. 17/716,638, filed on Apr. 8, 2022, which is a continuation of application
(Continued)

(51) Int. Cl.
*C09K 11/06* (2006.01)
*H10K 50/11* (2023.01)
(Continued)

(52) U.S. Cl.
CPC .............. *C09K 11/06* (2013.01); *H10K 50/11* (2023.02); *H10K 50/121* (2023.02);
(Continued)

(58) Field of Classification Search
CPC . H10K 50/121; H10K 50/11; C09K 2211/185
See application file for complete search history.

(56) References Cited

U.S. PATENT DOCUMENTS

| 4,769,292 A | 9/1988 | Tang |
| 5,451,674 A | 9/1995 | Silver |

(Continued)

FOREIGN PATENT DOCUMENTS

| CN | 1680366 A | 10/2005 |
| CN | 1777663 | 5/2006 |

(Continued)

OTHER PUBLICATIONS

L.S Hung, C.H Chen, Recent progress of molecular organic electroluminescent materials and devices, Mat. Sci and Eng. R, 39 (2002), pp. 143-222. (Year: 2002).*

(Continued)

*Primary Examiner* — Sean M DeGuire
(74) *Attorney, Agent, or Firm* — Riverside Law LLP

(57) ABSTRACT

A light emitting device includes a first electrode, a hole transporting layer in contact with the first electrode, a second electrode, an electron transporting layer in contact with the second electrode; and an emissive layer between the hole transporting layer and the electron transporting layer. The emissive layer includes a phosphorescent emitter, a fluorescent emitter, and a host, and the phosphorescent emitter harvests electrogenerated excitons and transfers energy to the fluorescent emitter.

12 Claims, 13 Drawing Sheets

Related U.S. Application Data

No. 15/505,527, filed as application No. PCT/US2015/046333 on Aug. 21, 2015, now Pat. No. 11,329,244.

(60) Provisional application No. 62/040,470, filed on Aug. 22, 2014.

(51) Int. Cl.
| | |
|---|---|
| *H10K 50/12* | (2023.01) |
| *H10K 50/15* | (2023.01) |
| *H10K 50/16* | (2023.01) |
| *H10K 85/60* | (2023.01) |
| *H10K 101/10* | (2023.01) |

(52) U.S. Cl.
CPC ......... *H10K 50/156* (2023.02); *H10K 50/166* (2023.02); *H10K 85/6572* (2023.02); *C09K 2211/1011* (2013.01); *C09K 2211/1029* (2013.01); *C09K 2211/185* (2013.01); *H10K 85/631* (2023.02); *H10K 2101/10* (2023.02)

(56) References Cited

U.S. PATENT DOCUMENTS

| | | | |
|---|---|---|---|
| 5,641,878 | A | 6/1997 | Dandliker |
| 5,707,745 | A | 1/1998 | Forrest |
| 5,844,363 | A | 12/1998 | Gu |
| 6,200,695 | B1 | 3/2001 | Arai |
| 6,303,238 | B1 | 10/2001 | Thompson |
| 6,780,528 | B2 | 8/2004 | Tsuboyama |
| 7,002,013 | B1 | 2/2006 | Chi |
| 7,037,599 | B2 | 5/2006 | Culligan |
| 7,064,228 | B1 | 6/2006 | Yu |
| 7,268,485 | B2 | 9/2007 | Tyan |
| 7,279,704 | B2 | 10/2007 | Walters |
| 7,332,232 | B2 | 2/2008 | Ma |
| 7,442,797 | B2 | 10/2008 | Itoh |
| 7,501,190 | B2 | 3/2009 | Ise |
| 7,635,792 | B1 | 12/2009 | Cella |
| 7,655,322 | B2 | 2/2010 | Forrest |
| 7,854,513 | B2 | 12/2010 | Quach |
| 7,947,383 | B2 | 5/2011 | Ise |
| 8,106,199 | B2 | 1/2012 | Jabbour |
| 8,133,597 | B2 | 3/2012 | Yasukawa |
| 8,389,725 | B2 | 3/2013 | Li |
| 8,617,723 | B2 | 12/2013 | Stoessel |
| 8,669,364 | B2 | 3/2014 | Li |
| 8,778,509 | B2 | 7/2014 | Yasukawa |
| 8,816,080 | B2 | 8/2014 | Li |
| 8,846,940 | B2 | 9/2014 | Li |
| 8,871,361 | B2 | 10/2014 | Xia |
| 8,927,713 | B2 | 1/2015 | Li |
| 8,946,417 | B2 | 2/2015 | Jian |
| 8,987,451 | B2 | 3/2015 | Tsai |
| 9,059,412 | B2 | 6/2015 | Zeng |
| 9,076,974 | B2 | 7/2015 | Li |
| 9,082,989 | B2 | 7/2015 | Li |
| 9,203,039 | B2 | 12/2015 | Li |
| 9,221,857 | B2 | 12/2015 | Li |
| 9,224,963 | B2 | 12/2015 | Li |
| 9,238,668 | B2 | 1/2016 | Li |
| 9,312,502 | B2 | 4/2016 | Li |
| 9,312,505 | B2 | 4/2016 | Brooks |
| 9,318,725 | B2 | 4/2016 | Li |
| 9,324,957 | B2 | 4/2016 | Li |
| 9,382,273 | B2 | 7/2016 | Li |
| 9,385,329 | B2 | 7/2016 | Li |
| 9,425,415 | B2 | 8/2016 | Li |
| 9,461,254 | B2 | 10/2016 | Tsai |
| 9,493,698 | B2 | 11/2016 | Beers |
| 9,502,671 | B2 | 11/2016 | Jian |
| 9,550,801 | B2 | 1/2017 | Li |
| 9,598,449 | B2 | 3/2017 | Li |
| 9,617,291 | B2 | 4/2017 | Li |
| 9,666,822 | B2 | 5/2017 | Forrest |
| 9,673,409 | B2 | 6/2017 | Li |
| 9,698,359 | B2 | 7/2017 | Li |
| 9,711,739 | B2 | 7/2017 | Li |
| 9,711,741 | B2 | 7/2017 | Li |
| 9,711,742 | B2 | 7/2017 | Li |
| 9,735,397 | B2 | 8/2017 | Riegel |
| 9,755,163 | B2 | 9/2017 | Li |
| 9,818,959 | B2 | 11/2017 | Li |
| 9,865,825 | B2 | 1/2018 | Li |
| 9,879,039 | B2 | 1/2018 | Li |
| 9,882,150 | B2 | 1/2018 | Li |
| 9,899,614 | B2 | 2/2018 | Li |
| 9,920,242 | B2 | 3/2018 | Li |
| 9,923,155 | B2 | 3/2018 | Li |
| 9,941,479 | B2 | 4/2018 | Li |
| 9,947,881 | B2 | 4/2018 | Li |
| 9,985,224 | B2 | 5/2018 | Li |
| 10,020,455 | B2 | 7/2018 | Li |
| 10,033,003 | B2 | 7/2018 | Li |
| 10,056,564 | B2 | 8/2018 | Li |
| 10,056,567 | B2 | 8/2018 | Li |
| 10,158,091 | B2 | 12/2018 | Li |
| 10,177,323 | B2 | 1/2019 | Li |
| 10,211,411 | B2 | 2/2019 | Li |
| 10,211,414 | B2 | 2/2019 | Li |
| 10,263,197 | B2 | 4/2019 | Li |
| 10,294,417 | B2 | 5/2019 | Li |
| 10,392,387 | B2 | 8/2019 | Li |
| 10,411,202 | B2 | 9/2019 | Li |
| 10,414,785 | B2 | 9/2019 | Li |
| 10,516,117 | B2 | 12/2019 | Li |
| 10,566,553 | B2 | 2/2020 | Li |
| 10,566,554 | B2 | 2/2020 | Li |
| 10,622,571 | B2 | 4/2020 | Li |
| 10,836,785 | B2 | 11/2020 | Li |
| 2001/0019782 | A1 | 9/2001 | Igarashi |
| 2002/0008233 | A1* | 1/2002 | Forrest ................. H10K 85/341 257/89 |
| 2002/0034656 | A1 | 3/2002 | Thompson |
| 2002/0068190 | A1 | 6/2002 | Tsuboyama |
| 2003/0062519 | A1 | 4/2003 | Yamazaki |
| 2003/0180574 | A1 | 9/2003 | Huang |
| 2003/0186077 | A1 | 10/2003 | Chen |
| 2004/0230061 | A1 | 11/2004 | Seo |
| 2004/0258956 | A1 | 12/2004 | Matsusue |
| 2005/0037232 | A1 | 2/2005 | Tyan |
| 2005/0139810 | A1 | 6/2005 | Kuehl |
| 2005/0170207 | A1 | 8/2005 | Ma |
| 2005/0260446 | A1 | 11/2005 | Mackenzie |
| 2006/0024522 | A1 | 2/2006 | Thompson |
| 2006/0032528 | A1 | 2/2006 | Wang |
| 2006/0066228 | A1 | 3/2006 | Antoniadis |
| 2006/0073359 | A1 | 4/2006 | Ise |
| 2006/0094875 | A1 | 5/2006 | Itoh |
| 2006/0127696 | A1 | 6/2006 | Stossel |
| 2006/0182992 | A1 | 8/2006 | Nii |
| 2006/0202197 | A1 | 9/2006 | Nakayama |
| 2006/0210831 | A1 | 9/2006 | Sano |
| 2006/0255721 | A1 | 11/2006 | Igarashi |
| 2006/0263635 | A1 | 11/2006 | Ise |
| 2006/0286406 | A1 | 12/2006 | Igarashi |
| 2007/0057630 | A1 | 3/2007 | Nishita |
| 2007/0059551 | A1 | 3/2007 | Yamazaki |
| 2007/0082284 | A1 | 4/2007 | Stoessel |
| 2007/0103060 | A1 | 5/2007 | Itoh |
| 2007/0160905 | A1 | 7/2007 | Morishita |
| 2007/0252140 | A1 | 11/2007 | Limmert |
| 2008/0001530 | A1 | 1/2008 | Ise |
| 2008/0036373 | A1 | 2/2008 | Itoh |
| 2008/0054799 | A1 | 3/2008 | Satou |
| 2008/0079358 | A1 | 4/2008 | Satou |
| 2008/0102310 | A1* | 5/2008 | Thompson ............ H10K 50/125 313/503 |
| 2008/0111476 | A1 | 5/2008 | Choi |
| 2008/0241518 | A1 | 10/2008 | Satou |
| 2008/0241589 | A1 | 10/2008 | Fukunaga |
| 2008/0269491 | A1 | 10/2008 | Jabbour |
| 2008/0315187 | A1 | 12/2008 | Bazan |

(56) References Cited

U.S. PATENT DOCUMENTS

| | | |
|---|---|---|
| 2009/0026936 A1 | 1/2009 | Satou |
| 2009/0026939 A1 | 1/2009 | Kinoshita |
| 2009/0032989 A1 | 2/2009 | Karim |
| 2009/0039768 A1 | 2/2009 | Igarashi |
| 2009/0079340 A1 | 3/2009 | Kinoshita |
| 2009/0126796 A1 | 5/2009 | Yang |
| 2009/0128008 A1 | 5/2009 | Ise |
| 2009/0136779 A1 | 5/2009 | Cheng |
| 2009/0153045 A1 | 6/2009 | Kinoshita |
| 2009/0167167 A1 | 7/2009 | Aoyama |
| 2009/0205713 A1 | 8/2009 | Mitra |
| 2009/0218561 A1 | 9/2009 | Kitamura |
| 2009/0261721 A1 | 10/2009 | Murakami |
| 2009/0267500 A1 | 10/2009 | Kinoshita |
| 2010/0000606 A1 | 1/2010 | Thompson |
| 2010/0013386 A1 | 1/2010 | Thompson |
| 2010/0043876 A1 | 2/2010 | Tuttle |
| 2010/0093119 A1 | 4/2010 | Shimizu |
| 2010/0127246 A1 | 5/2010 | Nakayama |
| 2010/0141127 A1 | 6/2010 | Xia |
| 2010/0147386 A1 | 6/2010 | Benson-Smith |
| 2010/0171111 A1 | 7/2010 | Takada |
| 2010/0171418 A1 | 7/2010 | Kinoshita |
| 2010/0200051 A1 | 8/2010 | Triani |
| 2010/0204467 A1 | 8/2010 | Lamarque |
| 2010/0270540 A1 | 10/2010 | Chung |
| 2010/0288362 A1 | 11/2010 | Hatwar |
| 2010/0297522 A1 | 11/2010 | Creeth |
| 2010/0307594 A1 | 12/2010 | Zhu |
| 2011/0028723 A1 | 2/2011 | Li |
| 2011/0049496 A1 | 3/2011 | Fukuzaki |
| 2011/0062858 A1 | 3/2011 | Yersin |
| 2011/0132440 A1 | 6/2011 | Sivarajan |
| 2011/0217544 A1 | 9/2011 | Young |
| 2011/0227058 A1 | 9/2011 | Masui |
| 2011/0301351 A1 | 12/2011 | Li |
| 2012/0024383 A1 | 2/2012 | Kaiho |
| 2012/0025588 A1 | 2/2012 | Humbert |
| 2012/0039323 A1 | 2/2012 | Hirano |
| 2012/0095232 A1 | 4/2012 | Li |
| 2012/0108806 A1 | 5/2012 | Li |
| 2012/0146012 A1 | 6/2012 | Limmert |
| 2012/0181528 A1 | 7/2012 | Takada |
| 2012/0199823 A1 | 8/2012 | Molt |
| 2012/0202997 A1 | 8/2012 | Parham |
| 2012/0204960 A1 | 8/2012 | Kato |
| 2012/0215001 A1 | 8/2012 | Li |
| 2012/0223634 A1 | 9/2012 | Xia |
| 2012/0264938 A1 | 10/2012 | Li |
| 2012/0273736 A1 | 11/2012 | James |
| 2012/0302753 A1 | 11/2012 | Li |
| 2013/0048963 A1 | 2/2013 | Beers |
| 2013/0082245 A1 | 4/2013 | Kottas |
| 2013/0137870 A1 | 5/2013 | Li |
| 2013/0168656 A1 * | 7/2013 | Tsai .................. H10K 85/40 546/4 |
| 2013/0172561 A1 | 7/2013 | Tsai |
| 2013/0200340 A1 | 8/2013 | Otsu |
| 2013/0203996 A1 | 8/2013 | Li |
| 2013/0237706 A1 | 9/2013 | Li |
| 2013/0341600 A1 | 12/2013 | Lin |
| 2014/0014922 A1 | 1/2014 | Lin |
| 2014/0014931 A1 | 1/2014 | Riegel |
| 2014/0027733 A1 | 1/2014 | Zeng |
| 2014/0042475 A1 | 2/2014 | Park |
| 2014/0066628 A1 | 3/2014 | Li |
| 2014/0073798 A1 | 3/2014 | Li |
| 2014/0084261 A1 | 3/2014 | Brooks |
| 2014/0114072 A1 | 4/2014 | Li |
| 2014/0147996 A1 | 5/2014 | Vogt |
| 2014/0148594 A1 | 5/2014 | Li |
| 2014/0191206 A1 | 7/2014 | Cho |
| 2014/0203248 A1 | 7/2014 | Zhou |
| 2014/0249310 A1 | 9/2014 | Li |
| 2014/0326960 A1 | 11/2014 | Kim |
| 2014/0330019 A1 | 11/2014 | Li |
| 2014/0364605 A1 | 12/2014 | Li |
| 2015/0008419 A1 | 1/2015 | Li |
| 2015/0018558 A1 | 1/2015 | Li |
| 2015/0028323 A1 | 1/2015 | Xia |
| 2015/0060804 A1 | 3/2015 | Kanitz |
| 2015/0069334 A1 | 3/2015 | Xia |
| 2015/0105556 A1 | 4/2015 | Li |
| 2015/0123047 A1 | 5/2015 | Maltenberger |
| 2015/0162552 A1 | 6/2015 | Li |
| 2015/0194616 A1 | 7/2015 | Li |
| 2015/0207086 A1 | 7/2015 | Li |
| 2015/0228914 A1 | 8/2015 | Li |
| 2015/0274762 A1 | 10/2015 | Li |
| 2015/0287938 A1 | 10/2015 | Li |
| 2015/0311456 A1 | 10/2015 | Li |
| 2015/0318500 A1 | 11/2015 | Li |
| 2015/0349279 A1 | 12/2015 | Li |
| 2015/0380666 A1 | 12/2015 | Szigethy |
| 2016/0028028 A1 | 1/2016 | Li |
| 2016/0028029 A1 | 1/2016 | Li |
| 2016/0043331 A1 | 2/2016 | Li |
| 2016/0072082 A1 | 3/2016 | Brooks |
| 2016/0133861 A1 | 5/2016 | Li |
| 2016/0133862 A1 | 5/2016 | Li |
| 2016/0181529 A1 | 6/2016 | Tsai |
| 2016/0194344 A1 | 7/2016 | Li |
| 2016/0197285 A1 | 7/2016 | Zeng |
| 2016/0197291 A1 | 7/2016 | Li |
| 2016/0285015 A1 | 9/2016 | Li |
| 2016/0359120 A1 | 12/2016 | Li |
| 2016/0359125 A1 | 12/2016 | Li |
| 2017/0005278 A1 | 1/2017 | Li |
| 2017/0012224 A1 | 1/2017 | Li |
| 2017/0040555 A1 | 2/2017 | Li |
| 2017/0047533 A1 | 2/2017 | Li |
| 2017/0066792 A1 | 3/2017 | Li |
| 2017/0069855 A1 | 3/2017 | Li |
| 2017/0077420 A1 | 3/2017 | Li |
| 2017/0125708 A1 | 5/2017 | Li |
| 2017/0267923 A1 | 9/2017 | Li |
| 2017/0271611 A1 | 9/2017 | Li |
| 2017/0301871 A1 | 10/2017 | Li |
| 2017/0305881 A1 | 10/2017 | Li |
| 2017/0309943 A1 | 10/2017 | Angell |
| 2017/0331056 A1 | 11/2017 | Li |
| 2017/0342098 A1 | 11/2017 | Li |
| 2017/0373260 A1 | 12/2017 | Li |
| 2018/0006246 A1 | 1/2018 | Li |
| 2018/0013096 A1 | 1/2018 | Hamada |
| 2018/0052366 A1 | 2/2018 | Hao |
| 2018/0053904 A1 | 2/2018 | Li |
| 2018/0130960 A1 | 5/2018 | Li |
| 2018/0138428 A1 | 5/2018 | Li |
| 2018/0148464 A1 | 5/2018 | Li |
| 2018/0159051 A1 | 6/2018 | Li |
| 2018/0166655 A1 | 6/2018 | Li |
| 2018/0175329 A1 | 6/2018 | Li |
| 2018/0194790 A1 | 7/2018 | Li |
| 2018/0219161 A1 | 8/2018 | Li |
| 2018/0226592 A1 | 8/2018 | Li |
| 2018/0226593 A1 | 8/2018 | Li |
| 2018/0277777 A1 | 9/2018 | Li |
| 2018/0301641 A1 | 10/2018 | Li |
| 2018/0312750 A1 | 11/2018 | Li |
| 2018/0331307 A1 | 11/2018 | Li |
| 2018/0334459 A1 | 11/2018 | Li |
| 2018/0337345 A1 | 11/2018 | Li |
| 2018/0337349 A1 | 11/2018 | Li |
| 2018/0337350 A1 | 11/2018 | Li |
| 2018/0353771 A1 | 12/2018 | Kim |
| 2019/0013478 A1 | 1/2019 | Iijima |
| 2019/0013485 A1 | 1/2019 | Li |
| 2019/0058137 A1 | 2/2019 | Ko |
| 2019/0067602 A1 | 2/2019 | Li |
| 2019/0109288 A1 | 4/2019 | Li |
| 2019/0119312 A1 | 4/2019 | Chen |
| 2019/0157352 A1 | 5/2019 | Li |
| 2019/0194536 A1 | 6/2019 | Li |

(56) References Cited

U.S. PATENT DOCUMENTS

| | | |
|---|---|---|
| 2019/0259963 A1 | 8/2019 | Jian |
| 2019/0276485 A1 | 9/2019 | Li |
| 2019/0312217 A1 | 10/2019 | Li |
| 2019/0367546 A1 | 12/2019 | Li |
| 2019/0389893 A1 | 12/2019 | Li |
| 2020/0006678 A1 | 1/2020 | Li |
| 2020/0071330 A1 | 3/2020 | Li |
| 2020/0075868 A1 | 3/2020 | Li |
| 2020/0119288 A1 | 4/2020 | Li |
| 2020/0119289 A1 | 4/2020 | Lin |
| 2020/0140471 A1 | 5/2020 | Chen |
| 2020/0152891 A1 | 5/2020 | Li |
| 2020/0227656 A1 | 7/2020 | Li |
| 2020/0227660 A1 | 7/2020 | Li |
| 2020/0239505 A1 | 7/2020 | Li |
| 2020/0243776 A1 | 7/2020 | Li |
| 2020/0287153 A1 | 9/2020 | Li |
| 2020/0332185 A1 | 10/2020 | Li |
| 2020/0373505 A1 | 11/2020 | Li |
| 2020/0403167 A1 | 12/2020 | Li |
| 2021/0024526 A1 | 1/2021 | Li |
| 2021/0024559 A1 | 1/2021 | Li |
| 2021/0047296 A1 | 2/2021 | Li |
| 2021/0091316 A1 | 3/2021 | Li |

FOREIGN PATENT DOCUMENTS

| | | |
|---|---|---|
| CN | 1894267 | 1/2007 |
| CN | 1894269 A | 1/2007 |
| CN | 101142223 A | 3/2008 |
| CN | 101667626 | 3/2010 |
| CN | 102449108 A | 5/2012 |
| CN | 102892860 A | 1/2013 |
| CN | 102971396 A | 3/2013 |
| CN | 103102372 | 5/2013 |
| CN | 104232076 A | 12/2014 |
| CN | 104377231 | 2/2015 |
| CN | 104576934 | 4/2015 |
| CN | 104693243 A | 6/2015 |
| CN | 105367605 A | 3/2016 |
| CN | 105418591 A | 3/2016 |
| CN | 106783922 | 5/2017 |
| EP | 1617493 | 1/2006 |
| EP | 1808052 A1 | 7/2007 |
| EP | 1874893 A1 | 1/2008 |
| EP | 1874894 A1 | 1/2008 |
| EP | 1919928 A1 | 5/2008 |
| EP | 1968131 | 9/2008 |
| EP | 2020694 | 2/2009 |
| EP | 2036907 A1 | 3/2009 |
| EP | 2096690 | 9/2009 |
| EP | 2112213 A2 | 10/2009 |
| EP | 2417217 A2 | 2/2012 |
| EP | 2684932 | 1/2014 |
| EP | 2711999 A2 | 3/2014 |
| EP | 3032293 | 6/2016 |
| JP | 2002010505 | 1/2002 |
| JP | 2002105055 | 4/2002 |
| JP | 2003342284 | 12/2003 |
| JP | 2005031073 | 2/2005 |
| JP | 2005267557 | 9/2005 |
| JP | 2005310733 A | 11/2005 |
| JP | 2006047240 A | 2/2006 |
| JP | 2006232784 A | 9/2006 |
| JP | 2006242080 | 9/2006 |
| JP | 2006242081 A | 9/2006 |
| JP | 2006256999 A | 9/2006 |
| JP | 2006257238 A | 9/2006 |
| JP | 2006261623 A | 9/2006 |
| JP | 2006290988 A | 10/2006 |
| JP | 2006313796 A | 11/2006 |
| JP | 2006332622 A | 12/2006 |
| JP | 2006351638 A | 12/2006 |
| JP | 2007019462 A | 1/2007 |
| JP | 2007031678 | 2/2007 |
| JP | 2007042875 A | 2/2007 |
| JP | 2007051243 A | 3/2007 |
| JP | 2007053132 A | 3/2007 |
| JP | 2007066581 | 3/2007 |
| JP | 2007073620 A | 3/2007 |
| JP | 2007073845 A | 3/2007 |
| JP | 2007073900 A | 3/2007 |
| JP | 2007080593 | 3/2007 |
| JP | 2007080677 A | 3/2007 |
| JP | 2007088105 | 4/2007 |
| JP | 2007088164 A | 4/2007 |
| JP | 2007096259 A | 4/2007 |
| JP | 2007099765 A | 4/2007 |
| JP | 2007110067 | 4/2007 |
| JP | 2007110102 A | 4/2007 |
| JP | 2007519614 | 7/2007 |
| JP | 2007258550 A | 10/2007 |
| JP | 2007324309 A | 12/2007 |
| JP | 2008010353 A | 1/2008 |
| JP | 2008091860 A | 4/2008 |
| JP | 2008103535 A | 5/2008 |
| JP | 2008108617 A | 5/2008 |
| JP | 2008109085 | 5/2008 |
| JP | 2008109103 A | 5/2008 |
| JP | 2008116343 A | 5/2008 |
| JP | 2008117545 A | 5/2008 |
| JP | 2008160087 A | 7/2008 |
| JP | 2008198801 A | 8/2008 |
| JP | 2008270729 A | 11/2008 |
| JP | 2008270736 | 11/2008 |
| JP | 2008310220 A | 12/2008 |
| JP | 2009016184 A | 1/2009 |
| JP | 2009016579 | 1/2009 |
| JP | 2009032977 A | 2/2009 |
| JP | 2009032988 A | 2/2009 |
| JP | 2009059997 | 3/2009 |
| JP | 2009076509 | 4/2009 |
| JP | 2009161524 A | 7/2009 |
| JP | 2009247171 | 10/2009 |
| JP | 2009266943 A | 11/2009 |
| JP | 2009267171 A | 11/2009 |
| JP | 2009267244 A | 11/2009 |
| JP | 2009272339 A | 11/2009 |
| JP | 2009283891 A | 12/2009 |
| JP | 2010135689 A | 6/2010 |
| JP | 2010171205 A | 8/2010 |
| JP | 2011071452 A | 4/2011 |
| JP | 2012079895 A | 4/2012 |
| JP | 2012079898 A | 4/2012 |
| JP | 5604505 | 9/2012 |
| JP | 2012522843 | 9/2012 |
| JP | 2012207231 A | 10/2012 |
| JP | 2012222255 A | 11/2012 |
| JP | 2012231135 A | 11/2012 |
| JP | 2013023500 A | 2/2013 |
| JP | 2013048256 A | 3/2013 |
| JP | 2013053149 A | 3/2013 |
| JP | 2013525436 | 6/2013 |
| JP | 2014019701 A | 2/2014 |
| JP | 2014058504 A | 4/2014 |
| JP | 2014520096 | 8/2014 |
| JP | 2012709899 | 11/2014 |
| JP | 2014221807 A | 11/2014 |
| JP | 2014239225 A | 12/2014 |
| JP | 2015081257 A | 4/2015 |
| KR | 20060011537 | 2/2006 |
| KR | 20060015371 | 2/2006 |
| KR | 20060115371 | 11/2006 |
| KR | 20070061830 | 6/2007 |
| KR | 20070112465 | 11/2007 |
| KR | 20130043460 A | 4/2013 |
| KR | 101338250 | 12/2013 |
| KR | 20140052501 | 5/2014 |
| TW | 200701835 | 1/2007 |
| TW | 201249851 | 12/2012 |
| TW | 201307365 A | 2/2013 |
| TW | 201710277 | 3/2017 |
| WO | 2000070655 | 11/2000 |
| WO | 2004003108 | 1/2004 |

(56) References Cited

FOREIGN PATENT DOCUMENTS

| WO | 2004070655 | | 8/2004 | |
| WO | 2004085450 | | 10/2004 | |
| WO | 2004108857 | | 12/2004 | |
| WO | 2005042444 | A2 | 5/2005 | |
| WO | 2005042550 | A1 | 5/2005 | |
| WO | 2005113704 | | 12/2005 | |
| WO | 2006033440 | A1 | 3/2006 | |
| WO | 2006067074 | | 6/2006 | |
| WO | 2006081780 | | 8/2006 | |
| WO | 2006098505 | A1 | 9/2006 | |
| WO | 2006113106 | | 10/2006 | |
| WO | 2006115299 | A1 | 11/2006 | |
| WO | 2006115301 | | 11/2006 | |
| WO | 2007034985 | A1 | 3/2007 | |
| WO | 2007069498 | A1 | 6/2007 | |
| WO | 2008054578 | | 5/2008 | |
| WO | 2008066192 | A1 | 6/2008 | |
| WO | 2008066195 | A1 | 6/2008 | |
| WO | 2008066196 | A1 | 6/2008 | |
| WO | 2008101842 | A1 | 8/2008 | |
| WO | 2008117889 | | 10/2008 | |
| WO | 2008123540 | | 10/2008 | |
| WO | 2008131932 | A1 | 11/2008 | |
| WO | 2009003455 | | 1/2009 | |
| WO | 2009008277 | | 1/2009 | |
| WO | 2009011327 | | 1/2009 | |
| WO | 2009017211 | A1 | 2/2009 | |
| WO | 2009023667 | | 2/2009 | |
| WO | 2009086209 | | 7/2009 | |
| WO | 2009111299 | | 9/2009 | |
| WO | 2010007098 | A1 | 1/2010 | |
| WO | 2010056669 | | 5/2010 | |
| WO | 2010093176 | | 8/2010 | |
| WO | 2010105141 | | 9/2010 | |
| WO | 2010118026 | A2 | 10/2010 | |
| WO | 2011064335 | A1 | 6/2011 | |
| WO | 2011070989 | A1 | 6/2011 | |
| WO | 2011089163 | | 7/2011 | |
| WO | 2011137429 | A2 | 11/2011 | |
| WO | 2011137431 | A2 | 11/2011 | |
| WO | 2012074909 | | 6/2012 | |
| WO | 2012112853 | A1 | 8/2012 | |
| WO | 2012116231 | | 8/2012 | |
| WO | 2012142387 | | 10/2012 | |
| WO | 2012162488 | A1 | 11/2012 | |
| WO | 2012163471 | A1 | 12/2012 | |
| WO | WO-2013039413 | A1 * | 3/2013 | ............... C07F 5/02 |
| WO | 2013130483 | A1 | 9/2013 | |
| WO | 2014009310 | | 1/2014 | |
| WO | 2014016611 | | 1/2014 | |
| WO | 2014031977 | | 2/2014 | |
| WO | 2014047616 | A1 | 3/2014 | |
| WO | 2014109814 | | 7/2014 | |
| WO | 2014208271 | | 12/2014 | |
| WO | 2015027060 | A1 | 2/2015 | |
| WO | 2015131158 | | 9/2015 | |
| WO | 2016025921 | A1 | 2/2016 | |
| WO | 2016029137 | | 2/2016 | |
| WO | 2016029186 | | 2/2016 | |
| WO | 2016197019 | | 12/2016 | |
| WO | 2017117935 | | 7/2017 | |
| WO | 2018071697 | | 4/2018 | |
| WO | 2018140765 | | 8/2018 | |
| WO | 2019079505 | | 4/2019 | |
| WO | 2019079508 | | 4/2019 | |
| WO | 2019079509 | | 4/2019 | |
| WO | 2019236541 | | 12/2019 | |
| WO | 2020018476 | | 1/2020 | |

OTHER PUBLICATIONS

Rui Zhu et al., "Color tuning based on a six-membered chelated iridium (III) complex with aza-aromatic ligand," Chemistry Letters, vol. 34, No. 12, 2005, pp. 1668-1669.

Russell J. Holmes et al., "Blue and Near-UV Phosphorescence from Iridium Complexes with Cyclometalated Pyrazolyl or N-Heterocyclic Carbene Ligands," Inorganic Chemistry, 2005, vol. 44, No. 22, pp. 7995-8003.

S. Lamansky et al., "Synthesis and Characterization of Phosphorescent Cyclometalated Iridium Complexes", Inorg. Chem., vol. 40, pp. 1704-1711, 2001.

Sajoto, T. et al., "Temperature Dependence of Blue Phosphorescent Cyclometalated Ir(III) Complexes", Journal of the American Chemical Society, Jun. 2009, vol. 131, No. 28, pp. 9813-9822 <DOI:10.1021/ja903317w>.

Sakai, Y. et al., "Simple model-free estimation of orientation order parameters of vacuum-deposited and spin-coated amorphous films used in organic light-emitting diodes", Applied Physics Express, Aug. 2015, vol. 8, No. 9, pp. 096601-1-096601-4 <DOI:10.7567/APEX.8.096601>.

Saricifci et al. (1993). "Semiconducting polymerbuckminsterfullerene heterojunctions: diodes photodiodes, and photovoltaic cells," Appl. Phys. Lett., 62, 585-87.

Satake et al., "Interconvertible Cationic and Neutral Pyridinylimidazole η3-Allylpalladium Complexes. Structural Assignment by 1H, 13C, and 15N NMR and X-ray Diffraction", Organometallics, vol. 18, No. 24, 1999, pp. 5108-5111.

Saunders et al. (2008). "Nanoparticle-polymer photovoltaic cells," Advances in Colloid and Interface Science, 138, 1-23.

Senes, A. et al., "Transition dipole moment orientation in films of solution processed fluorescent oligomers: investigating the influence of molecular anisotropy", Journal of Materials Chemistry C, Jun. 2016, vol. 4, No. 26, pp. 6302-6308 <DOI:10.1039/c5tc03481g>.

Shih-Chun Lo et al. "High-Triplet-Energy Dendrons: Enhancing the Luminescence of Deep Blue Phosphorescent Indium(III) Complexes" J. Am. Chem. Soc., vol. 131, 2009, pp. 16681-16688.

Shin et al. (2010). "Abrupt morphology change upon thermal annealing in Poly(3-hexathiophene)/soluble fullerene blend films for polymer solar cells," Adv. Funct. Mater., 20, 748-54.

Shiro Koseki et al., "Spin-orbit coupling analyses of the geometrical effects on phosphorescence in Ir(ppy)3 and its derivatives", J. Phys. Chem. C, vol. 117, pp. 5314-5327 (2013).

Shizuo Tokito et al. "Confinement of triplet energy on phosphorescent molecules for highly-efficient organic blue-light-emitting devices" Applied Physics Letters, vol. 83, No. 3, Jul. 21, 2003, pp. 569-571.

Stefan Bernhard, "The First Six Years: A Report," Department of Chemistry, Princeton University, May 2008, 11 pages.

Stephen R. Forrest, "The path to ubiquitous and low-cost organic electronic appliances on plastic," Nature, vol. 428, Apr. 29, 2004, pp. 911-918.

Steven C. F. Kui et al., "Robust phosphorescent platinum(II) complexes with tetradentate OÔNÔCÔN ligands: high efficiency OLEDs with excellent efficiency stability," Chem. Commun., 2013, vol. 49, pp. 1497-1499.

Steven C. F. Kui et al., "Robust Phosphorescent Platinum(II) Complexes Containing Tetradentate OÔNÔCÔN Ligands: Excimeric Excited State and Application in Organic White-Light-Emitting Diodes," Chem. Eur. J., 2013, vol. 19, pp. 69-73.

Strouse, G. et al., "Optical Spectroscopy of Single Crystal [Re(bpy)(CO)4](PF6): Mixing between Charge Transfer and Ligand Centered Excited States", Inorganic Chemistry, Oct. 1995, vol. 34, No. 22, pp. 5578-5587 <DOI:10.1021/ic00126a031>.

Supporting Information: Xiao-Chun Hang et al., "Highly Efficient Blue-Emitting Cyclometalated Platinum(II) Complexes by Judicious Molecular Design," Wiley-VCH 2013, 7 pages.

Sylvia Bettington et al. "Tris-Cyclometalated Iridium(III) Complexes of Carbazole(fluorenyl)pyridine Ligands: Synthesis, Redox and Photophysical Properties, and Electrophosphorescent Light-Emitting Diodes" Chemistry: A European Journal, 2007, vol. 13, pp. 1423-1431.

Tang, C. et al., "Organic electroluminescent diodes", Applied Physics Letters, Jul. 1987, vol. 51, No. 12, pp. 913-915 <DOI:10.1063/1.98799>.

Tsuoboyama, A. et al., "Homoleptic Cyclometalated Iridium Complexes with Highly Efficient Red Phosphorescence and Application

(56) References Cited

OTHER PUBLICATIONS to Organic Light-Emitting Diode", Journal of the American Chemical Society, Sep. 2003, vol. 125, No. 42, pp. 12971-12979 <DOI:10.1021/ja034732d>.
Turro, N., "Modern Molecular Photochemistry" (Sausalito, California, University Science Books, 1991), p. 48. (3 pages).
Tyler Fleetham et al., "Efficient "pure" blue OLEDs employing tetradentate Pt complexes with a narrow spectral bandwidth," Advanced Materials (Weinheim, Germany), Vo. 26, No. 41, 2014, pp. 7116-7121.
Tyler Fleetham et al., "Efficient Red-Emitting Platinum Complex with Long Operational Stability," ACS Appl. Mater. Interfaces 2015, 7, 16240-16246.
V. Adamovich et al., "High efficiency single dopant white electrophosphorescent light emitting diodes", New J. Chem, vol. 26, pp. 1171-1178. 2002.
V. Thamilarasan et al., "Green-emitting phosphorescent iridium(III) complex: Structural, photophysical and electrochemical properties," Inorganica Chimica Acta, vol. 408, 2013, pp. 240-245.
Vanessa Wood et al., "Colloidal quantum dot light-emitting devices," Nano Reviews 1, Jul. 2010, pp. 5202. (7 pages).
Vezzu, D. et al.: Highly luminescent tridentate platinum (II) complexes featured in fused five-six-membered metallacycle and diminishing concentration quenching. Inorganic Chem., vfol. 50 (17), pp. 8261-8273, 2011.
Wang et al. (2010). "The development of nanoscale morphology in polymer: fullerene photovoltaic blends during solvent casting," Soft Matter, 6, 4128-4134.
Wang et al., C(aryl)-C(alkyl) bond formation from Cu(Cl04)2-mediated oxidative cross coupling reaction between arenes and alkyllithium reagents through structurally well-defined Ar—Cu(III) intermediates, Chem Commun, 48: 9418-9420 (2012).
Williams et al., "Organic light-emitting diodes having exclusive near-infrared electrophosphorescence", Applied Physics Letters, vol. 89, pp. 083506 (3 pages), 2006.
Williams, E. et al., "Excimer-Based White Phosphorescent Organic Light-Emitting Diodes with Nearly 100 % Internal Quantum Efficiency", Advanced Materials, Jan. 2007, vol. 19, No. 2, pp. 197-202 <DOI:10.1002/adma.200602174>.
Wong. Challenges in organometallic research—Great opportunity for solar cells and OLEDs. Journal of Organometallic Chemistry 2009, vol. 694, pp. 2644-2647.
Written Opinion mailed on Aug. 17, 2012 for Intl. Pat. App. No. PCT/US2012/039323 filed May 24, 2012 and published as WO 2012/162488 on Nov. 29, 2012 (Applicants—Arizona Board of Regents Acting for and on Behalf of Arizona State University; Inventors-Li et al.; (6 pages).
Xiao-Chu Hang et al., "Highly Efficient Blue-Emitting Cyclometalated Platinum(II) Complexes by Judicious Molecular Design," Angewandte Chemie, International Edition, vol. 52, Issue 26, Jun. 24, 2013, pp. 6753-6756.
Xiaofan Ren et al., "Ultrahigh Energy Gap Hosts in Deep Blue Organic Electrophosphorescent Devices," Chem. Mater., vol. 16, 2004, pp. 4743-4747.
Xin Li et al., "Density functional theory study of photophysical properties of iridium (III) complexes with phenylisoquinoline and phenylpyridine ligands", The Journal of Physical Chemistry C, 2011, vol. 115, No. 42, pp. 20722-20731.
Yakubov, L.A. et al., Synthesis and Properties of Zinc Complexes of mesoHexadecyloxy-Substituted Tetrabenzoporphyrin and Tetrabenzoazaporphyrins, Russian Journal of Organic Chemistry, 2008, vol. 44, No. 5, pp. 755-760.
Yang et al. (2005). "Nanoscale morphology of high-performance polymer solar cells," Nano Lett., 5, 579-83.
Yang, X. et al., "Efficient Blue- and White-Emitting Electrophosphorescent Devices Based on Platinum(II) [1,3-Difluoro-4,6-di(2-pyridinyl)benzene] Chloride", Advanced Materials, Jun. 2008, vol. 20, No. 12, pp. 2405-2409 <DOI:10.1002/adma.200702940>.
Yao et al. (2008). "Effect of solvent mixture on nanoscale phase separation in polymer solar cells," Adv. Funct. Mater., 18, 1783-89.
Yao et al., Cu(Cl04)2-Mediated Arene C—H Bond Halogenations of Azacalixaromatics Using Alkali Metal Halides as Halogen Sources, The Journal of Organic Chemistry, 77(7): 3336-3340 (2012).
Ying Yang et al., "Induction of Circularly Polarized Electroluminescence from an Achiral Light-Emitting Polymer via a Chiral Small-Molecule Dopant," Advanced Materials, vol. 25, Issue 18, May 14, 2013, pp. 2624-2628.
Yu et al. (1995). "Polymer Photovoltaic Cells: Enhanced efficiencies via a network of internal donor-acceptor heterojunctions," Science, 270, 1789-91.
Z Liu et al., "Green and blue-green phosphorescent heteroleptic iridium complexes containing carbazole-functionalized beta-diketonate for non-doped organic light-emitting diodes", Organic Electronics 9 (2008) pp. 171-182.
Z Xu et al., "Synthesis and properties of iridium complexes based 1,3,4-oxadiazoles derivatives", Tetrahedron 64 (2008) pp. 1860-1867.
Zhi-Qiang Zhu et al., "Efficient Cyclometalated Platinum(II) Complex with Superior Operational Stability," Adv. Mater. 29 (2017) 1605002, pp. 1-5.
Zhi-Qiang Zhu et.al., "Harvesting All Electrogenerated Excitons through Metal Assisted Delayed Fluorescent Materials," Adv. Mater. 27 (2015) 2533-2537.
Zhu, W. et al., "Highly efficient electrophosphorescent devices based on conjugated polymers doped with iridium complexes", Applied Physics Letters, Mar. 2002, vol. 80, No. 12, pp. 2045-2047 <DOI:10.1063/1.1461418>.
Holmes, R. et al., "Efficient, deep-blue organic electrophosphorescence by guest charge trapping", Applied Physics Letters, Nov. 2003 [available online Oct. 2003], vol. 83, No. 18, pp. 3818-3820 <DOI:10.1063/1.1624639>.
Huaijun Tang et al., "Novel yellow phosphorescent iridium complexes containing a carbazoleeoxadiazole unit used in polymeric light-emitting diodes", Dyes and Pigments 91 (2011) pp. 413-421.
Imre et al (1996). "Liquid-liquid demixing ffrom solutions of polystyrene. 1. A review. 2. Improved correlation with solvent properties," J. Phys. Chem. Ref. Data, 25, 637-61.
International Preliminary Report on Patentability issued on Nov. 26, 2013 for Intl. Pat. App. No. PCT/US2012/039323 filed May 24, 2012 and published as WO 2012/162488 on Nov. 29, 2012 (Applicants—Arizona Board of Regents Acting for and on Behalf of Arizona State University; Inventors-Li et al.; (7 pages).
Ivaylo Ivanov et al., "Comparison of the INDO band structures of polyacetylene, polythiophene, polyfuran, and polypyrrole," Synthetic Metals, vol. 116, Issues 1-3, Jan. 1, 2001, pp. 111-114.
Jack W. Levell et al., "Carbazole/iridium dendrimer side-chain phosphorescent copolymers for efficient light emitting devices", New J. Chem., 2012, vol. 36, pp. 407-413.
Jan Kalinowski et al., "Light-emitting devices based on organometallic platinum complexes as emitters," Coordination Chemistry Reviews, vol. 255, 2011, pp. 2401-2425.
Jeong et al. (2010). "Improved efficiency of bulk heterojunction poly (3-hexylthiophene):[6,6]-phenyl-C61-butyric acid methyl ester photovoltaic devices using discotic liquid crystal additives," Appl. Phys. Lett . . . 96, 183305. (3 pages).
Jeonghun Kwak et al., "Bright and Efficient Full-Color Colloidal Quantum Dot Light-Emitting Diodes Using an Inverted Device Structure," Nano Letters 12, Apr. 2, 2012, pp. 2362-2366.
Ji Hyun Seo et al., "Efficient blue-green organic light-emitting diodes based on heteroleptic tris-cyclometalated iridium (III) complexes". Thin Solid Films, vol. 517, pp. 1807-1810 (2009).
JP2009267244, English Translation from EPO, Nov. 2009, 80 pages.
JP2010135689, English translation from EPO, dated Jun. 2010, 95 pages.
Kai Li et al., "Light-emitting platinum(II) complexes supported by tetradentate dianionic bis(N-heterocyclic carbene) ligands: towards robust blue electrophosphors," Chem. Sci., 2013, vol. 4, pp. 2630-2644.

(56) References Cited

OTHER PUBLICATIONS

Ke Feng et al., "Norbornene-Based Copolymers Containing Platinum Complexes and Bis(carbazolyl)benzene Groups in Their Side-Chains," Macromolecules, vol. 42, 2009, pp. 6855-6864.
Kim et al.(2009). "Altering the thermodynamics of phase separation in inverted bulk-heterojunction organic solar cells," Adv. Mater., 21, 3110-15.
Kim et al. (2005). "Device annealing effect in organic solar cells with blends of regioregular poly (3-hexylthiophene) and soluble fullerene," Appl. Phys. Lett. 86, 063502. (3 pages).
Kim, HY. et al., "Crystal Organic Light-Emitting Diodes with Perfectly Oriented Non-Doped Pt-Based Emitting Layer", Advanced Functional Materials, Feb. 2016, vol. 28, No. 13, pp. 2526-2532 <DOI:10.1002/adma.201504451>.
Kim, JJ., "Setting up the new efficiency limit of OLEDs; Abstract" [online], Electrical Engineering—Princeton University, Aug. 2014 [retrieved on Aug. 24, 2016], retrieved from the internet: <URL:http://ee.princeton.edu/events/setting-new-efficiency-limit-oled> 2 pages.
Kim, SY. et al., "Organic Light-Emitting Diodes with 30% External Quantum Efficiency Based on a Horizontally Oriented Emitter", Advanced Functional Materials, Mar. 2013, vol. 23, No. 31, pp. 3896-3900 <DOI:10.1002/adfm.201300104 >.
Kroon et al. (2008). "Small bandgap olymers for organic solar cells," Polymer Reviews, 48, 531-82.
Kwon-Hyeon Kim et al., "Controlling Emitting Dipole Orientation with Methyl Substituents on Main Ligand of Iridium Complexes for Highly Efficient Phosphorescent Organic Light-Emitting Diodes", Adv. Optical Mater. 2015, 3, pp. 1191-1196.
Kwong, R. et al., "High operational stability of electrophosphorescent devices", Applied Physics Letters, Jul. 2002 [available online Jun. 2002], vol. 81, No. 1, pp. 162-164 <DOI: 10.1063/1.1489503>.
Lamansky, S. et al., "Cyclometalated Ir complexes in polymer organic light-emitting devices", Journal of Applied Physics, Aug. 2002 [available online Jul. 2002], vol. 92, No. 3, pp. 1570-1575 <10.1063/1.1491587>.
Lampe, T. et al., "Dependence of Phosphorescent Emitter Orientation on Deposition Technique in Doped Organic Films", Chemistry of Materials, Jan. 2016, vol. 28, pp. 712-715 <DOI: 10.1021/acs.chemmater.5b04607>.
Lee et al. (2008). "Processing additives for inproved efficiency from bulk heterojunction solar cells," J. Am. Chem. Soc, 130, 3619-23.
Li et al. (2005). "Investigation of annealing effects and film thickness dependence of polymer solar cells based on poly (3-hexylthiophene)," J. Appl. Phys., 98, 043704. (5 pages).
Li et al. (2007). "Solvent annealing effect in polymer solar cells based on poly(3-hexylthiophene) and methanofullerenes," Adv. Funct. Mater, 17, 1636-44.
Li, J. et al., "Synthesis and characterization of cyclometalated Ir(III) complexes with pyrazolyl ancillary ligands", Polyhedron, Jan. 2004, vol. 23, No. 2-3, pp. 419-428 <DOI:10.1016/j.poly.2003.11.028>.
Li, J., "Efficient and Stable OLEDs Employing Square Planar Metal Complexes and Inorganic Nanoparticles", in DOE SSL R&D Workshop (Raleigh, North Carolina, 2016), Feb. 2016, 15 pages.
Li, J., et al., "Synthetic Control of Excited-State Properties in Cyclometalated Ir(III) Complexes Using Ancillary Ligands", Inorganic Chemistry, Feb. 2005, vol. 44, No. 6, pp. 1713-1727 <DOI:10.1021/ic048599h>.
Liang, et al. (2010). "For the bright future-bulk heterojunction polymer solar cells with power conversion efficiency of 7.4%," Adv. Mater. 22, E135-38.
Lin, Ta et al., "Sky-Blue Organic Light Emitting Diode with 37% External Quantum Efficiency Using Thermally Activated Delayed Fluorescence from Spiroacridine-Triazine Hybrid", Advanced Materials, Aug. 2016, vol. 28, No. 32, pp. 6876-6983 <DOI:10.1002/adma.201601675>.
Maestri et al., "Absorption Spectra and Luminescence Properties of Isomeric Platinum (II) and Palladium (II) Complexes Containing 1,1'-Biphenyldiyl, 2-Phenylpyridine, and 2,2'-Bipyridine as Ligands," Helvetica Chimica Acta, vol. 71, Issue 5, Aug. 10, 1988, pp. 1053-1059.
Marc Lepeltier et al., "Efficient blue green organic light-emitting devices based on a monofluorinated heteroleptic iridium(III) complex," Synthetic Metals, vol. 199, 2015, pp. 139-146.
Markham, J. et al., "High-efficiency green phosphorescence from spin-coated single-layer dendrimer light-emitting diodes", Applied Physics Lettersm Apr. 2002, vol. 80, vol. 15, pp. 2645-2647 <DOI:10.1063/1.1469218>.
Matthew J. Jurow et al., "Understanding and predicting the orientation of heteroleptic phosphors in organic light-emitting materials", Nature Materials, vol. 15, Jan. 2016, pp. 85-93.
Michl, J., "Relationship of bonding to electronic spectra", Accounts of Chemical Research, May 1990, vol. 23, No. 5, pp. 127-128 <DOI:10.1021/ar00173a001>.
Miller, R. et al., "Polysilane high polymers", Chemical Reviews, Sep. 1989, vol. 89, No. 6, pp. 1359-1410 <DOI:10.1021/cr00096a006>.
Morana et al. (2007). "Organic field-effect devices as tool to characterize the bipolar transport in polymer-fullerene blends: the case of P3HT-PCBM," Adv. Funct. Mat., 17, 3274-83.
Moule et al. (2008). "Controlling morphology in Polymer-Fullerene mixtures," Adv. Mater., 20, 240-45.
Murakami; JP 2007324309, English machine translation from EPO, dated Dec. 13, 2007, 89 pages.
Nazeeruddin, M. et al., "Highly Phosphorescence Iridium Complexes and Their Application in Organic Light-Emitting Devices", Journal of the American Chemical Society, Jun. 2003, vol. 125, No. 29, pp. 8790-8797 <DOI:10.1021/ja021413y>.
Nicholas R. Evans et al., "Triplet Energy Back Transfer in Conjugated Polymers with Pendant Phosphorescent Iridium Complexes," J. Am. Chem. Soc., vol. 128, 2006, pp. 6647-6656.
Nillson et al. (2007). "Morphology and phase segregation of spin-casted films of polyfluorene/PCBM Blends," Macromolecules, 40, 8291-8301.
Olynick et al. (2009). "The link between nanoscale feature development in a negative resist and the Hansen solubility sphere," Journal of Polymer Science: Part B: Polymer Physics, 47, 2091-2105.
Peet et al. (2007). "Efficiency enhancement in low-bandgap polymer solar cells by processing with alkane dithiols," Nature Materials, 6, 497-500.
Pivrikas et al. (2008). "Substituting the postproduction treatment for bulk-heterojunction solar cells using chemical additives," Organic Electronics, 9, 775-82.
Pui Keong Chow et al., "Strongly Phosphorescent Palladium(II) Complexes of Tetradentate Ligands with Mixed Oxygen, Carbon, and Nitrogen Donor Atoms: Photophysics, Photochemistry, and Applications," Angew. Chem. Int. Ed. 2013, 52, 11775-11779.
Pui-Keong Chow et al., "Highly luminescent palladium(II) complexes with sub-millisecond blue to green phosphorescent excited states. Photocatalysis and highly efficient PSF-OLEDs," Chem. Sci., 2016, 7, 6083-6098.
Results from SciFinder Compound Search on Dec. 8, 2016. (17 pages).
Kim et al., Highly Efficient Organic Light-Emitting Diodes with Phosphorescent Emitters Having High Quantum Yield and Horizontal Orientation of Transition Dipole Moments. Adv. Mater. 2014, 26, 3843-3847 (Year: 2014).
Cao, L., Klimes, K., Ji, Y. et al. Efficient and stable organic light-emitting devices employing phosphorescent molecular aggregates. Nat. Photonics 15, 230-237 (2021).
Cao, L., Zhu, Z., Klimes, K., & Li, J. (2021). Efficient and Stable Molecular-Aggregate-Based Organic Light-Emitting Diodes with Judicious Ligand Design. Advanced Materials, 33(33), 2101423.
Cheng, T., Wang, Z., Jin, S., Wang, F., Bai, Y., Feng, H., . . . Tan, Z. (2017). Pure Blue and Highly Luminescent Quantum-Dot Light-Emitting Diodes with Enhanced Electron Injection and Exciton Confinement via Partially Oxidized Aluminum Cathode. Advanced Optical Materials, 5(11), 1700035.
Chiba, T., Pu, Y.-J., & Kido, J. (2015). Solution-Processed White Phosphorescent Tandem Organic Light-Emitting Devices. Advanced Materials, 27(32), 4681-4687.

(56) References Cited

OTHER PUBLICATIONS

D'Andrade, B. W., & Forrest, S. R. (2004). White Organic Light-Emitting Devices for Solid-State Lighting. Advanced Materials, 16(18), 1585-1595.
Ding, S., Wu, Z., Qu, X., Tang, H., Wang, K., Xu, B., & Sun, X. W. (2020). Impact of the resistive switching effects in ZnMgO electron transport layer on the aging characteristics of quantum dot light-emitting diodes. Applied Physics Letters, 117(9), 093501.
Faria, J. C. D., Campbell, A. J., & McLachlan, M. A. (2015). ZnO Nanorod Arrays as Electron Injection Layers for Efficient Organic Light Emitting Diodes. Advanced Functional Materials, 25(29), 4657-4663.
H. Hosono, et al., Transparent amorphous oxide semiconductors for organic electronics: Application to inverted OLEDs, Proc. Natl. Acad. Sci. U. S. A. 2017, 114, 233.
J. Wei, C. Zhang, D. Zhang, Y. Zhang, Z. Liu, Z. Li, G. Yu, L. Duan, Angew. Chem. Int. Ed. 2021, 60, 12269.
James D. Bullock, Zhengtao Xu, Silvano Valandro, Muhammad Younus, Jiangeng Xue, and Kirk S. Schanze ;ACS Appl. Electron. Mater. 2020, 2, 4, 1026-1034.
Jeon, S.O., Lee, K.H., Kim, J.S. et al. High-efficiency, long-lifetime deep-blue organic light-emitting diodes. Nat. Photonics 15, 208-215 (2021). https://doi.org/10.1038/s41566-021-00763-5.
John S. Bangsund et al. ,Sub-turn-on exciton quenching due to molecular orientation and polarization in organic light-emitting devices. Sci. Adv.6, eabb2659(2020).
Klimes, K., Zhu, Z., & Li, J. (2019). Efficient Blue Phosphorescent OLEDs with Improved Stability and Color Purity through Judicious Triplet Exciton Management. Advanced Functional Materials, 1903068.
Lee, H., Park, I., Kwak, J., Yoon, D. Y., & Lee, C. (2010). Improvement of electron injection in inverted bottom-emission blue phosphorescent organic light emitting diodes using zinc oxide nanoparticles. Applied Physics Letters, 96 (15), 153306.
Liu, C., Zhang, D., Li, Z., Zhang, X., Guo, W., Zhang, L., . . . Long, Y. (2017). Decreased Charge Transport Barrier and Recombination of Organic Solar Cells by Constructing Interfacial Nanojunction with Annealing-Free ZnO and Al Layers. ACS Applied Materials & Interfaces, 9(26), 22068-22075.
Liu, S., Ho, S., Chen, Y., & So, F. (2015). Passivation of Metal Oxide Surfaces for High-Performance Organic and Hybrid Optoelectronic Devices. Chemistry of Materials, 27(7), 2532-2539.
Pu, Y.-J., Chiba, T., Ideta, K., Takahashi, S., Aizawa, N., Hikichi, T., & Kido, J. (2014). Fabrication of Organic Light-Emitting Devices Comprising Stacked Light-Emitting Units by Solution-Based Processes. Advanced Materials, 27(8), 1327-1332.
Q. Su, Y. Sun, H. Zhang, S. Chen, Origin of Positive Aging in Quantum-Dot Light-Emitting Diodes Adv. Sci. 2018, 5, 1800549.
S. SudheendranSwayamprabha, D. K. Dubey, Shahnawaz, R. A. K. Yadav, M. R. Nagar, A. Sharma, F.-C. Tung, J.-H. Jou, Approaches for Long Lifetime Organic Light Emitting Diodes. Adv. Sci. 2021, 8, 2002254.
Salehi, A., Dong, C., Shin, DH et al. Realization of high-efficiency fluorescent organic light-emitting diodes with low driving voltage. Nat Commun 10, 2305 (2019).
Salehi, A., Fu, X., Shin, D.-H., & So, F. (2019). Recent Advances in OLED Optical Design. Advanced Functional Materials, 1808803.
Sessolo, M., & Bolink, H. J. (2011). Hybrid Organic-Inorganic Light-Emitting Diodes. Advanced Materials, 23(16), 1829-1845.
Song, C., Hu, Z., Luo, Y., Cun, Y., Wang, L., Ying, L., . . . Cao, Y. (2018). Organic/Inorganic Hybrid EIL for All-Solution-Processed OLEDs. Advanced Electronic Materials, 4(2), 1700380.
Song, J., Wang, O., Shen, H., Lin, Q., Li, Z., Wang, L., . . . Li, L. S. (2019). Over 30% External Quantum Efficiency Light-Emitting Diodes by Engineering Quantum Dot-Assisted Energy Level Match for Hole Transport Layer. Advanced Functional Materials, 1808377.
Vilas Venunath Patil;Ha Lim Lee; Inkoo Kim;Kyung Hyung Lee;Won Jae Chung;Joonghyuk Kim;Sangho Park;Hyeonho Choi;Won-Joon Son;Soon Ok Jeon;Jun Yeob Lee. Purely Spin-Vibronic Coupling Assisted Triplet to Singlet Up- Conversion for Real Deep Blue Organic Light-Emitting Diodes with Over 20% Efficiency and y Color Coordinate of 0.05 . Adv. Sci. 2021, 8, e2101137.
Wenjuan Zhang, Xingtong Chen, Yuhui Ma, Zhiwei Xu, Longjia Wu, Yixing Yang, Sai-Wing Tsang, and Song Chen; Positive Aging Effect of ZnO Nanoparticles Induced by Surface Stabilization; The Journal of Physical Chemistry Letters 2020 11 (15), 5863-5870.
Yu, Y., Liang, Y., Yong, J., Li, T., Hossain, M. S., Liu, Y., . . . Skafidas, E. (2021). Low-Temperature Solution-Processed Transparent QLED Using Inorganic Metal Oxide Carrier Transport Layers. Advanced Functional Materials, 2106387.
Zhang, C., Zhang, D., Bin, Z., Liu, Z., Zhang, Y., Lee, H., . . . Duan, L. (2021). Color-Tunable All-Fluorescent White Organic Light-Emitting Diodes with a High External Quantum Efficiency Over 30% and Extended Device Lifetime. Advanced Materials, 2103102.
Adachi, C. et al., "High-efficiency organic electrophosphorescent devices with tris(2-phenylpyridine)iridium doped into electron-transporting materials", Applied Physics Letters, Aug. 2000, vol. 77, No. 6, pp. 904-906 <DOI:10.1063/1.1306639>.
Ayan Maity et al., "Room-temperature synthesis of cyclometalated iridium(III) complexes; kinetic isomers and reactive functionalities" Chem. Sci., vol. 4, pp. 1175-1181 (2013).
Baldo et al., "Very High-Efficiency Green Organic Light-Emitting Devices Based on Electrophosphorescence", Appl Phys Lett, 75(3):4-6 (1999).
Baldo et al., "Highly Efficient Phosphorescent Emission from Organic Electroluminescent Devices," Nature, vol. 395, Sep. 10, 1998, pp. 151-154.
Baldo, M. et al., "Excitonic singlet-triplet ratio in a semiconducting organic thin film", Physical Review B, Nov. 1999, vol. 60, No. 20, pp. 14422-14428 <DOI:10.1103/PhysRevB.60.14422>.
Baldo, M. et al., "High-efficiency fluorescent organic light-emitting devices using a phosphorescent sensitizer", Nature, Feb. 2000, vol. 403, pp. 750-753.
Barry O'Brien et al.: White organic light emitting diodes using Pt-based red, green and blue phosphorescent dopants. Proc. SPIE, vol. 8829, pp. 1-6, Aug. 25, 2013.
Barry O'Brien et al., "High efficiency white organic light emitting diodes employing blue and red platinum emitters," Journal of Photonics for Energy, vol. 4, 2014, pp. 043597-1-8.
Berson et al. (2007). "Poly(3-hexylthiophene) fibers for photovoltaic applications," Adv. Funct. Mat., 17, 1377-84.
Bouman et al. (1994). "Chiroptical properties of regioregular chiral polythiophenes," Mol. Cryst. Liq. Cryst., 256, 439-48.
Brian W. D'Andrade et al., "Controlling Exciton Diffusion in Multilayer White Phosphorescent Organic Light Emitting Devices", Adv. Mater., vol. 14, No. 2, Jan. 16, 2002, pp. 147-151.
Bronner; "Dipyrrin based luminescent cyclometallated palladium and platinum complexes", Dalton Trans., 2010, 39, 180-184. DOI: 10.1039/b908424j (Year: 2010) (5 pages).
Brooks, J. et al., "Synthesis and Characterization of Phosphorescent Cyclometalated Platinum Complexes", Inorganic Chemistry, May 2002, vol. 41, No. 12, pp. 3055-3066 <DOI: 10.1021/ic0255508>.
Brown, A. et al., "Optical spectroscopy of triplet excitons and charged excitations in poly(p. phenylenevinylene) light-emitting diodes", Chemical Physics Letters, Jul. 1993, vol. 210, No. 1-3, pp. 61-66 <DOI:10.1016/0009-2614(93) 89100-V>.
Burroughes, J. et al., "Light-emitting diodes based on conjugated polymers", Nature, Oct. 1990, vol. 347, pp. 539-541.
Campbell et al. (2008). "Low-temperature control of nanoscale morphology for high performance polymer photovoltaics," Nano Lett., 8, 3942-47.
Chen, F. et al., "High-performance polymer light-emitting diodes doped with a red phosphorescent iridium complex", Applied Physics Letters, Apr. 2002 [available online Mar. 2002], vol. 80, No. 13, pp. 2308-2310 <10.1063/1.1462862>.
Chen, X., et al., "Fluorescent Chemosensors Based on Spiroring-Opening of Xanthenes and Related Derivatives", Chemical Reviews, 2012 [available online Oct. 2011], vol. 112, No. 3, pp. 1910-1956 <DOI:10.1021/cr200201z>.
Chew, S. et al: Photoluminescence and electroluminescence of a new blue-emitting homoleptic iridium complex. Applied Phys. Letters; vol. 88, pp. 093510-1-093510-3, 2006.

(56) References Cited

OTHER PUBLICATIONS

Chi et al.; Transition-metal phosphors with cyclometalating ligands: fundamentals and applications, Chemical Society Reviews, vol. 39, No. 2, Feb. 2010, pp. 638-655.

Chi-Ming Che et al. "Photophysical Properties and OLEO Applications of Phosphorescent Platinum(II) Schiff Base Complexes," Chem. Eur. J., vol. 16, 2010, pp. 233-247.

Christoph Ulbricht et al., "Synthesis and Characterization of Oxetane-Functionalized Phosphorescent Ir(III)-Complexes", Macromol. Chem. Phys. 2009, 210, pp. 531-541.

Coakley et al. (2004). "Conjugated polymer photovoltaic cells," Chem. Mater., 16, 4533-4542.

Colombo, M. et al., "Synthesis and high-resolution optical spectroscopy of bis[2-(2-thienyl)pyridinato-C3,N'](2,2'-bipyridine)iridium(III)", Inorganic Chemistry, Jul. 1993, vol. 32, No. 14, pp. 3081-3087 <DOI:10.1021/ic00066a019>.

D.F. O'Brien et al., "Improved energy transfer in electrophosphorescent devices," Appl. Phys. Lett., vol. 74, No. 3, Jan. 18, 1999, pp. 442-444.

D'andrade, B. et al., "Operational stability of electrophosphorescent devices containing p and n doped transport layers ", Applied Physics Letters, Nov. 2003, vol. 83, No. 19, pp. 3858-3860 <DOI:10.1063/1.1624473>.

Dan Wang et al., "Carbazole and arylamine functionalized iridium complexes for efficient electro-phosphorescent light-emitting diodes", Inorganica Chimica Acta 370 (2011) pp. 340-345.

Dileep A. K. Vezzu et al., "Highly Luminescent Tetradentate Bis-Cyclometalated Platinum Complexes: Design, Synthesis, Structure, Photophysics, and Electroluminescence Application," Inorg. Chem., vol. 49, 2010, pp. 5107-5119.

Dorwald, Side Reactions in Organic Synthesis 2005, Wiley:VCH Weinheim Preface, pp. 1-15 & Chapter 1, pp. 279-308.

Dorwald; "Side Reactions in Organic Synthesis: A Guide to Successful Synthesis Design," Chapter 1, 2005 Wiley-VCH Verlag Gmbh & Co. KGaA, Wienheim, 32 pages.

Dsouza, R., et al., "Fluorescent Dyes and Their Supramolecular Host/Guest Complexes with Macrocycles in Aqueous Solution", Oct. 2011, vol. 111, No. 12, pp. 7941-7980 <DOI:10.1021/cr200213s>.

Eric Turner et al., "Cyclometalated Platinum Complexes with Luminescent Quantum Yields Approaching 100%," Inorg. Chem., 2013, vol. 52, pp. 7344-7351.

Evan L. Williams et al., "Excimer-Based White Phosphorescent Organic Light Emitting Diodes with Nearly 100% Internal Quantum Efficiency," Adv. Mater., vol. 19, 2007, pp. 197-202.

Finikova, M.A. et al., New Selective Synthesis of Substituted Tetrabenzoporphyris, Doklady Chemistry, 2003, vol. 391, No. 4-6, pp. 222-224.

Fuchs, C. et al., "Enhanced light emission from top-emitting organic light-emitting diodes by optimizing surface plasmon polariton losses", arXiv, submitted Mar. 2015, 11 pages, arXiv:1503.01309.

Fuchs, C. et al., "Enhanced light emission from top-emitting organic light-emitting diodes by optimizing surface plasmon polariton losses", Physical Review B, Dec. 2015, vol. 92, No. 24, pp. 245306-1-245306-10 <DOI:10.1103/PhysRevB.92.245306>.

Galanin et al. Synthesis and Properties of meso-Phenyl-Substituted Tetrabenzoazaporphines Magnesium Complexes. Russian Journal of Organic Chemistry (Translation of Zhurnal Organicheskoi Khimii) (2002), 38(8), 1200-1203.

Galanin et al., meso-Phenyltetrabenzoazaporphyrins and their zinc complexes. Synthesis and spectral properties, Russian Journal of General Chemistry (2005), 75(4), 651-655.

Gather, M. et al., "Recent advances in light outcoupling from white organic light-emitting diodes," Journal of Photonics for Energy, May 2015, vol. 5, No. 1, 057607-1-057607-20 <DOI:10.1117/1.JPE.5.057607>.

Glauco Ponterini et al., "Comparison of Radiationless Decay Processes in Osmium and Platinum Porphyrins," J. Am. Chem. Soc., vol. 105, No. 14, 1983, pp. 4639-4645.

Gong et al., Highly Selective Complexation of Metal Ions by the Self-Tuning Tetraazacalixpyridine macrocycles, Tetrahedron, 65(1): 87-92 (2009).

Gottumukkala,V. et al., Synthesis, cellular uptake and animal toxicity of a tetra carboranylphenyl N-tetrabenzoporphyr in, Bioorganic & Medicinal Chemistry, 2006, vol. 14, pp. 1871-1879.

Graf, A. et al., "Correlating the transition dipole moment orientation of phosphorescent emitter molecules in OLEDs with basic material properties", Journal of Materials Chemistry C, Oct. 2014, vol. 2, No. 48, pp. 10298-10304 <DOI:10.1039/c4tc00997e>.

Guijie Li et al., "Efficient and stable red organic light emitting devices from a tetradentate cyclometalated platinum complex," Organic Electronics, 2014, vol. 15 pp. 1862-1867.

Guijie Li et al., "Modifying Emission Spectral Bandwidth of Phosphorescent Platinum(II) Complexes Through Synthetic Control," Inorg. Chem. 2017, 56, 8244-8256.

Guijie Li et al., Efficient and Stable White Organic Light-Emitting Diodes Employing a Single Emitter, Adv. Mater., 2014, vol. 26, pp. 2931-2936.

Hansen (1969). "The universality of the solubility parameter," I & EC Product Research and Development, 8, 2-11.

Hatakeyama, T. et al., "Ultrapure Blue Thermally Activated Delayed Fluorescence Molecules: Effi cient Homo-Lumo Separation by the Multiple Resonance Effect", Advanced Materials, Apr. 2016, vol. 28, No. 14, pp. 2777-2781, <DOI:10.1002/adma.201505491>.

Hirohiko Fukagawa et al., "Highly Efficient and Stable Red Phosphorescent Organic Light-Emitting Diodes Using Platinum Complexes," Adv. Mater., 2012, vol. 24, pp. 5099-5103.

Hoe-Joo Seo et al., "Blue phosphorescent iridium(III) complexes containing carbazole-functionalized phenyl pyridine for organic light-emitting diodes: energy transfer from carbazolyl moieties to iridium(III) cores", RSC Advances, 2011, 1, pp. 755-757.

\* cited by examiner

ID
ORGANIC LIGHT-EMITTING DIODES WITH FLUORESCENT AND PHOSPHORESCENT EMITTERS

CROSS-REFERENCE TO RELATED APPLICATION

This application is a continuation of, and claims priority to, U.S. patent application Ser. No. 17/716,638, filed Apr. 8, 2022, now pending, which is a continuation of U.S. patent application Ser. No. 15/505,527, filed Feb. 21, 2017, now U.S. Pat. No. 11,329,244, which is a U.S. National Phase Application of International Patent Application No. PCT/US2015/046333 filed on Aug. 21, 2015, which claims the benefit of U.S. Provisional Application Ser. No. 62/040,470, filed on Aug. 22, 2014, the contents of all of which are incorporated herein by reference in their entirety.

STATEMENT OF GOVERNMENT SUPPORT

This invention was made with government support under DE-EE0005075 awarded by the Department of Energy. The government has certain rights in the invention.

TECHNICAL FIELD

This disclosure relates to organic light emitting diodes (OLEDs), and more particularly to OLEDs with emissive layers including phosphorescent and fluorescent emitters.

BACKGROUND

Organic light emitting devices (OLEDs) are typically multilayer devices which upon an applied voltage are capable emitting light from the radiative relaxation of an excited state located on an organic material. OLEDs have found widespread application as an alternative to liquid crystal displays (LCDs) for handheld devices or flat panel displays. Furthermore, OLEDs have shown promise as next generation solid state white lighting, use in medical devices, and as infrared emitters for communication applications. The use of organic materials presents a number of unique benefits including: compatibility with flexible substrates, capabilities for large scale production, and simplified tuning of the emission properties through molecular modification.

FIG. 1 depicts a cross-sectional view of an OLED 100. OLED 100 includes substrate 102, anode 104, hole-transporting material(s) (HTL) 106, light processing material (EML) 108, electron-transporting material(s) (ETL) 110, and a metal cathode layer 112. Anode 104 may be indium tin oxide (ITO). Light processing material 108 may be an emissive material (EML) including an emitter and a host. A typical OLED device includes at least one transparent electrode through which light is emitted. For example, OLEDs that emit through the bottom substrate typically contain a transparent conductive oxide material, such as indium tin oxide, as an anode, while at the cathode a reflective metal is typically used. Alternatively, devices may emit from the top through a thin metal layer as the cathode while having an either opaque or transparent anode layer. In this way it is possible to have dual emission from both top and bottom if such a device is so desired and furthermore it is possible for these OLEDs to be transparent. Sandwiched between the electrodes is typically a multilayer organic stack. A multilayer organic stack typically includes a single layer of hole-transporting materials (HTL), a single layer of emissive materials (EML) including emitters and hosts, a single layer of electron-transporting materials (ETL) and a layer of metal cathode, as depicted in FIG. 1.

For each of the transport layers, care must be taken to optimize the separate process of facilitating charge injection, having efficient charge transport, and confining the charges and excitons in a specified emissive region (typically the emissive layer). Such a process can be achieved through either a single material or through a multilayer stack which may separate the injection, transport, charge confining, and exciton confining tasks. The emissive layer may be composed of a single emissive material, a single emissive material dispersed in a host matrix material, multiple emissive materials dispersed in a host matrix, or any number of emissive materials dispersed in multiple host materials. The host materials are typically chosen carefully to not quench the excited state of the emitter as well as to provide appropriate distribution of charges and excitons within the emissive layer. The emission color of the OLED is determined by the emission energy (optical energy gap) of emitters.

Light is generated in OLEDs through the formation of excited states from separately injected electrons and holes to form an exciton, located on the organic material. Due to the uncorrelated nature of the injected charges, excitons with total spin of 0 and 1 are possible. Spin 0 excitons are denoted singlets, while spin 1 excitons are denoted triplets, reflecting their respective degeneracies. Due to the selection rules for radiative transitions, the symmetry of the excited state and the ground state must be the same. Since the ground state of most molecules are antisymmetric, radiative relaxation of the symmetric triplet excited state is typically disallowed. As such, emission from the triplet state, called phosphorescence, is very slow and the transition probability is very low. However emission from the singlet state, called fluorescence, can be very rapid and consequently very efficient. Nevertheless, statistically there is only 1 singlet exciton for every 3 triplet excitons formed. There are very few fluorescent emitters which exhibit emission from the triplet state at room temperature, so 75% of the generated excitons are wasted in most fluorescent emitters. However, emission from the triplet state can be facilitated through spin orbit coupling which incorporates a heavy metal atom in order to perturb the triplet state and add in some singlet character to and achieve a higher probability of radiative relaxation.

Some efficient emitters include heavy metals such as Ir, Pt, Pd, Au, Os, Rh, and Ru, which can emit efficiently across the visible spectrum. Thus, due to their typically high efficiencies, phosphorescent OLEDs (i.e. OLEDs with phosphorescent materials as emitters) have been a mainstay in OLED development. Recently, reports of OLEDs with electron to photon conversion efficiencies near 100% across the visible spectrum have been demonstrated. However, there remains a deficit of efficient phosphorescent emissive materials that also demonstrate long operational stability in a device setting, particularly in the blue region. Fluorescent OLEDs (i.e., OLEDs with fluorescent materials as emitters), on the other hand, have found widespread use in devices with long operational lifetime. Furthermore, fluorescent emitters typically do not contain precious metals and are not affected by triplet-triplet annihilation which degrades device performance at high current densities.

SUMMARY

In a general aspect, a light emitting device includes a first electrode, a hole transporting layer in contact with the first electrode, a second electrode, an electron transporting layer in contact with the second electrode; and an emissive layer between the hole transporting layer and the electron transporting layer. The emissive layer includes a phosphorescent emitter, a fluorescent emitter, and a host, and the phosphorescent emitter harvests electrogenerated excitons and transfers energy to the fluorescent emitter.

Certain implementations may include one or more of the following features. In some cases, the emissive layer is a single layer including the host, the phosphorescent emitter, and the fluorescent emitter. The phosphorescent emitter may include a luminophore with a six-membered chelation ring. In certain cases, the emissive layer includes n emitter layers including the host and the fluorescent emitter, and m donor layers including the host and the phosphorescent emitter, where n and m are integers >1. n and m may be equal. In some cases, n=m+1 or m=n+1. Each emitter layer may be adjacent to at least one donor layer.

Light emitting devices described herein may be fluorescent organic light emitting devices. The disclosed light emitting devices generally redistribute the excited states to primarily reside on known stable fluorescent emitters to achieve high device operational stability but maintain the high efficiency characteristic of phosphorescent OLEDs.

Thus, particular embodiments have been described. Variations, modifications, and enhancements of the described embodiments and other embodiments can be made based on what is described and illustrated. In addition, one or more features of one or more embodiments may be combined. The details of one or more implementations and various features and aspects are set forth in the accompanying drawings, the description, and the claims below.

DETAILED DESCRIPTION

Figure 1:
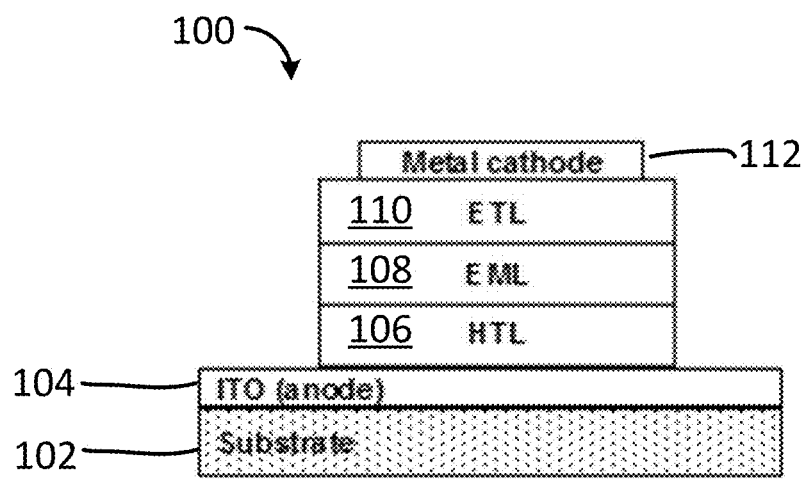
FIG. 1 depicts a cross-sectional view of an exemplary organic light emitting device (OLED).

The present disclosure can be understood more readily by reference to the following detailed description and the Examples included therein.

Before the present compounds, devices, and/or methods are disclosed and described, it is to be understood that they are not limited to specific synthetic methods unless otherwise specified, or to particular reagents unless otherwise specified, as such can, of course, vary. It is also to be understood that the terminology used herein is for the purpose of describing particular aspects only and is not intended to be limiting. Although any methods and materials similar or equivalent to those described herein can be used in the practice or testing of compounds of the present disclosure, example methods and materials are now described.

As used in the specification and the appended claims, the singular forms "a", "an", and "the" include plural referents unless the context clearly dictates otherwise. Thus, for example, reference to "a component" includes mixtures of two or more components.

As used herein, the terms "optional" or "optionally" means that the subsequently described event or circumstance can or cannot occur, and that the description includes instances where said event or circumstance occurs and instances where it does not.

Disclosed are the components to be used to prepare the compositions of this disclosure as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions disclosed herein. Thus, if there are a variety of additional steps that can be performed it is understood that each of these additional steps can be performed with any specific embodiment or combination of embodiments of the methods described herein.

As referred to herein, a linking atom or group connects two atoms such as, for example, an N atom and a C atom. A linking atom or group is in one aspect disclosed as $L^1$, $L^2$, $L^3$, etc. herein. The linking atom can optionally, if valency permits, have other chemical moieties attached. For example, in one aspect, an oxygen would not have any other chemical groups attached as the valency is satisfied once it is bonded to two groups (e.g., N and/or C groups). In another aspect, when carbon is the linking atom, two additional chemical moieties can be attached to the carbon. Suitable chemical moieties include amine, amide, thiol, aryl, heteroaryl, cycloalkyl, and heterocyclyl moieties. The term "cyclic structure" or the like terms used herein refer to any cyclic chemical structure which includes, but is not limited to, aryl, heteroaryl, cycloalkyl, cycloalkenyl, heterocyclyl, carbene, and N-heterocyclic carbene.

As used herein, the term "substituted" is contemplated to include all permissible substituents of organic compounds. In a broad aspect, the permissible substituents include acyclic and cyclic, branched and unbranched, carbocyclic and heterocyclic, and aromatic and nonaromatic substituents of organic compounds. Illustrative substituents include, for example, those described below. The permissible substituents can be one or more and the same or different for appropriate organic compounds. For purposes of this disclosure, the heteroatoms, such as nitrogen, can have hydrogen substituents and/or any permissible substituents of organic compounds described herein which satisfy the valences of the heteroatoms. This disclosure is not intended to be limited in any manner by the permissible substituents of organic compounds. Also, the terms "substitution" or "substituted with" include the implicit proviso that such substitution is in accordance with permitted valence of the substituted atom and the substituent, and that the substitution results in a stable compound, e.g., a compound that does not spontaneously undergo transformation such as by rearrangement, cyclization, elimination, etc. It is also contemplated that, in certain aspects, unless expressly indicated to the contrary, individual substituents can be further optionally substituted (i.e., further substituted or unsubstituted).

In defining various terms, "$A^1$", "$A^2$", "$A^3$", "$A^4$" and "$A^5$" are used herein as generic symbols to represent various specific substituents. These symbols can be any substituent, not limited to those disclosed herein, and when they are defined to be certain substituents in one instance, they can, in another instance, be defined as some other substituents.

The term "alkyl" as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dode cyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, alkyl, cycloalkyl, alkoxy, amino, ether, halide, hydroxy, nitro, silyl, sulfo-oxo, or thiol, as described herein. A "lower alkyl" group is an alkyl group containing from one to six (e.g., from one to four) carbon atoms.

Throughout the specification "alkyl" is generally used to refer to both unsubstituted alkyl groups and substituted alkyl groups; however, substituted alkyl groups are also specifically referred to herein by identifying the specific substituent(s) on the alkyl group. For example, the term "halogenated alkyl" or "haloalkyl" specifically refers to an alkyl group that is substituted with one or more halide, e.g., fluorine, chlorine, bromine, or iodine. The term "alkoxyalkyl" specifically refers to an alkyl group that is substituted with one or more alkoxy groups, as described below. The term "alkylamino" specifically refers to an alkyl group that is substituted with one or more amino groups, as described below, and the like. When "alkyl" is used in one instance and a specific term such as "alkylalcohol" is used in another, it is not meant to imply that the term "alkyl" does not also refer to specific terms such as "alkylalcohol" and the like.

This practice is also used for other groups described herein. That is, while a term such as "cycloalkyl" refers to both unsubstituted and substituted cycloalkyl moieties, the substituted moieties can, in addition, be specifically identified herein; for example, a particular substituted cycloalkyl can be referred to as, e.g., an "alkylcycloalkyl." Similarly, a substituted alkoxy can be specifically referred to as, e.g., a "halogenated alkoxy," a particular substituted alkenyl can be, e.g., an "alkenylalcohol," and the like. Again, the practice of using a general term, such as "cycloalkyl," and a specific term, such as "alkylcycloalkyl," is not meant to imply that the general term does not also include the specific term.

The term "cycloalkyl" as used herein is a non-aromatic carbon-based ring composed of at least three carbon atoms. Examples of cycloalkyl groups include, but are not limited to, cyclopropyl, cyclobutyl, cyclopentyl, cyclohexyl, norbornyl, and the like. The term "heterocycloalkyl" is a type of cycloalkyl group as defined above, and is included within the meaning of the term "cycloalkyl," where at least one of the carbon atoms of the ring is replaced with a heteroatom such as, but not limited to, nitrogen, oxygen, sulfur, or phosphorus. The cycloalkyl group and heterocycloalkyl group can be substituted or unsubstituted. The cycloalkyl group and heterocycloalkyl group can be substituted with one or more groups including, but not limited to, alkyl, cycloalkyl, alkoxy, amino, ether, halide, hydroxy, nitro, silyl, sulfo-oxo, or thiol as described herein.

The term "polyalkylene group" as used herein is a group having two or more $CH_2$ groups linked to one another. The polyalkylene group can be represented by the formula —$(CH_2)_a$—, where "a" is an integer of from 2 to 500.

The terms "alkoxy" and "alkoxyl" as used herein to refer to an alkyl or cycloalkyl group bonded through an ether linkage; that is, an "alkoxy" group can be defined as —$OA^1$ where $A^1$ is alkyl or cycloalkyl as defined above. "Alkoxy" also includes polymers of alkoxy groups as just described; that is, an alkoxy can be a polyether such as —$OA^1$-$OA^2$ or —$OA^1$-$(OA^2)_a$-$OA^3$, where "a" is an integer of from 1 to 200 and $A^1$, $A^2$, and $A^3$ are alkyl and/or cycloalkyl groups.

The term "alkenyl" as used herein is a hydrocarbon group of from 2 to 24 carbon atoms with a structural formula containing at least one carbon-carbon double bond. Asymmetric structures such as $(A^1A^2)C=C(A^3A^4)$ are intended to include both the E and Z isomers. This can be presumed in structural formulae herein wherein an asymmetric alkene is present, or it can be explicitly indicated by the bond symbol C=C. The alkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkenyl" as used herein is a non-aromatic carbon-based ring composed of at least three carbon atoms and containing at least one carbon-carbon double bound, i.e., C=C. Examples of cycloalkenyl groups include, but are not limited to, cyclopropenyl, cyclobutenyl, cyclopentenyl, cyclopentadienyl, cyclohexenyl, cyclohexadienyl, norbornenyl, and the like. The term "heterocycloalkenyl" is a type of cycloalkenyl group as defined above, and is included within the meaning of the term "cycloalkenyl," where at least one of the carbon atoms of the ring is replaced with a heteroatom such as, but not limited to, nitrogen, oxygen, sulfur, or phosphorus. The cycloalkenyl group and heterocycloalkenyl group can be substituted or unsubstituted. The cycloalkenyl group and heterocycloalkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "alkynyl" as used herein is a hydrocarbon group of 2 to 24 carbon atoms with a structural formula containing at least one carbon-carbon triple bond. The alkynyl group can be unsubstituted or substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkynyl" as used herein is a non-aromatic carbon-based ring composed of at least seven carbon atoms and containing at least one carbon-carbon triple bound. Examples of cycloalkynyl groups include, but are not limited to, cycloheptynyl, cyclooctynyl, cyclononynyl, and the like. The term "heterocycloalkynyl" is a type of cycloalkenyl group as defined above, and is included within the meaning of the term "cycloalkynyl," where at least one of the carbon atoms of the ring is replaced with a heteroatom such as, but not limited to, nitrogen, oxygen, sulfur, or phosphorus. The cycloalkynyl group and heterocycloalkynyl group can be substituted or unsubstituted. The cycloalkynyl group and heterocycloalkynyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "aryl" as used herein is a group that contains any carbon-based aromatic group including, but not limited to, benzene, naphthalene, phenyl, biphenyl, phenoxybenzene, and the like. The term "aryl" also includes "heteroaryl," which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term "non-heteroaryl," which is also included in the term "aryl," defines a group that contains an aromatic group that does not contain a heteroatom. The aryl group can be substituted or unsubstituted. The aryl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein. The term "biaryl" is a specific type of aryl group and is included in the definition of "aryl." Biaryl refers to two aryl groups that are bound together via a fused ring structure, as in naphthalene, or are attached via one or more carbon-carbon bonds, as in biphenyl.

The term "aldehyde" as used herein is represented by the formula C(O)H. Throughout this specification "C(O)" is a short hand notation for a carbonyl group, i.e., C=O.

The terms "amine" or "amino" as used herein are represented by the formula —$NA^1A^2$, where $A^1$ and $A^2$ can be, independently, hydrogen or alkyl, cycloalkyl, alkenyl, cycloalkenyl, alkynyl, cycloalkynyl, aryl, or heteroaryl group as described herein.

The term "alkylamino" as used herein is represented by the formula —NH(-alkyl) where alkyl is a described herein. Representative examples include, but are not limited to, methylamino group, ethylamino group, propylamino group, isopropylamino group, butylamino group, isobutylamino group, (sec-butyl)amino group, (tert-butyl)amino group, pentylamino group, isopentylamino group, (tert-pentyl) amino group, hexylamino group, and the like.

The term "dialkylamino" as used herein is represented by the formula —$N(-alkyl)_2$ where alkyl is a described herein. Representative examples include, but are not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl)amino group, dihexylamino group, N-ethyl-N-methylamino group, N-methyl-N-propylamino group, N-ethyl-N-propylamino group and the like.

The term "carboxylic acid" as used herein is represented by the formula —C(O)OH.

The term "ester" as used herein is represented by the formula —$OC(O)A^1$ or —$C(O)OA^1$, where $A^1$ can be alkyl, cycloalkyl, alkenyl, cycloalkenyl, alkynyl, cycloalkynyl, aryl, or heteroaryl group as described herein. The term "polyester" as used herein is represented by the formula -$(A^1O(O)C-A^2-C(O)O)_a$— or -$(A^1O(O)C-A^2-OC(O))_a$—, where $A^1$ and $A^2$ can be, independently, an alkyl, cycloalkyl, alkenyl, cycloalkenyl, alkynyl, cycloalkynyl, aryl, or heteroaryl group described herein and "a" is an integer from 1 to 500. "Polyester" is as the term used to describe a group that is produced by the reaction between a compound having at least two carboxylic acid groups with a compound having at least two hydroxyl groups.

The term "ether" as used herein is represented by the formula $A^1OA^2$, where $A^1$ and $A^2$ can be, independently, an alkyl, cycloalkyl, alkenyl, cycloalkenyl, alkynyl, cycloalkynyl, aryl, or heteroaryl group described herein. The term "polyether" as used herein is represented by the formula -$(A^1O-A^2O)_a$—, where $A^1$ and $A^2$ can be, independently, an alkyl, cycloalkyl, alkenyl, cycloalkenyl, alkynyl, cycloalkynyl, aryl, or heteroaryl group described herein and "a" is an integer of from 1 to 500. Examples of polyether groups include polyethylene oxide, polypropylene oxide, and polybutylene oxide.

The term "polymeric" includes polyalkylene, polyether, polyester, and other groups with repeating units, such as, but not limited to —$(CH_2O)_n$—$CH_3$, —$(CH_2CH_2O)_n$—$CH_3$, —$[CH_2CH(CH_3)]_n$—$CH_3$, —$[CH_2CH(COOCH_3)]_n$—$CH_3$, —$[CH_2CH(COO\ CH_2CH_3)]_n$—$CH_3$, and —$[CH_2CH(COO^tBu)]_n$—$CH_3$, where n is an integer (e.g., n>1 or n>2).

The term "halide" as used herein refers to the halogens fluorine, chlorine, bromine, and iodine.

The term "heterocyclyl," as used herein refers to single and multi-cyclic non-aromatic ring systems and "heteroaryl as used herein refers to single and multi-cyclic aromatic ring systems: in which at least one of the ring members is other than carbon. The terms includes azetidine, dioxane, furan, imidazole, isothiazole, isoxazole, morpholine, oxazole, oxazole, including, 1,2,3-oxadiazole, 1,2,5-oxadiazole and 1,3, 4-oxadiazole, piperazine, piperidine, pyrazine, pyrazole, pyridazine, pyridine, pyrimidine, pyrrole, pyrrolidine, tetrahydrofuran, tetrahydropyran, tetrazine, including 1,2,4,5-tetrazine, tetrazole, including 1,2,3,4-tetrazole and 1,2,4,5-tetrazole, thiadiazole, including, 1,2,3-thiadiazole, 1,2,5-thiadiazole, and 1,3,4-thiadiazole, thiazole, thiophene, triazine, including 1,3,5-triazine and 1,2,4-triazine, triazole, including, 1,2,3-triazole, 1,3,4-triazole, and the like.

The term "hydroxyl" as used herein is represented by the formula —OH.

The term "ketone" as used herein is represented by the formula $A^1C(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "azide" as used herein is represented by the formula —$N_3$.

The term "nitro" as used herein is represented by the formula —$NO_2$.

The term "nitrile" as used herein is represented by the formula —CN.

The term "silyl" as used herein is represented by the formula —$SiA^1A^2A^3$, where $A^1$, $A^2$, and $A^3$ can be, independently, hydrogen or an alkyl, cycloalkyl, alkoxy, alkenyl, cycloalkenyl, alkynyl, cycloalkynyl, aryl, or heteroaryl group as described herein.

The term "sulfo-oxo" as used herein is represented by the formulas $S(O)A^1$, —$S(O)_2A^1$, —$OS(O)_2A^1$, or —$OS(O)_2OA^1$, where $A^1$ can be hydrogen or an alkyl, cycloalkyl, alkenyl, cycloalkenyl, alkynyl, cycloalkynyl, aryl, or heteroaryl group as described herein. Throughout this specification "S(O)" is a short hand notation for S=O. The term "sulfonyl" is used herein to refer to the sulfo-oxo group represented by the formula —$S(O)_2A^1$, where $A^1$ can be hydrogen or an alkyl, cycloalkyl, alkenyl, cycloalkenyl, alkynyl, cycloalkynyl, aryl, or heteroaryl group as described herein. The term "sulfone" as used herein is represented by the formula $A^1S(O)_2A^2$, where $A^1$ and $A^2$ can be, independently, an alkyl, cycloalkyl, alkenyl, cycloalkenyl, alkynyl, cycloalkynyl, aryl, or heteroaryl group as described herein. The term "sulfoxide" as used herein is represented by the formula $A^1S(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "thiol" as used herein is represented by the formula —SH.

"R," "$R^1$," "$R^2$," "$R^3$," "$R^n$," where n is an integer, as used herein can, independently, possess one or more of the groups listed above. For example, if $R^1$ is a straight chain alkyl group, one of the hydrogen atoms of the alkyl group can optionally be substituted with a hydroxyl group, an alkoxy group, an alkyl group, a halide, and the like. Depending upon the groups that are selected, a first group can be incorporated within second group or, alternatively, the first group can be pendant (i.e., attached) to the second group. For example, with the phrase "an alkyl group comprising an amino group," the amino group can be incorporated within the backbone of the alkyl group. Alternatively, the amino group can be attached to the backbone of the alkyl group. The nature of the group(s) that is (are) selected will determine if the first group is embedded or attached to the second group.

Compounds described herein may contain "optionally substituted" moieties. In general, the term "substituted," whether preceded by the term "optionally" or not, means that one or more hydrogens of the designated moiety are replaced with a suitable substituent. Unless otherwise indicated, an "optionally substituted" group may have a suitable substituent at each substitutable position of the group, and when more than one position in any given structure may be substituted with more than one substituent selected from a specified group, the substituent may be either the same or different at every position. Combinations of substituents envisioned by this disclosure are preferably those that result in the formation of stable or chemically feasible compounds. In is also contemplated that, in certain aspects, unless expressly indicated to the contrary, individual substituents can be further optionally substituted (i.e., further substituted or unsubstituted).

In some aspects, a structure of a compound can be represented by a formula:

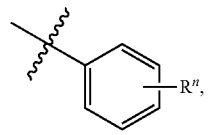

which is understood to be equivalent to a formula:

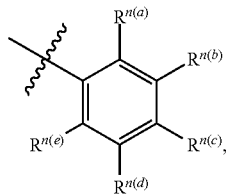

wherein n is typically an integer. That is, $R^n$ is understood to represent up to five independent non-hydrogen substituents, $R^{n(a)}$, $R^{n(b)}$, $R^{n(c)}$, $R^{n(d)}$, $R^{n(e)}$. By "independent substituents," it is meant that each R substituent can be independently defined. For example, if in one instance $R^{n(a)}$ is halogen, then $R^{n(b)}$ is not necessarily halogen in that instance.

Several references to R, $R^1$, $R^2$, $R^3$, $R^4$, $R^5$, $R^6$, etc. are made in chemical structures and moieties disclosed and described herein. Any description of R, $R^1$, $R^2$, $R^3$, $R^4$, $R^5$, $R^6$, etc. in the specification is applicable to any structure or moiety reciting R, $R^1$, $R^2$, $R^3$, $R^4$, $R^5$, $R^6$, etc. respectively.

OLEDs described herein use phosphorescent platinum complexes as efficient exciton harvesters while emitting primarily from stable fluorescent emitters in order to enhance the device operational lifetime. To achieve this, both phosphorescent platinum complexes and fluorescent emitters must be present in the EML, and energy transfer between the phosphorescent and fluorescent materials is necessary. Two major mechanisms to exciton transport exist, namely the Dexter energy transfer and Förster resonant energy transfer (FRET) mechanisms. Dexter energy transfer is a short range transport which consists of consecutive hopping of excitons between neighboring molecules and depends on the orbital overlap between the molecules. FRET is a long range transport process in which dipole coupling between an excited donor molecule (D) and a ground state acceptor molecule (A) leads to a long range non-radiative transfer. This process depends on the overlap between the emission profile of D and the absorption of A. This transfer mechanism requires an allowed relaxation transition of the donor molecule and an allowed excitation mechanism of the acceptor molecules. As such, FRET typically occurs between singlet excitons. However, if the phosphorescent emission process of the donor molecule is efficient, transfer between the triplet of the donor molecule and the singlet of the acceptor molecule is also possible.

Figure 2:
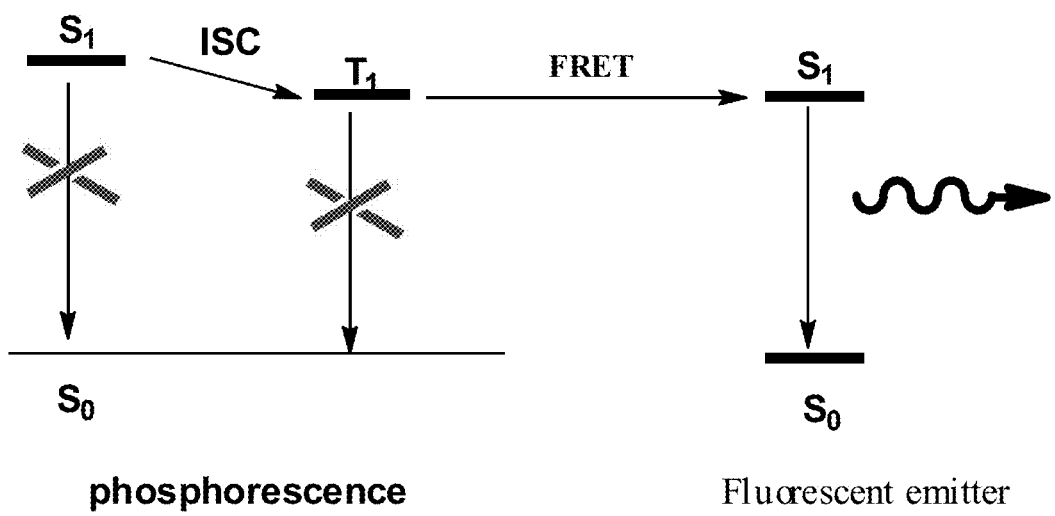
FIG. 2 depicts an energy transfer process inside an emissive layer of the phosphorescent OLEDs described herein.

The stability of blue phosphorescent OLEDs has remained as a great technical challenge for OLED displays and lighting applications. If triplet emitters are less stable than singlet emitters with the same emission energy, the relocation of exciton from triplet emitters to known stable blue singlet emitters may improve the device operational stability. Thus, a process may occur, such as that depicted in FIG. 2, in which excitons are formed on a phosphorescent emitter, which can then transfer via FRET to a fluorescent donor material and emit with high efficiency. Such a process may maintain the efficient (e.g., 100% utilization) of electrogenerated excitons while emitting primarily from the fluorescent emitter to achieve high stability and avoid triplet-triplet annihilation. As an added benefit, the color quality of EL spectra of devices may also improve if the emission originates solely from the narrow band fluorescent emitters.

Figure 3:
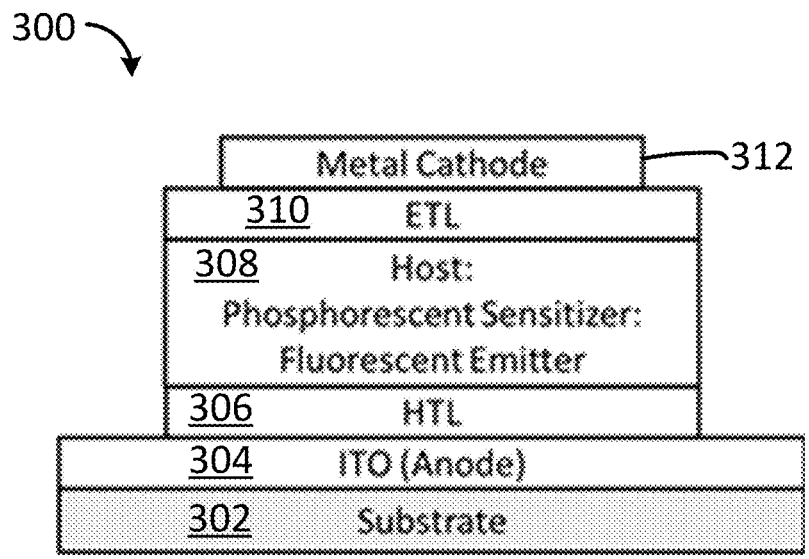
FIG. 3 depicts a cross-sectional view of an OLED that includes a phosphorescent emitter and a fluorescent emitter.
Figure 4:
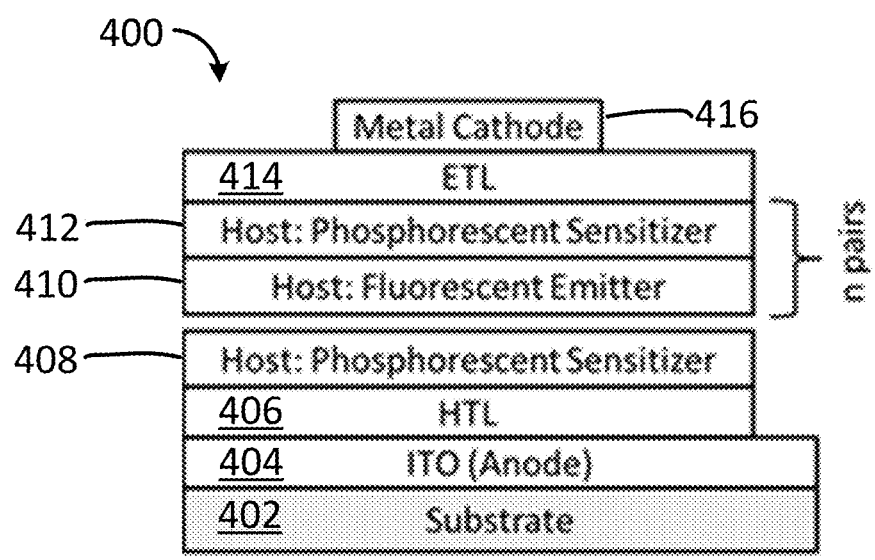
FIG. 4 depicts a cross-sectional view of an OLED that includes alternating fluorescent and phosphorescent doped layers.

If triplet emitters are less stable than singlet emitters with the same emission energy, the relocation of exciton from triplet emitters to known stable blue singlet emitters may improve the device operational stability. This may be achieved by harvesting the electrogenerated excitons with a phosphorescent material, then transferring the energy to a fluorescent emitter through a FRET mechanism. This process may be achieved by OLEDs with different designs, including: 1) a single emissive layer containing both the phosphorescent emitter and the fluorescent emitter doped into a host matrix, as depicted in FIG. 3; and 2) an emissive layer containing alternating fluorescent and phosphorescent doped layers, as depicted in FIG. 4. In both cases, there are constraints on the suitable materials. First, the emission spectrum of the phosphorescent emitter must have spectral overlap with the absorption spectrum of the fluorescent emitter in order for the FRET process to occur. Additionally, the photoluminescent quantum yield of the phosphorescent material must be high enough to ensure that the dipole relaxation in the FRET process can occur with high efficiency. Similarly, the photoluminescent quantum yield of the fluorescent emitter must be high enough to ensure efficient emission.

The first case, depicted in FIG. 3, includes OLED device 300. Device 300 includes substrate 302, anode 304, HTL 306, emissive layer 308, ETL 310, and metal cathode 312. The anode may be ITO. Emissive layer 308 typically includes a phosphorescent sensitizer (emitter) and a fluorescent emitter dispersed within a host matrix. When both the phosphorescent and fluorescent materials exist within the same layer, care must be taken to avoid direct formation of excitons on the fluorescent emitter (which can only harvest singlet excitons) to ensure that most or all (e.g., 100%) of the electrogenerated excitons are utilized. On the other hand, the concentration of the fluorescent emitter must be high enough for there to close proximity between the phosphorescent material and the fluorescent emitter so that rapid transfer from the phosphorescent emitter to the fluorescent emitter can be achieved and direct phosphorescent emission or triplet-triplet annihilation can be avoided.

The second case, depicted in FIG. 4, includes OLED device 400. Device 400 includes substrate 402, anode 404, HTL 406, phosphorescent sensitizer (emitter) layer 408, fluorescent emitter layer 410, phosphorescent sensitizer (emitter) layer 412, ETL 414, and metal cathode 416. Anode 404 may be ITO. Phosphorescent and fluorescent emitter layers 408, 410, and 412 form the emissive layer (EML). In FIG. 4, a space is depicted between layers 408 and 410 for clarity. Fluorescent emitter layer 410 and phosphorescent emitter layer 412 alternate and may be present in pairs (e.g., n pairs, where n is an integer such as 1, 2, 3, or the like).

In some implementations, the emissive layer includes n emitter layers including the host and the fluorescent emitter, and m donor layers including the host and the phosphorescent emitter, where n and m are integers >1. In certain implementations, n=m. In other implementations, n=m+1 or m=n+1. Each emitter layer may be adjacent to at least one donor layer.

In device 400, the thickness and location of the layers is typically tuned to ensure that exciton formation primarily occurs in the region that is doped with the phosphorescent material. Furthermore, the region that contains the fluorescent doped layer should be close enough to the exciton formation zone so that the fluorescent emitters are within the distance for FRET to occur.

Emitters described herein include six-membered emitters. As used herein, a "six-membered emitter" refers to an emitter with a luminophore (i.e., a portion of the emitter responsible for its luminescent properties) including a six-membered chelation ring. In one example, a six-membered phosphorescent emitter has a luminophore including a six-membered chelation ring.

Phosphorescent emitters for devices described herein include six-membered phosphorescent emitters of General Formula I:

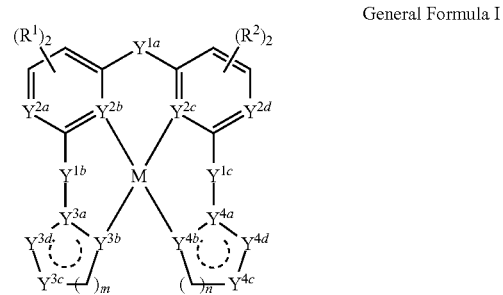

General Formula I wherein:
M is Pt, Pd, Ir, Rh, or Au;
each $R^1$ and $R^2$ is independently hydrogen, halogen, hydroxyl, thiol, nitro, or substituted or unsubstituted alkyl, alkenyl, alkynyl, aryl, heteroaryl, cycloalkyl, cycloalkenyl, heterocyclic group, amino, alkoxy, haloalkyl, arylalkyl, or arylalkenyl;
each of $Y^{1a}$, $Y^{1b}$ and $Y^{1c}$ is independently O, $NR^3$, $CR^3R^4$, S, $AsR^3$, $BR^3$, $PR^3$, $P(O)R^3$, or $SiR^3R^4$, wherein each of $R^3$ and $R^4$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, amino, alkoxy, haloalkyl, arylalkyl, arylalkenyl, or $R^3$ and $R^4$ together form C=O, wherein each of $R^3$ and $R^4$ is independently optionally linked to an adjacent ring structure, thereby forming a cyclic structure;
each of $Y^{2a}$, $Y^{2b}$, $Y^{2c}$ and $Y^{2d}$ is independently N, $NR^5$, or $CR^6$, wherein each $R^5$ and $R^6$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, amino, alkoxy, haloalkyl, arylalkyl, or arylalkenyl;
each of $Y^{3a}$, $Y^{3b}$, $Y^{3c}$, $Y^{3d}$, $Y^{4a}$, $Y^{4b}$, $Y^{4c}$ and $Y^{4d}$ is independently N, O, S, $NR^7$, $CR^8$, wherein each $R^7$ and $R^8$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, aminoalkoxy, haloalkyl, arylalkyl, or arylalkenyl; or $Z(R^9)_2$, wherein Z is C or Si, and wherein each $R^9$ is independently hydrogen, halogen, hydroxyl, thiol, substituted or unsubstituted alkyl, alkenyl, alkynyl, aryl, heteroaryl, cycloalkyl, cycloalkenyl, heterocyclic group, amino, alkoxy, haloalkyl, arylalkyl, or arylalkenyl;

each of m and n is independently 1 or 2; and each $\overset{\frown}{\cdots}$ independently represents partial or full unsaturation of the ring with which it is associated.

Other phosphorescent emitters include General Formula I, wherein:

M is Pt or Pd;

m is 2;

n is 2;

at least one of $Y^{1a}$ and $Y^{1c}$ is independently $NR^3$, $CR^3R^4$, S, $AsR^3$, $BR^3$, $PR^3$, $P(O)R^3$, or $SiR^3R^4$;

$Y^{2b}$ and $Y^{2c}$ are C; and $Y^{3b}$ and $Y^{4b}$ are N.

Other phosphorescent emitters include General Formula I, wherein:

M is Ir or Rh;

m is 2;

n is 2;

$Y^{1a}$ is $NR^3$, $CR^3R^4$, S, $AsR^3$, $BR^3$, $PR^3$, $P(O)R^3$, or $SiR^3R^4$;

$Y^{2b}$ is C; and $Y^{3b}$ $Y^{2c}$ and $Y^{4b}$ are N.

Other phosphorescent emitters include General Formula I, wherein:

M is Au;

m is 2;

n is 2;

$Y^{1b}$ is $NR^3$, $CR^3R^4$, S, $AsR^3$, $BR^3$, $PR^3$, $P(O)R^3$, or $SiR^3R^4$;

$Y^{2b}$, $Y^{2c}$ and $Y^{4b}$ are C; and $Y^{3b}$ is N.

Other phosphorescent emitters include General Formula I, wherein each of $R^3$ and $R^4$ is independently linked to an adjacent ring structure.

Other phosphorescent emitters include General Formula I, wherein:

M is Pt or Pd;

at least one of $Y^{1b}$ and $Y^{1c}$ is independently $NR^3$, $CR^3R^4$, S, $AsR^3$, $BR^3$, $PR^3$, $P(O)R^3$, or $SiR^3R^4$, wherein $R^3$ is covalently linked to at least one of $Y^{2a}$, $Y^{2d}$, $Y^{3d}$, and $Y^{4d}$ thereby forming a cyclic structure; and at least of one of $Y^{2a}$, $Y^{2a}$, $Y^{3d}$ and $Y^{4d}$ is C.

Other phosphorescent emitters include General Formula I, wherein:

M is Ir or Rh;

$Y^{1b}$ is $NR^3$, $CR^3R^4$, S, $AsR^3$, $BR^3$, $PR^3$, $P(O)R^3$, or $SiR^3R^4$, wherein $R^3$ is covalently linked to at least one of $Y^2a$ and $Y^{id}$, thereby forming a cyclic structure; and at least of one of $Y^{2a}$ and $Y^{id}$ is C.

Other phosphorescent emitters include General Formula I, wherein:

M is Au;

at least of one of $Y^{2a}$ and $Y^{id}$ is C; and $Y^{1b}$ is $NR^3$, $CR^3R^4$, S, $AsR^3$, $BR^3$, $PR^3$, $P(O)R^3$, or $SiR^3R^4$, wherein $R^3$ is covalently linked to at least one of $Y^{2a}$ and $Y^{id}$, thereby forming a cyclic structure.

Other phosphorescent emitters include General Formula II,

General Formula II

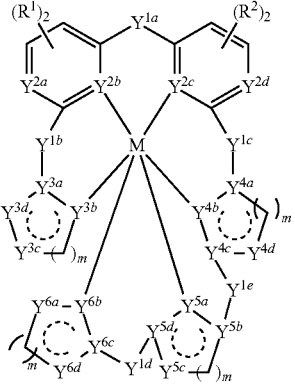

wherein:

M is Ir, Rh, Pt, Os, or Ru;

each of $R^1$ and $R^2$ is independently hydrogen, halogen, hydroxyl, nitro, thiol, or substituted or unsubstituted alkyl, alkenyl, alkynyl, aryl, heteroaryl, cycloalkyl, cycloalkenyl, heterocyclic group, amino, alkoxy, haloalkyl, arylalkyl, or arylalkenyl;

each of $Y^{1a}$, $Y^{1b}$, $Y^{1c}$, $Y^{1d}$ and $Y^{1e}$ is independently O, $NR^3$, $CR^3R^4$, S, $AsR^3$, $BR^3$, $PR^3$, $P(O)R^3$, or $SiR^3R^4$, wherein each of $R^3$ and $R^4$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, amino, alkoxy, haloalkyl, arylalkyl, arylalkenyl, or $R^3$ and $R^4$ together form C=O, wherein each of $R^3$ and $R^4$ is independently optionally linked to an adjacent ring structure, thereby forming a cyclic structure;

each of $Y^{2a}$, $Y^{2b}$, $Y^{2c}$ and $Y^{2d}$ is independently N, $NR^5$, or $CR^6$, wherein each of $R^5$ and $R^6$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, amino, alkoxy, haloalkyl, arylalkyl, or arylalkenyl;

each of $Y^{3a}$, $Y^{3b}$, $Y^{3c}$, $Y^{3d}$, $Y^{4a}$, $Y^{4b}$, $Y^{4c}$ and $Y^{4d}$ is independently N, O, S, $NR^7$, $CR^8$, wherein each of $R^7$ and $R^8$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, amino, alkoxy, haloalkyl, arylalkyl, or arylalkenyl; or $Z(R^9)_2$, wherein Z is C or Si, and wherein each $R^9$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, amino, alkoxy, haloalkyl, arylalkyl, or arylalkenyl;

in each of each of $Y^{5a}$, $Y^{5b}$, $Y^{5c}$, $Y^{5d}$, $Y^{6a}$, $Y^{6b}$ $Y^{6c}$ and $Y^{6d}$ is independently N, O, S, $NR^7$, or $CR^8$;

each of m and n is independently 1 or 2; and each $\overset{\frown}{\cdots}$ independently represents partial or full unsaturation of the ring with which it is associated.

Other phosphorescent emitters include General Formula II, wherein:

M is Ir or Rh;

m is 2;

$Y^{2b}$ and $Y^{2c}$ are C;
$Y^{3b}$ and $Y^{4b}$ are N; and
at least one of $Y^{1b}$ and $Y^{1c}$ is $NR^3$, $CR^3R^4$, S, $AsR^3$, $BR^3$, $PR^3$, $P(O)R^3$, or $SiR^3R^4$.

Other phosphorescent emitters include General Formula II, wherein each of $R^2$ and $R^3$ is independently linked to an adjacent ring structure.

Other phosphorescent emitters include General Formula II, wherein:
M is Ir or Rh;
at least one of $Y^{2a}$, $Y^{2d}$, $Y^{3d}$ and $Y^{4d}$ is C; and
at least one of $Y^{1b}$ and $Y^{1c}$ is $NR^3$, $CR^3R^4$, S, $AsR^3$, $BR^3$, $PR^3$, $P(O)R^3$, or $SiR^3R^4$, wherein $R^3$ is covalently linked to at least one of $Y^{2a}$, $Y^{2d}$, $Y^{3d}$ and $Y^{4d}$, thereby forming a cyclic structure.

Other phosphorescent emitters include compounds of General Formula III:

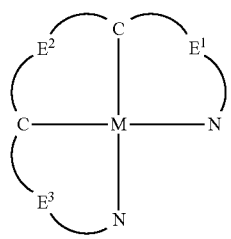

General Formula III wherein:
M is a metal cation with two positive charges selected from Pt (II) and Pd (II);
each $E^1$, $E^2$, and $E^3$ independently represents O, $NR^3$, $CR^3R^4$, S, $AsR^3$, $BR^3$, $PR^3$, $P(O)R^3$, or $SiR^3R^4$, wherein each of $R^3$ and $R^4$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, amino, alkoxy, haloalkyl, arylalkyl, arylalkenyl, or $R^3$ and $R^4$ together form C=O, wherein each of $R^3$ and $R^4$ is independently optionally linked to a C or N, thereby forming a cyclic structure;
each C independently represents a substituted or unsubstituted aromatic ring or heterocyclic group wherein a carbon atom is coordinated to M; and
each N independently represents a substituted or unsubstituted heterocyclic group wherein a nitrogen atom is coordinated to M.

Other phosphorescent emitters include compounds of General Formula IV:

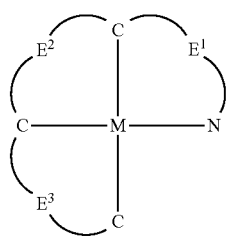

General Formula IV wherein:
M is a metal cation with three positive charges selected from Au (III) and Ag each $E^1$, $E^2$, and $E^3$ independently represents O, $NR^3$, $CR^3R^4$, S, $AsR^3$, $BR^3$, $PR^3$, $P(O)R^3$, or $SiR^3R^4$, wherein each $R^3$ and $R^4$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, amino, alkoxy, haloalkyl, arylalkyl, arylalkenyl, or $R^3$ and $R^4$ together form C=O, wherein each of $R^3$ and $R^4$ is independently optionally linked to a C or N, thereby forming a cyclic structure;
each C independently represents a substituted or unsubstituted aromatic ring or heterocyclic group, wherein a carbon atom is coordinated to M; and
N represents a substituted or unsubstituted heterocyclic group wherein a nitrogen atom is coordinated to M.

Other phosphorescent emitters include compounds of General Formula V:

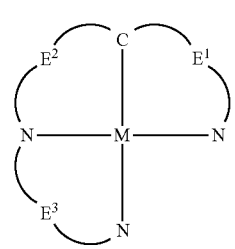

General Formula V wherein:
M is a metal cation with one positive charge selected from Ir (I) and Rh (I);
each $E^1$, $E^2$, and $E^3$ independently represents O, $NR^3$, $CR^3R^4$, S, $AsR^3$, $BR^3$, $PR^3$, $P(O)R^3$, or $SiR^3R^4$, wherein each of $R^3$ and $R^4$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, amino, alkoxy, haloalkyl, arylalkyl, arylalkenyl, or $R^3$ and $R^4$ together form C=O, wherein each of $R^3$ and $R^4$ is independently optionally linked to a C or N, thereby forming a cyclic structure;
C represents a substituted or unsubstituted aromatic ring or heterocyclic group, wherein a carbon atom is coordinated to M; and
each N independently represents a substituted or unsubstituted heterocyclic group wherein a nitrogen atom is coordinated to M.

Other phosphorescent emitters include compounds of General Formula VI:

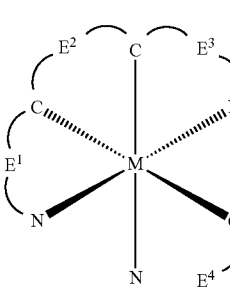

General Formula VI wherein:
M is a metal cation with three positive charges selected from Ir (III), Rh (III), Co (III), Al (III), and Ga (III);
each of $E^1$, $E^2$, $E^3$, and $E^4$ independently represents O, $NR^3$, $CR^3R^4$, S, $AsR^3$, $BR^3$, $PR^3$, $P(O)R^3$, or $SiR^3R^4$, wherein each of $R^3$ and $R^4$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, amino, alkoxy, haloalkyl, arylalkyl, arylalkenyl, or $R^3$ and $R^4$ together form C=O, wherein each of $R^3$ and $R^4$ is independently optionally linked to a C or N, thereby forming a cyclic structure;
each C independently represents a substituted or unsubstituted aromatic ring or heterocyclic group, wherein a carbon atom is coordinated to M; and
each N independently represents a substituted or unsubstituted heterocyclic group, wherein a nitrogen atom coordinated to the metal.

Other phosphorescent emitters include compounds of General Formulas VII and VIII:

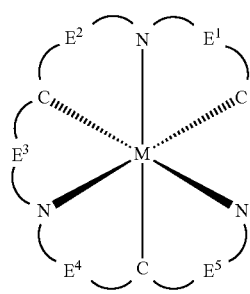

General Formula VII

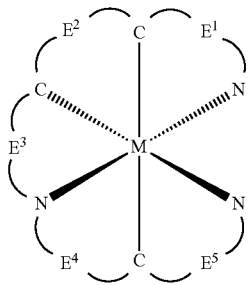

General Formula VIII wherein:
M is a metal cation with three positive charges selected from Ir (III), Rh (III), Co (III), Al (III), or Ga (III);
each of $E^1$, $E^2$, $E^3$, $E^4$, and $E^5$ independently represents O, $NR^3$, $CR^3R^4$, S, $AsR^3$, $BR^3$, $PR^3$, $P(O)R^3$, or $SiR^3R^4$, wherein each of $R^3$ and $R^4$ is independently hydrogen, alkyl, alkenyl, alkynyl, aryl, heteroaryl, cycloalkyl, cycloalkenyl, heterocyclic group, amino, hydroxyl, halogen, thiol, alkoxy, haloalkyl, arylalkyl, arylalkenyl, or $R^2$ and $R^3$ together form C=O, wherein each of $R^3$ and $R^4$ is independently optionally linked to a C or N, thereby forming a cyclic structure;
each C independently represents a substituted or unsubstituted aromatic ring or heterocyclic group, wherein a carbon atom is coordinated to M; and
each N independently represents a substituted or unsubstituted heterocyclic group, wherein a nitrogen atom coordinated to M.

Other phosphorescent emitters include compounds of General Formula IX:

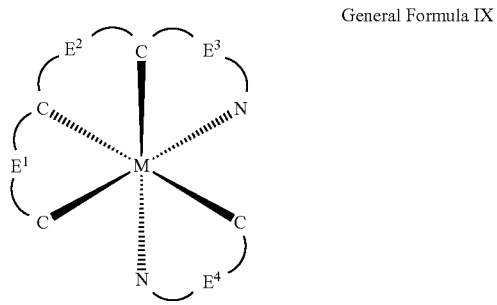

General Formula IX wherein:
M is a metal cation with four positive charges selected from Pd (IV) and Pt (IV); each of $E^1$, $E^2$, $E^3$, and $E^4$ independently represents O, $NR^3$, $CR^3R^4$, S, $AsR^3$, $BR^3$, $PR^3$, $P(O)R^3$, or $SiR^3R^4$, wherein each of $R^3$ and $R^4$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, amino, alkoxy, haloalkyl, arylalkyl, arylalkenyl, or $R^3$ and $R^4$ together form C=O, wherein each of $R^3$ and $R^4$ is independently optionally linked to a C or N, thereby forming a cyclic structure;
each C independently represents a substituted or unsubstituted aromatic ring or heterocyclic group, wherein a carbon atom is coordinated to M; and
each N independently represents a substituted or unsubstituted heterocyclic group, wherein a nitrogen atom coordinated to M.

Other phosphorescent emitters include compounds of General Formula X:

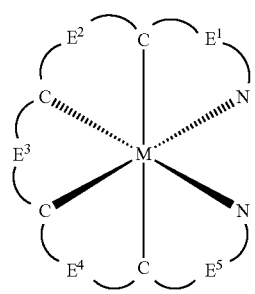

General Formula X wherein:
M is a metal cation with four positive charges selected from Pd (IV) and Pt(IV);
each of $E^1$, $E^2$, $E^3$, $E^4$, and $E^5$ independently represents O, $NR^3$, $CR^3R^4$, S, $AsR^3$, $BR^3$, $PR^3$, $P(O)R^3$, or $SiR^3R^4$, wherein each of $R^3$ and $R^4$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, amino, alkoxy, haloalkyl, arylalkyl, arylalkenyl, or $R^3$ and $R^4$ together form C=O, wherein each of $R^3$ and $R^4$ is independently optionally linked to a C or N, thereby forming a cyclic structure;
each C independently represents a substituted or unsubstituted aromatic ring or heterocyclic group, wherein a carbon atom is coordinated to M; and each N independently represents a substituted or unsubstituted heterocyclic group, wherein a nitrogen atom is coordinated to M.

Other phosphorescent emitters include compounds of General Formula XI:

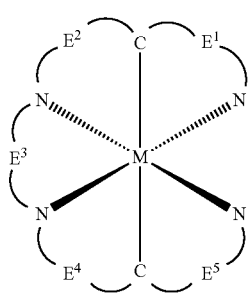

General Formula XI wherein:
M is a metal cation with two positive charges selected from Ru (II) and Os (II);
each of $E^1$, $E^2$, $E^3$, $E^4$, and $E^5$ independently represents O, $NR^3$, $CR^3R^4$, S, $AsR^3$, $BR^3$, $PR^3$, $P(O)R^3$, or $SiR^3R^4$, wherein each of $R^3$ and $R^4$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, amino, alkoxy, haloalkyl, arylalkyl, arylalkenyl, or $R^3$ and $R^4$ together form C=O, wherein each of $R^3$ and $R^4$ is independently optionally linked to a C or N, thereby forming a cyclic structure;
each C independently represents a substituted or unsubstituted aromatic ring or heterocyclic group, wherein a carbon atom is coordinated to M; and
each N independently represents a substituted or unsubstituted heterocyclic group, wherein a nitrogen atom is coordinated to M.

Other phosphorescent emitters include compounds of General Formula XII:

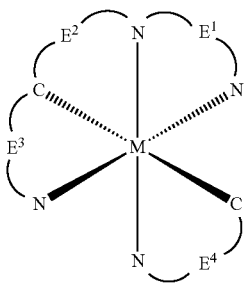

General Formula XII wherein:
M is a metal cation with two positive charges selected from Ru (II) and Os (II);
each of $E^1$, $E^2$, $E^3$, and $E^4$ independently represents O, $NR^3$, $CR^3R^4$, S, $AsR^3$, $BR^3$, $PR^3$, $P(O)R^3$, or $SiR^3R^4$, wherein each of $R^3$ and $R^4$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, amino, alkoxy, haloalkyl, arylalkyl, arylalkenyl, or $R^3$ and $R^4$ together form C=O, wherein each of $R^3$ and $R^4$ is independently optionally linked to a C or N, thereby forming a cyclic structure;
each C independently represents a substituted or unsubstituted aromatic ring or heterocyclic group, wherein a carbon atom is coordinated to M; and
each N independently represents a substituted or unsubstituted heterocyclic group, wherein a nitrogen atom is coordinated to M.

Phosphorescent emitters are also disclosed in US 2015/0207086, entitled "METAL COMPOUNDS AND METHODS AND USES THEREOF," which is incorporated by reference herein.

As described herein, fluorescent emitters include:

1. Aromatic Hydrocarbons and Their Derivatives

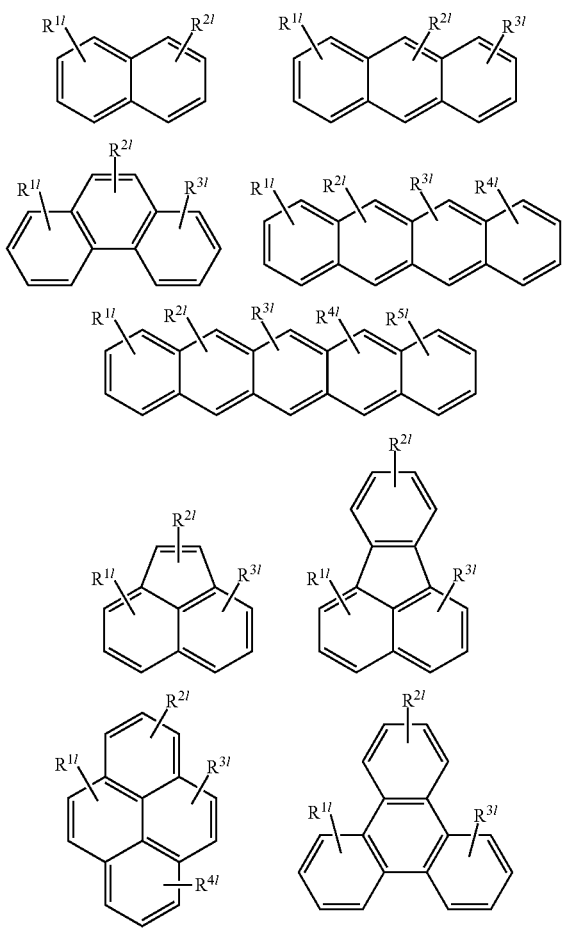

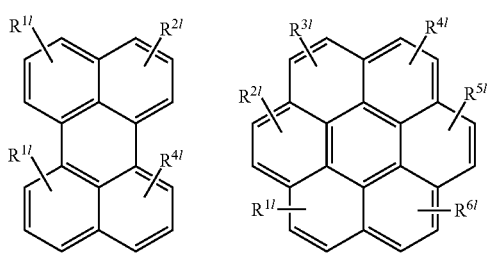

-continued
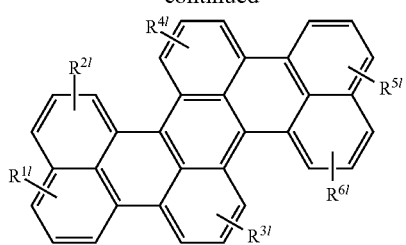
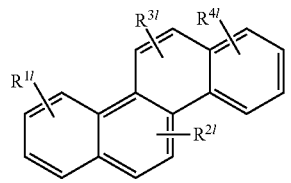
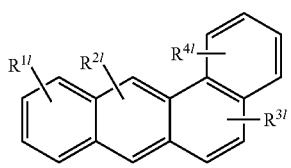
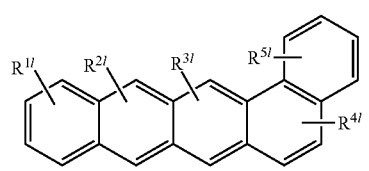
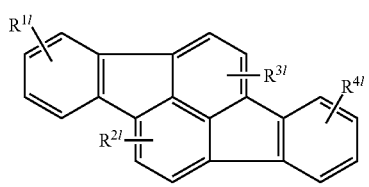
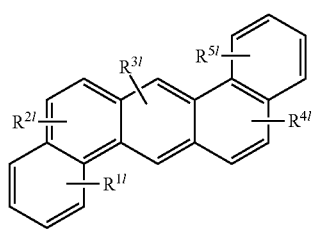
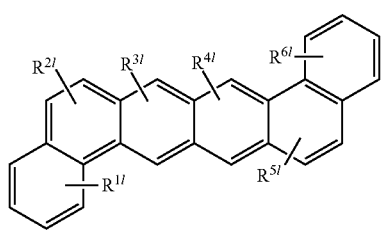
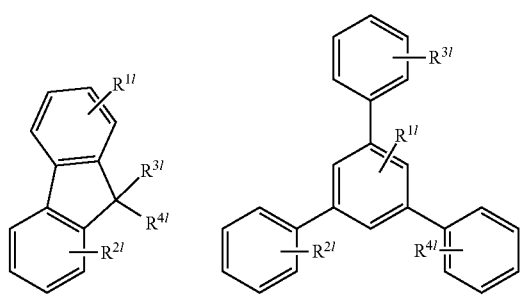
-continued
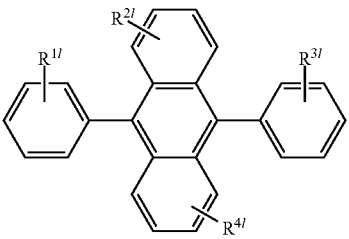
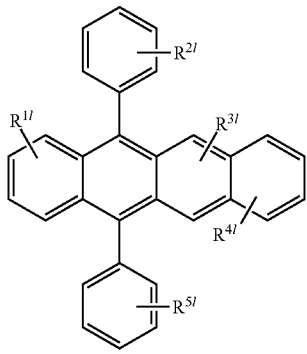
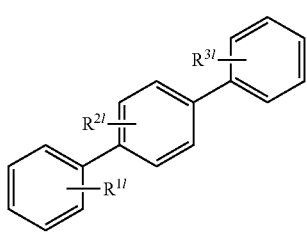
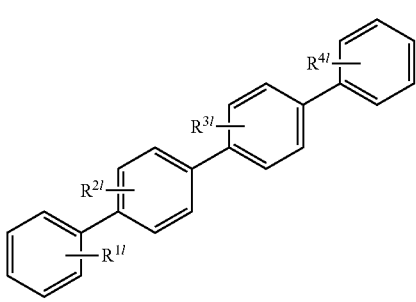
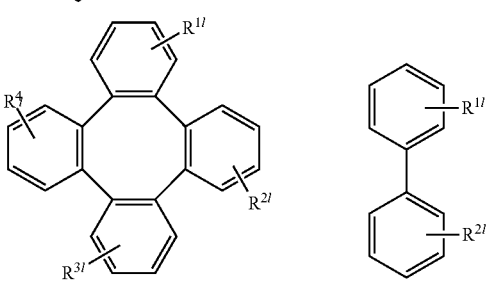
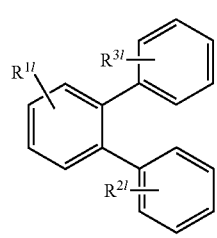

-continued
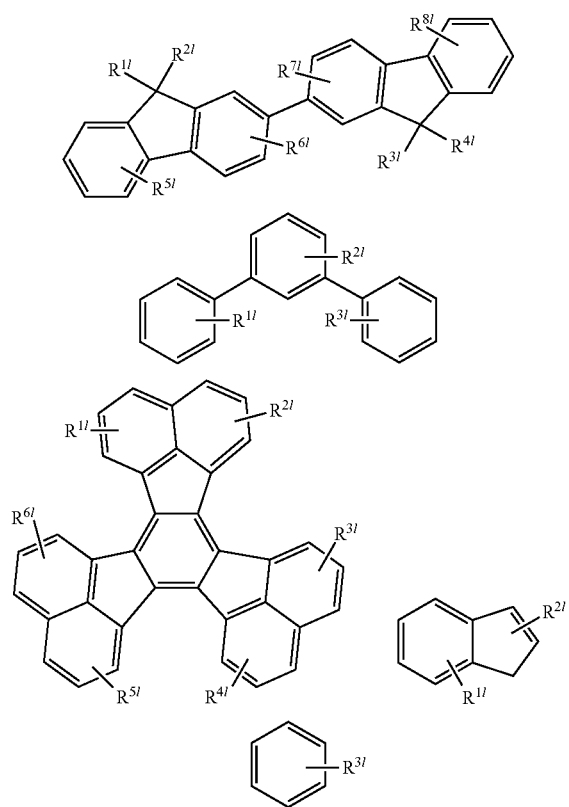
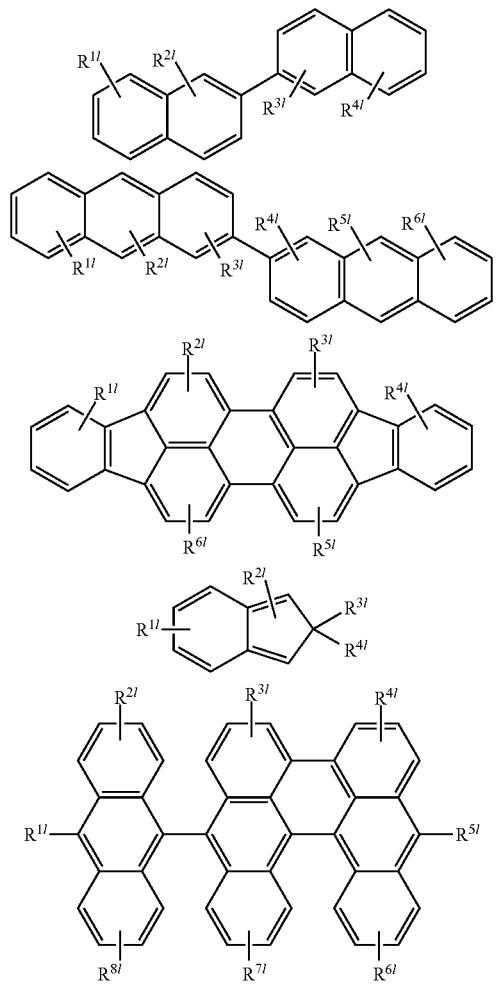
2. Arylethylene, Arylacetylene and Their Derivatives
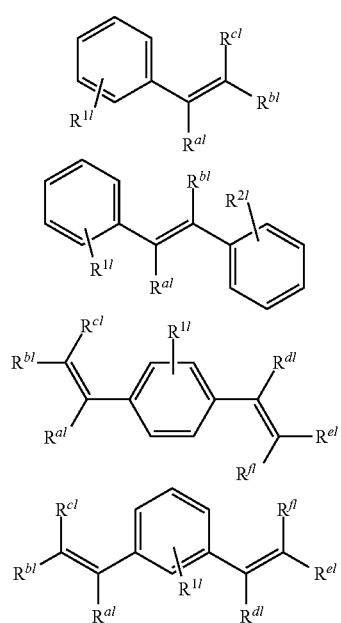

-continued
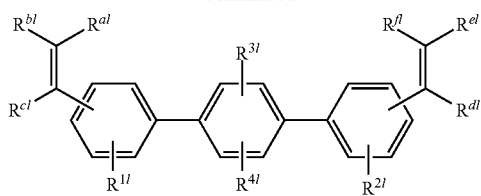
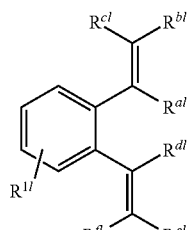
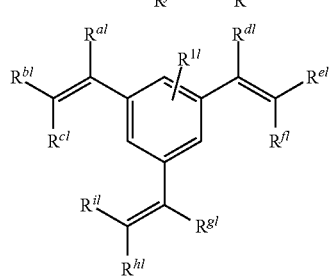
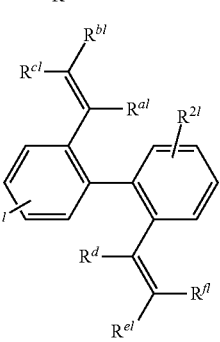
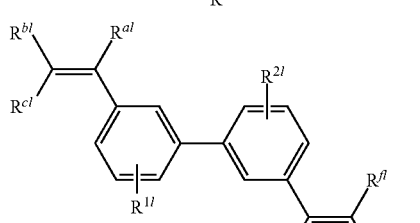
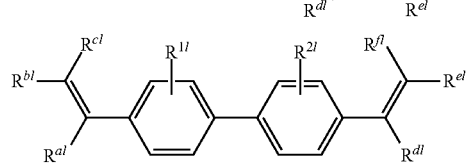
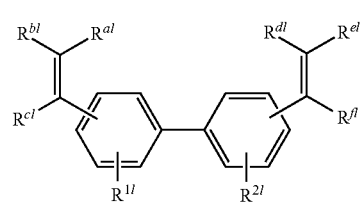
-continued
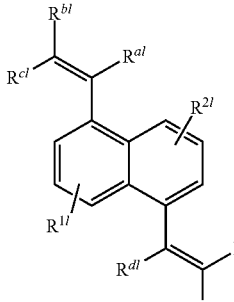
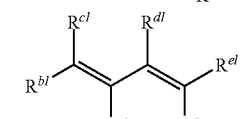
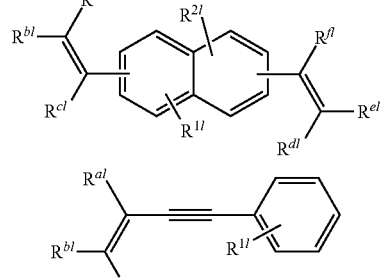
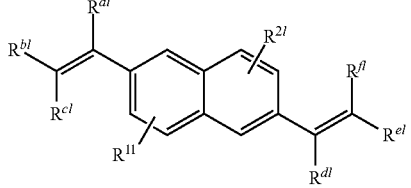
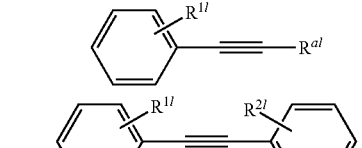
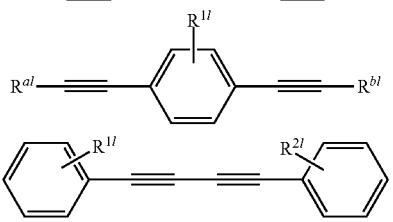
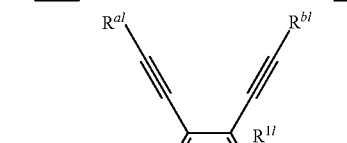
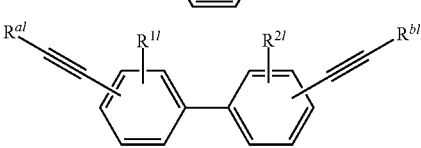

-continued
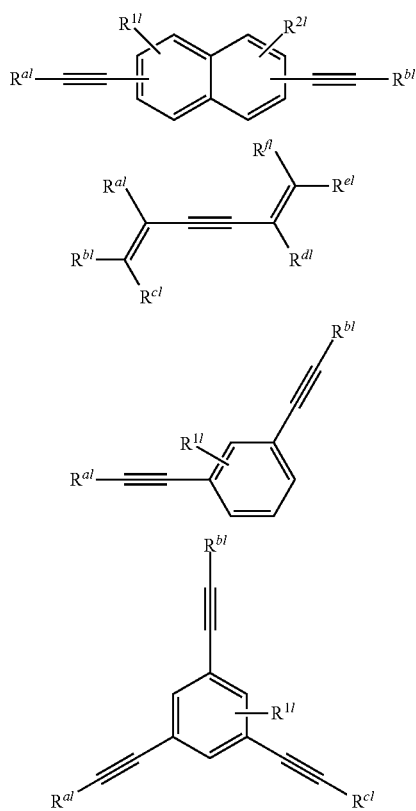
wherein $R^{al}$, $R^{bl}$, $R^{cl}$, $R^{dl}$, $R^{el}$, $R^{fl}$, $R^{gl}$, $R^{hl}$ and $R^{il}$ can be one of the following structure:
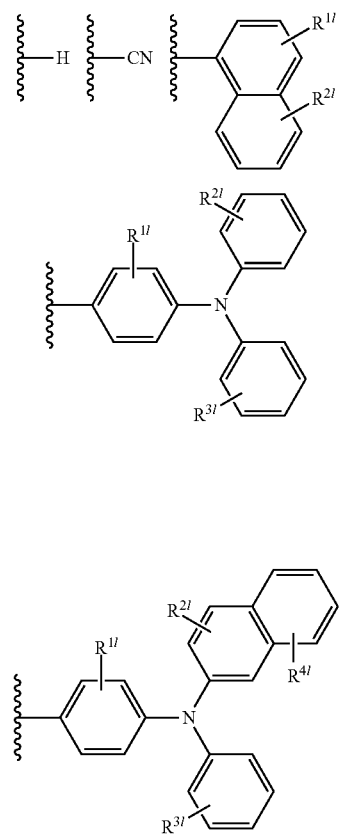
-continued
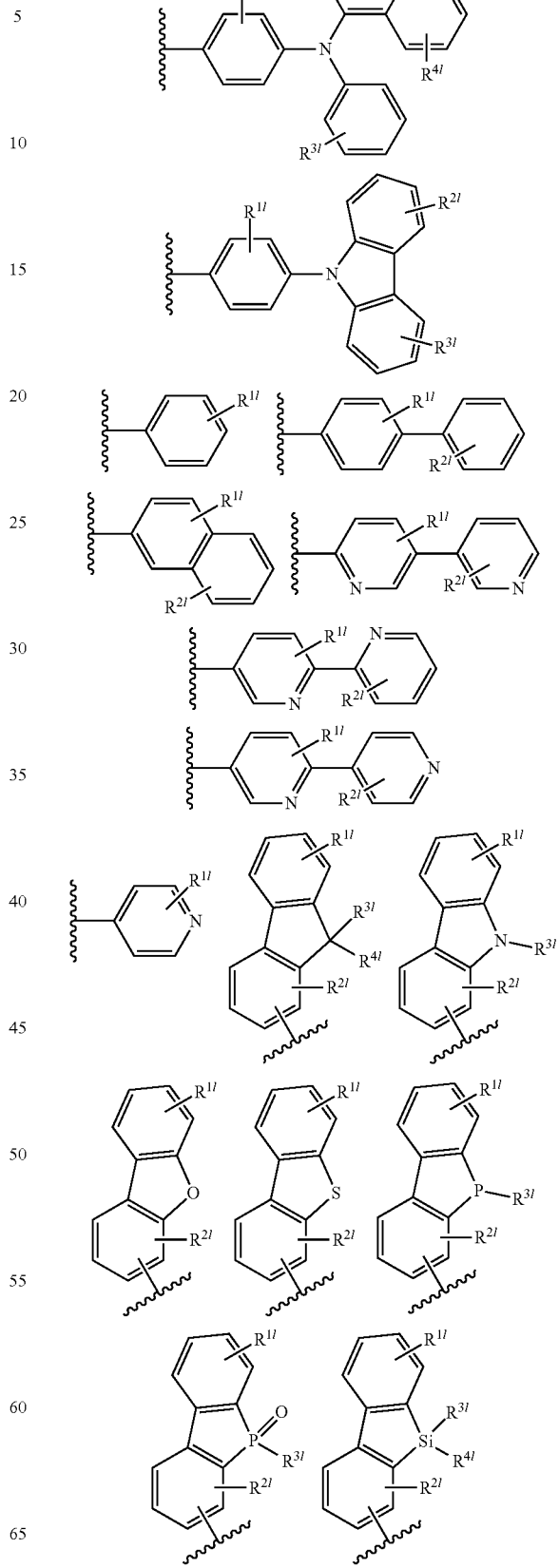

-continued
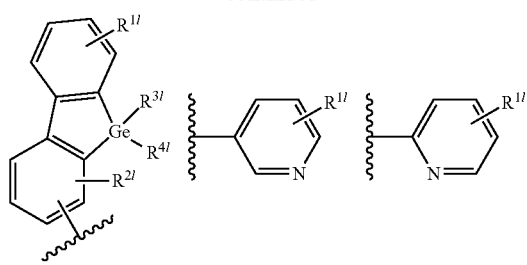
3. Heterocyclic Compounds and Their Derivatives
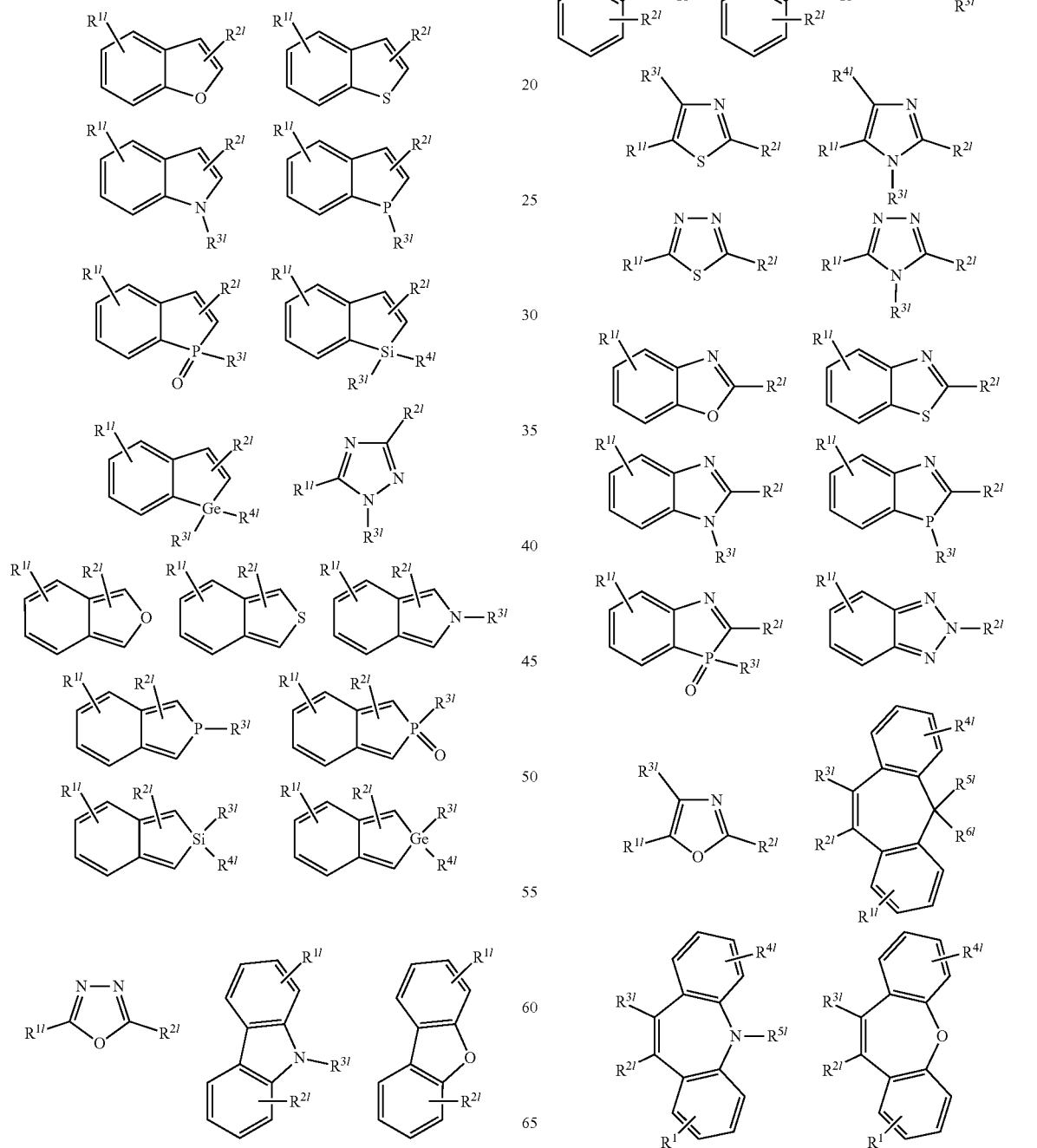

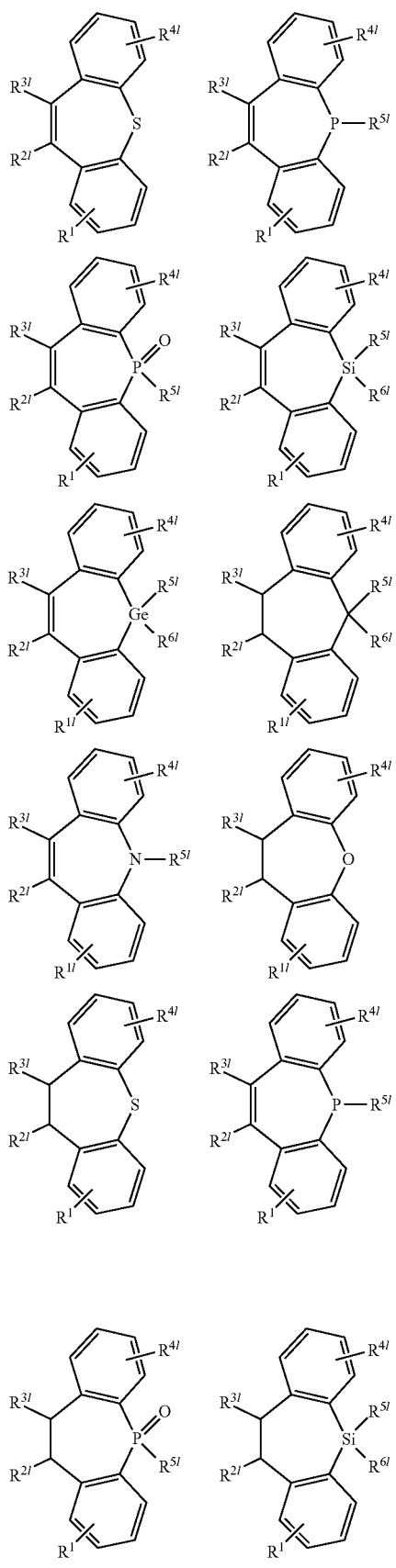
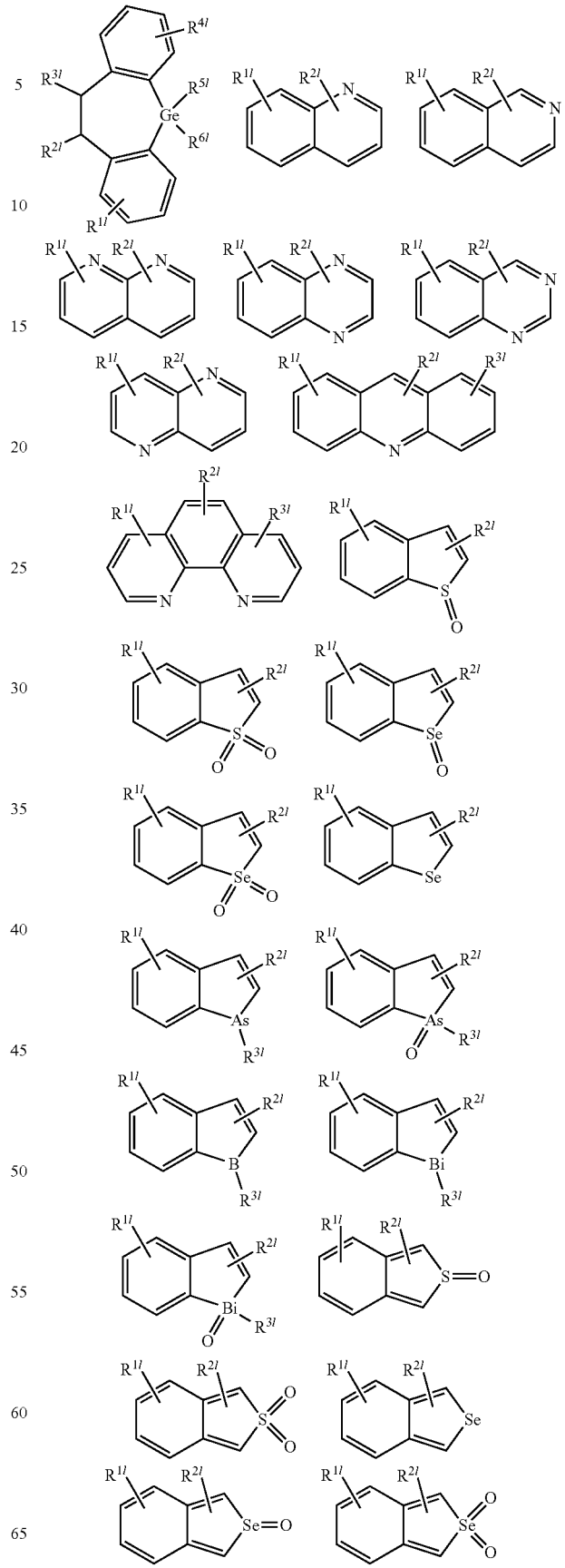

-continued
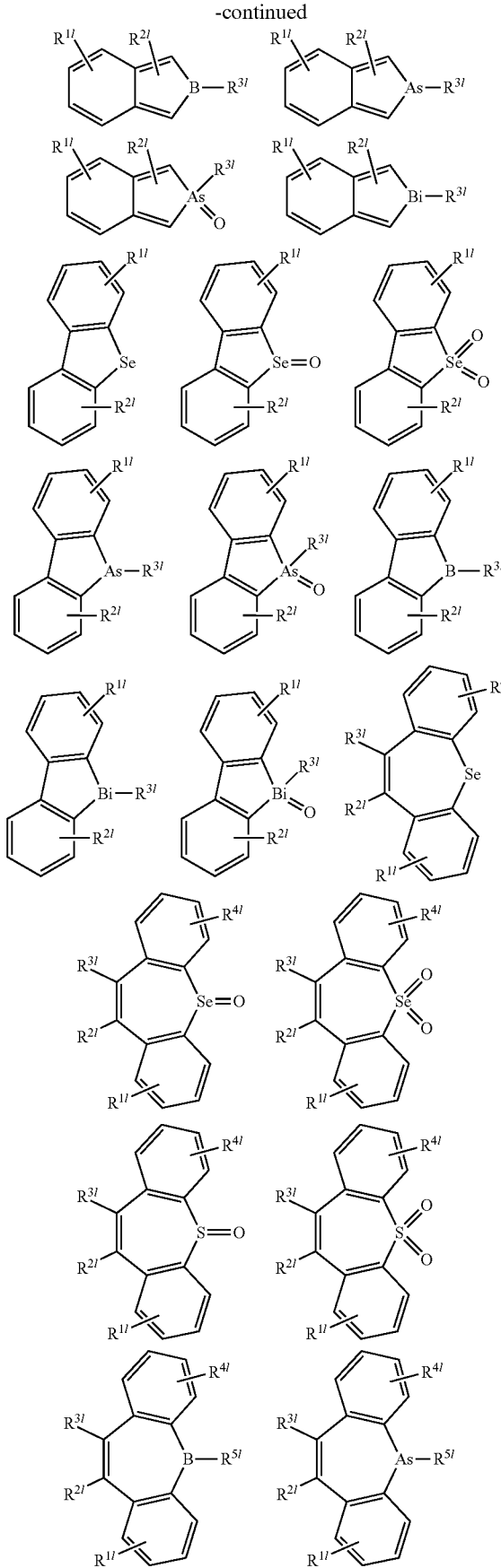
-continued
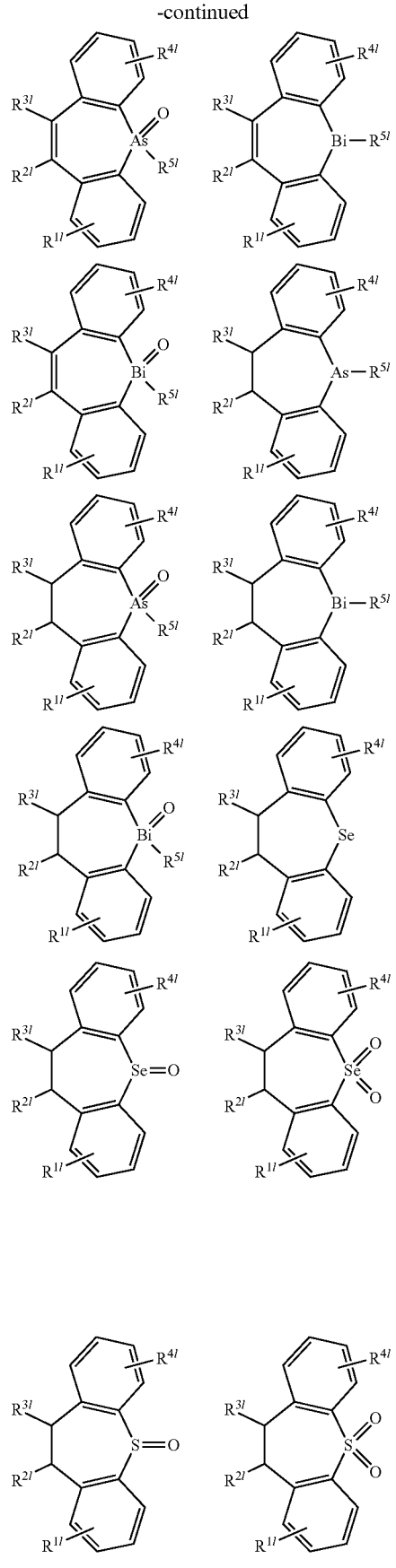

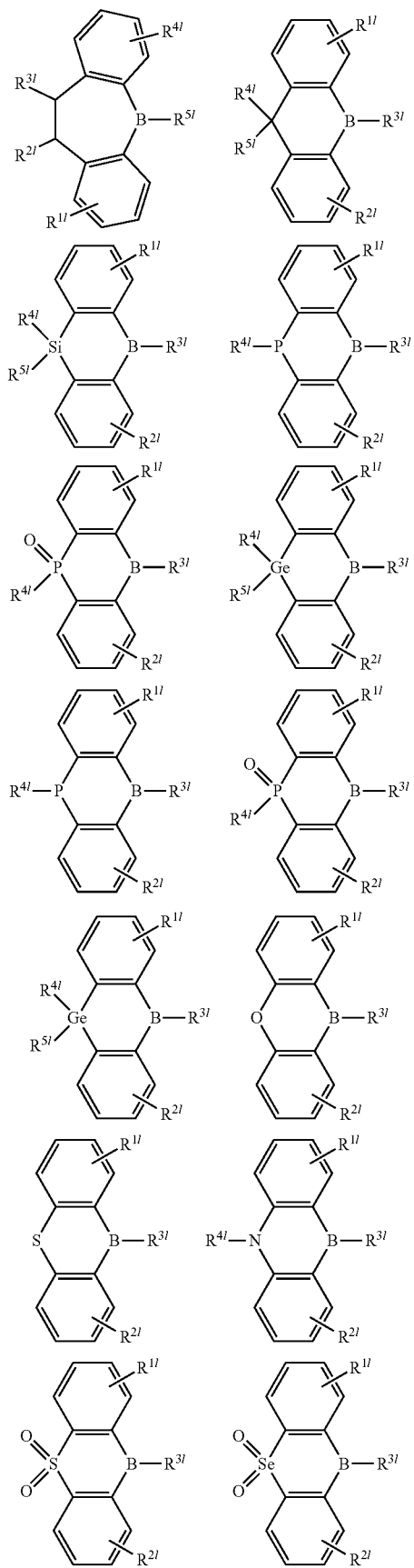
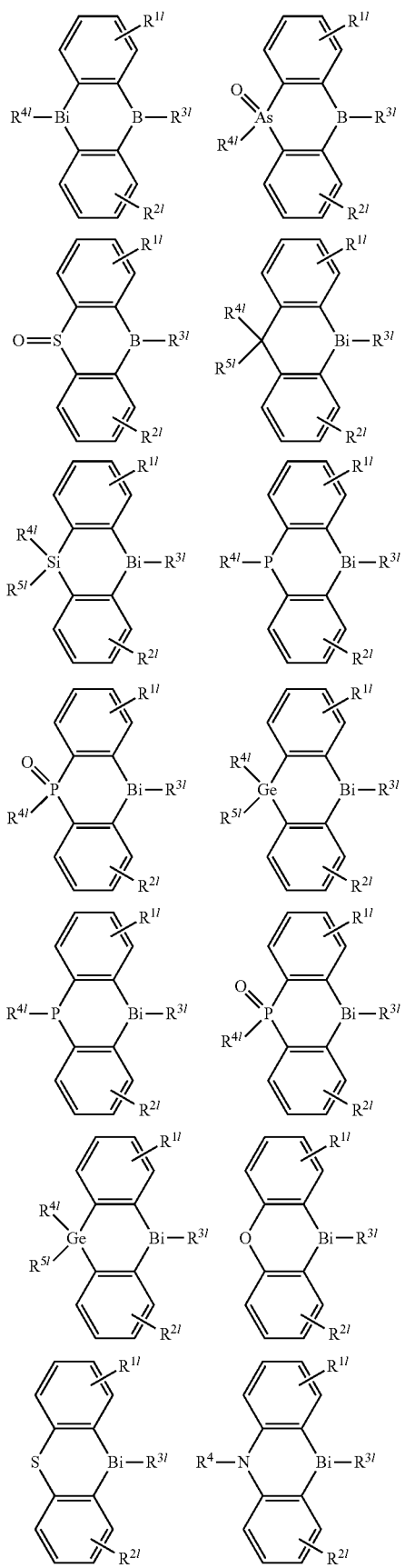

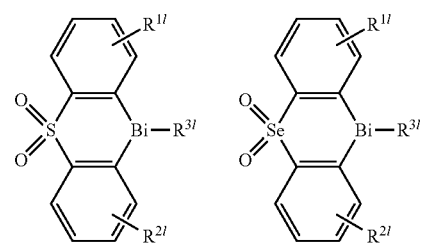
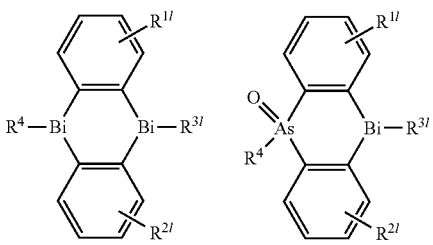
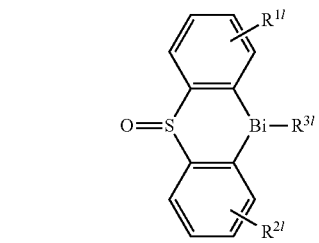
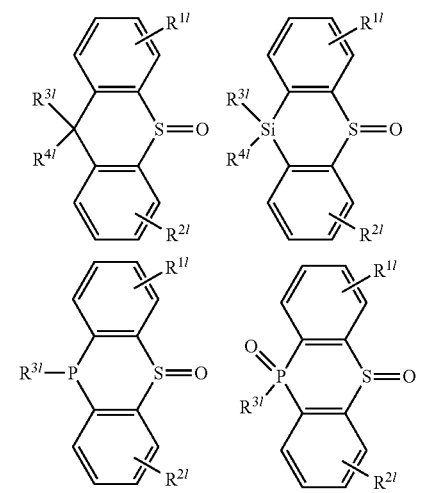
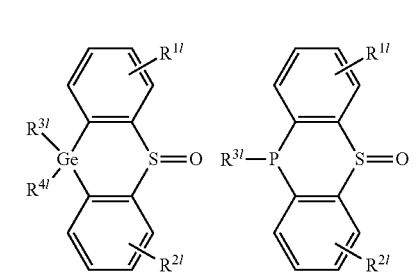
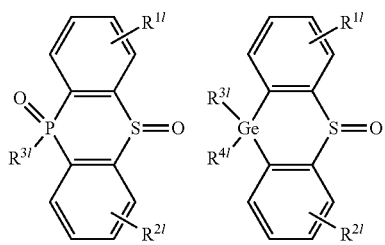
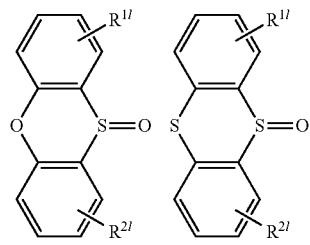
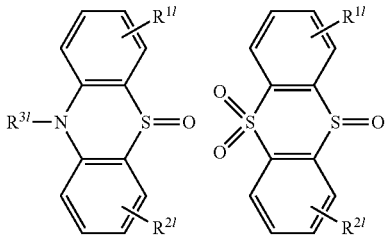
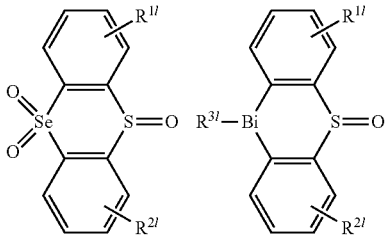
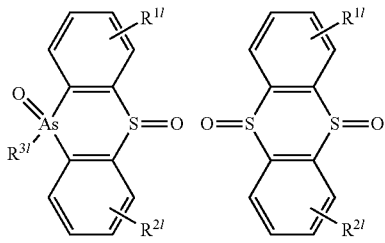
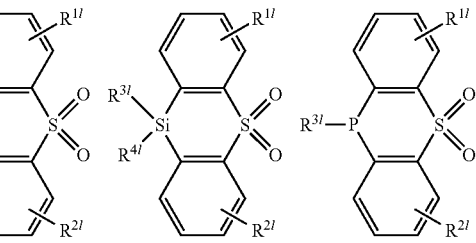
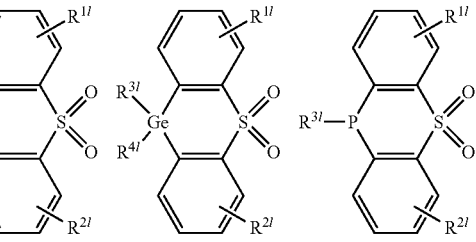

-continued
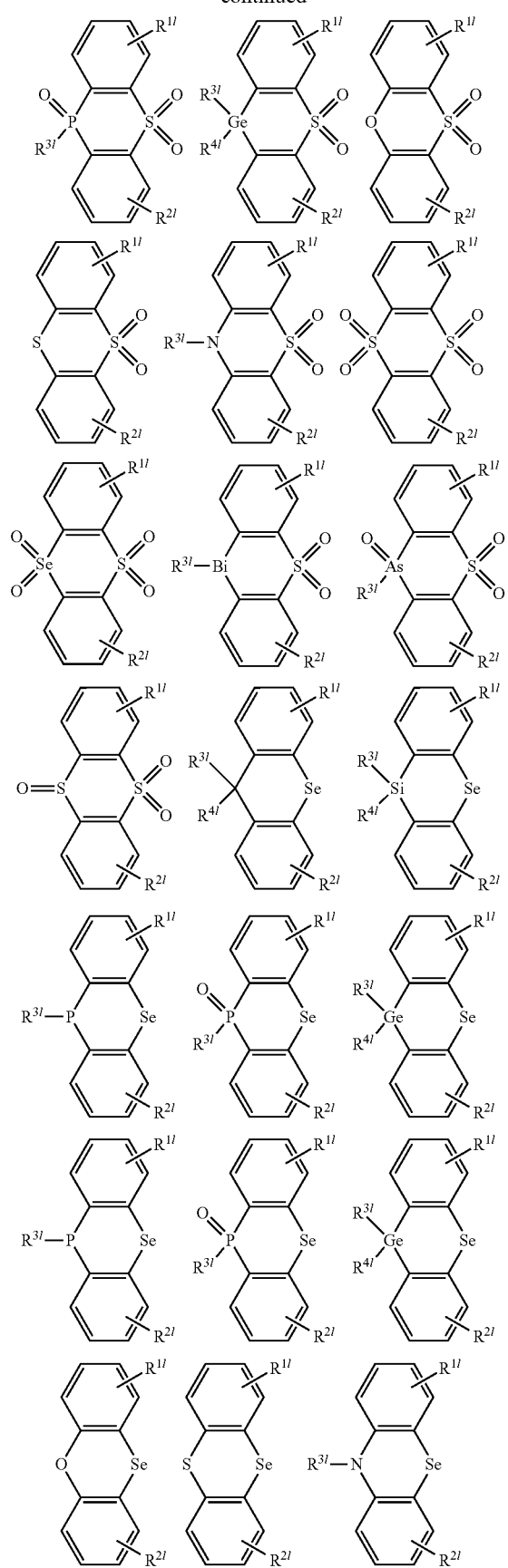
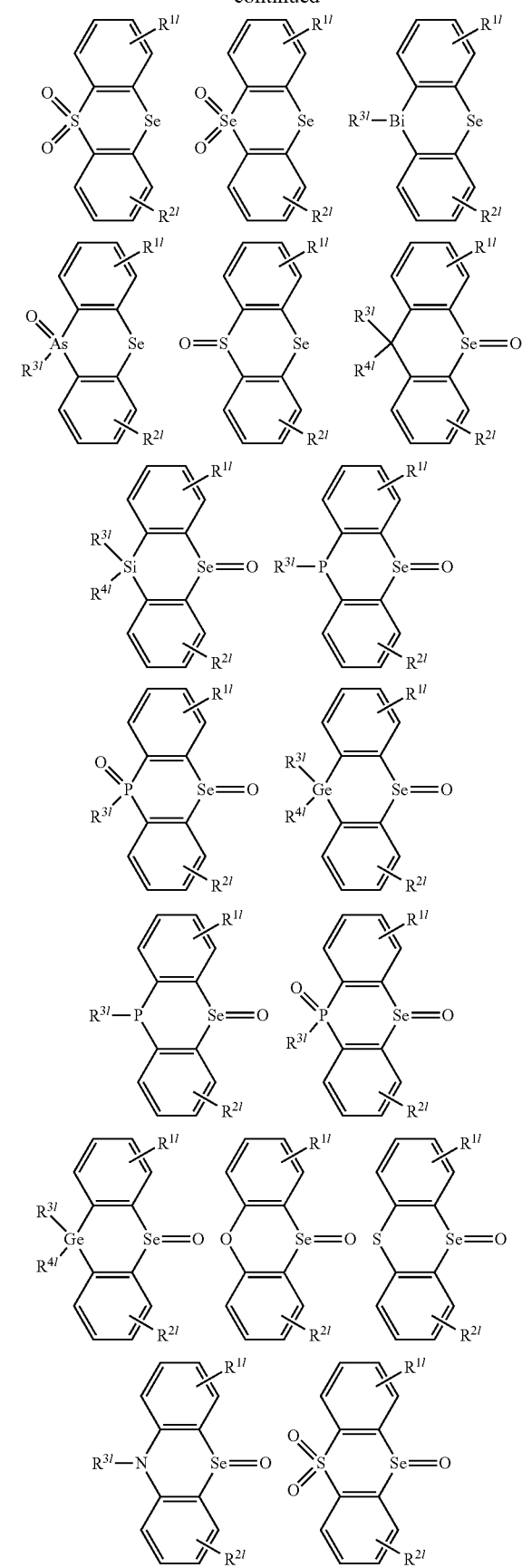

-continued
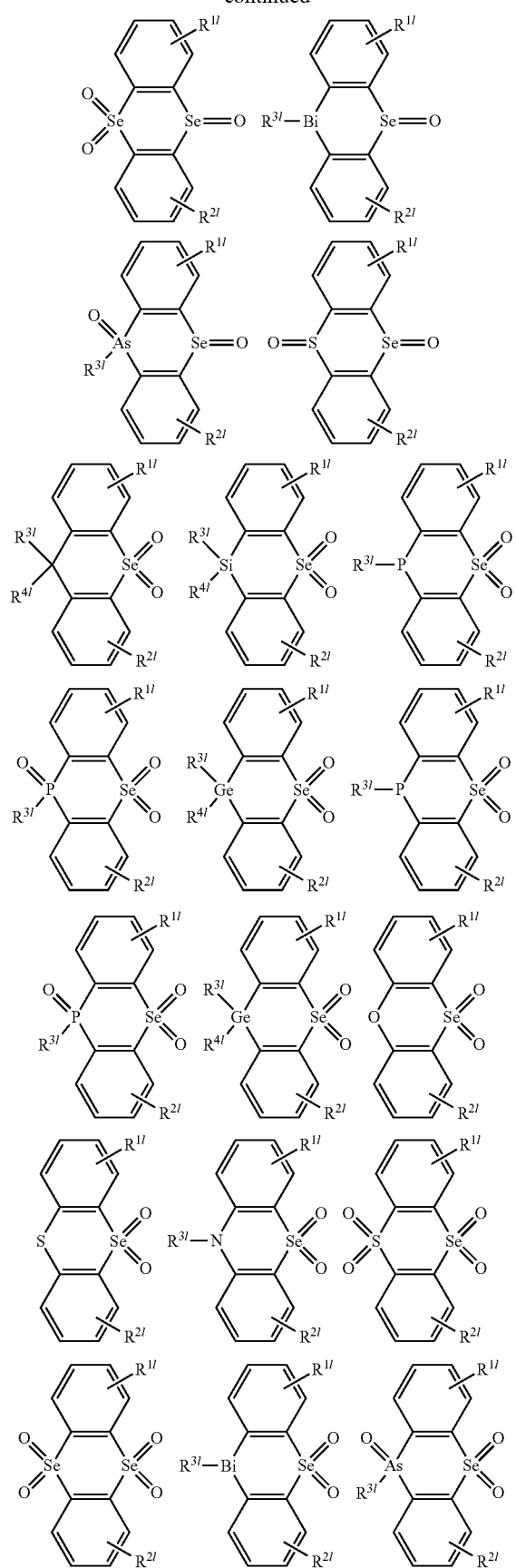
-continued
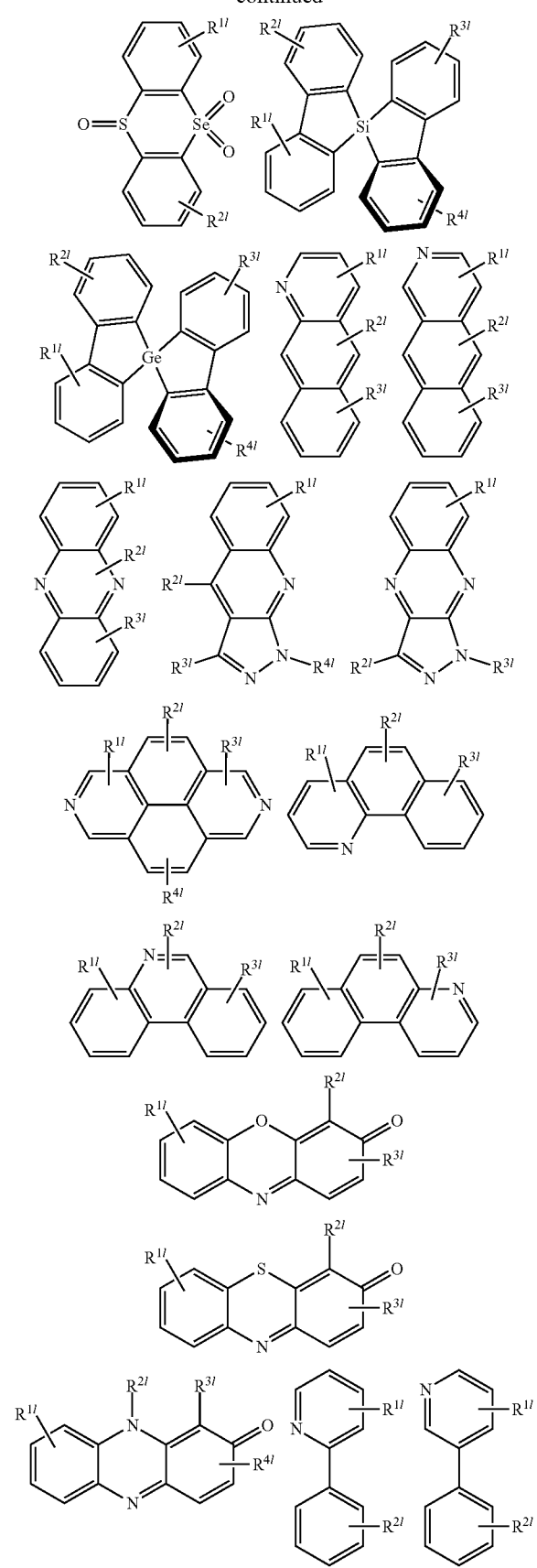

-continued
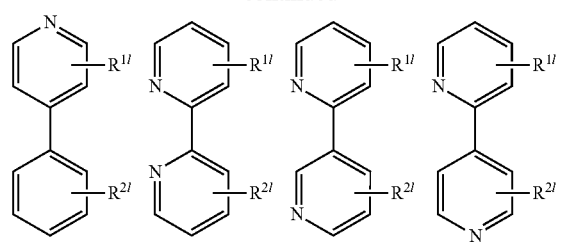
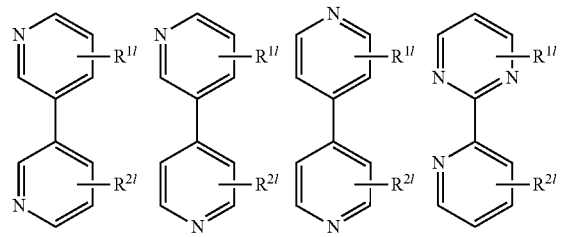
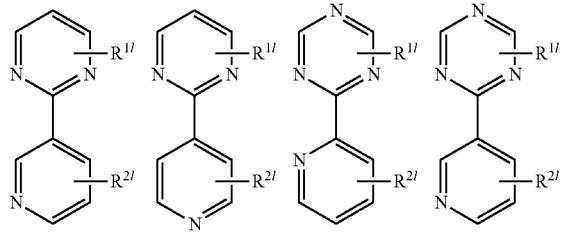
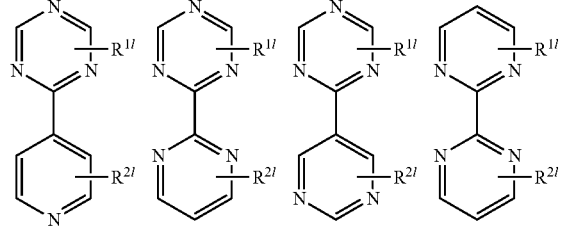
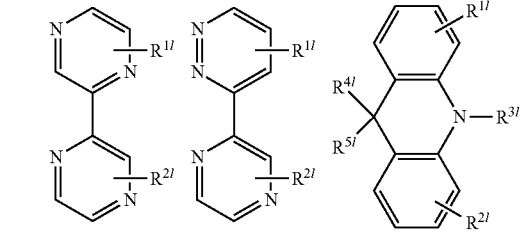
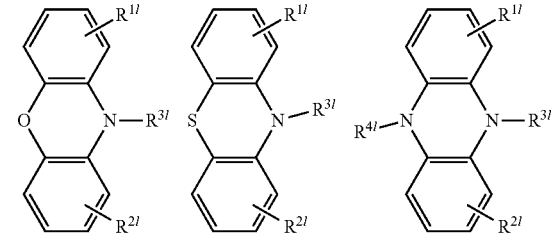
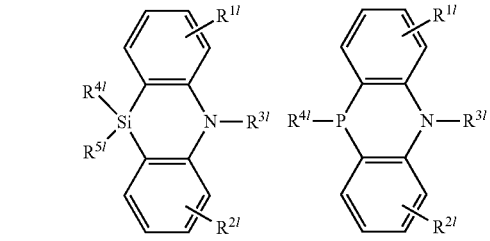
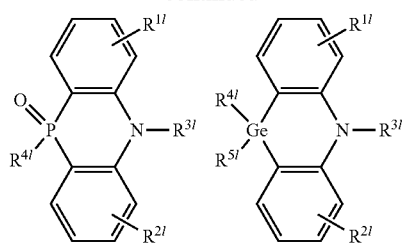
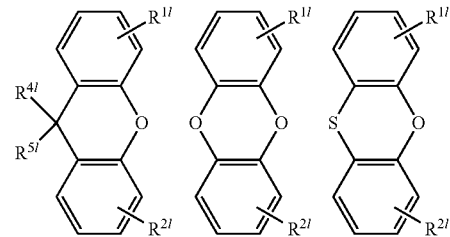
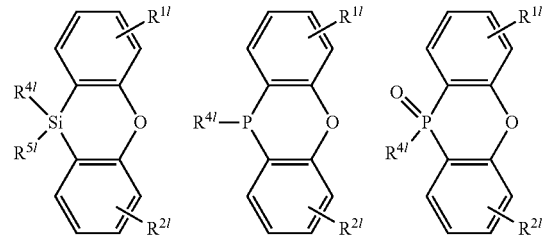
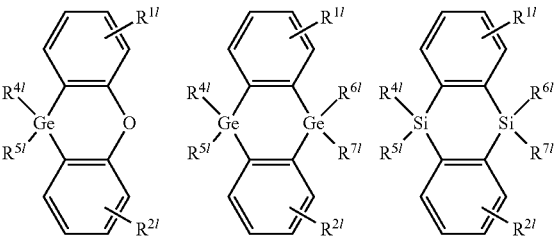
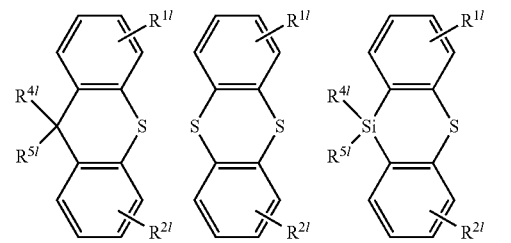
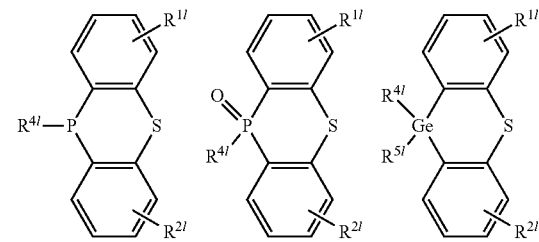
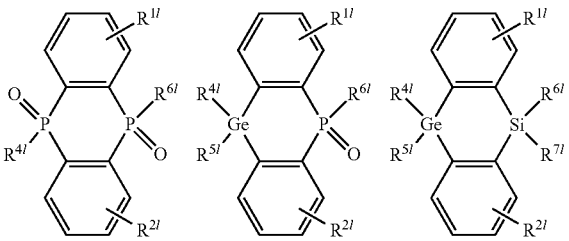

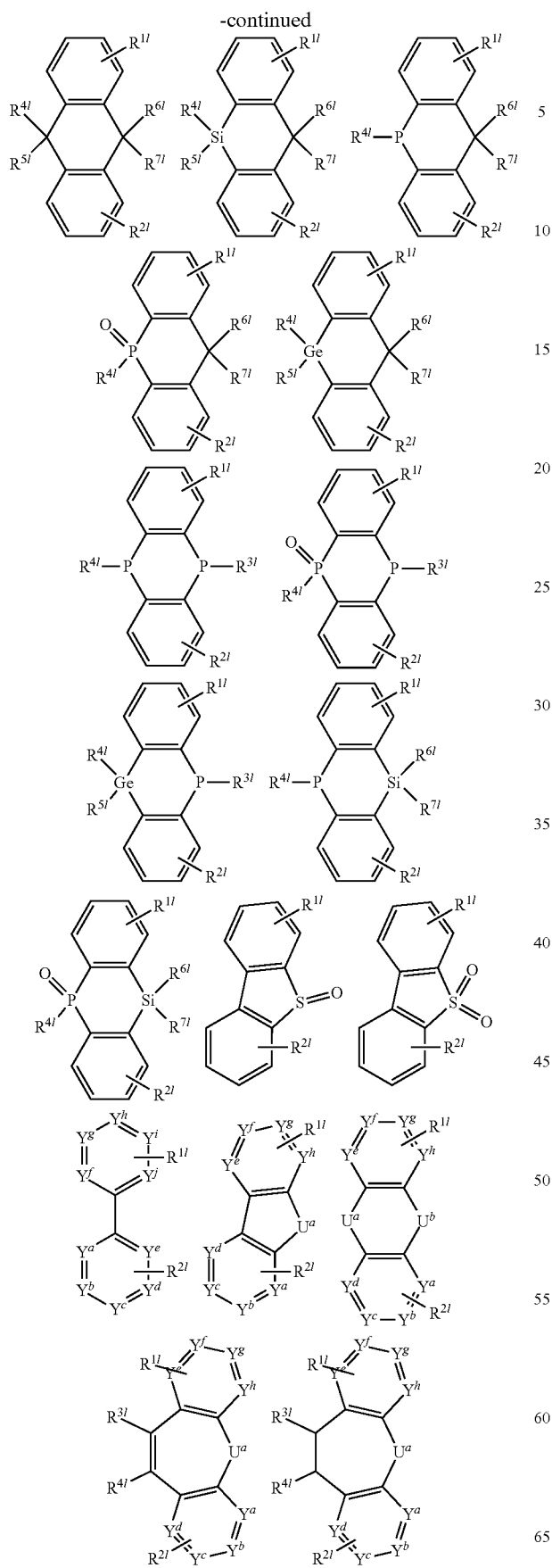
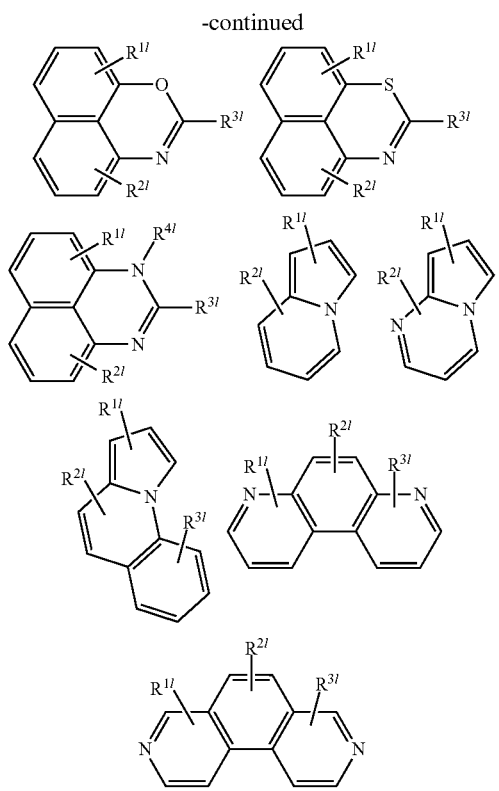
4. Other Fluorescent Luminophors
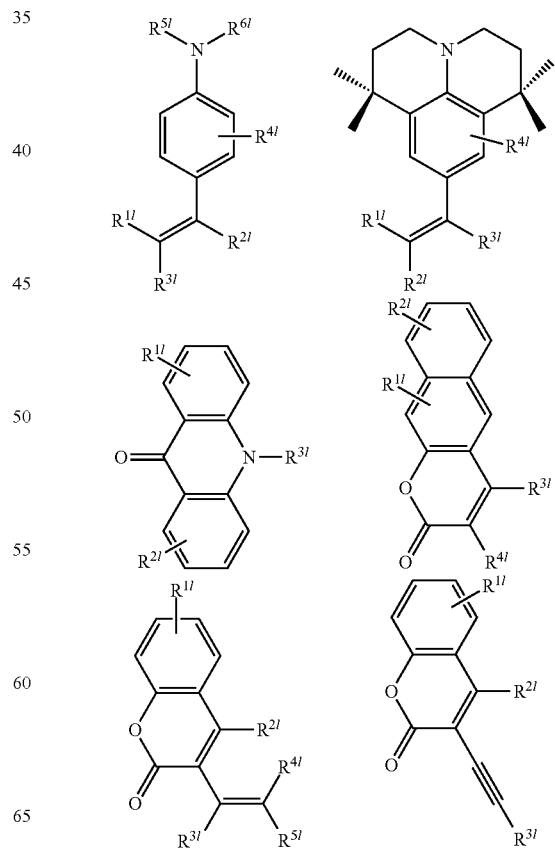

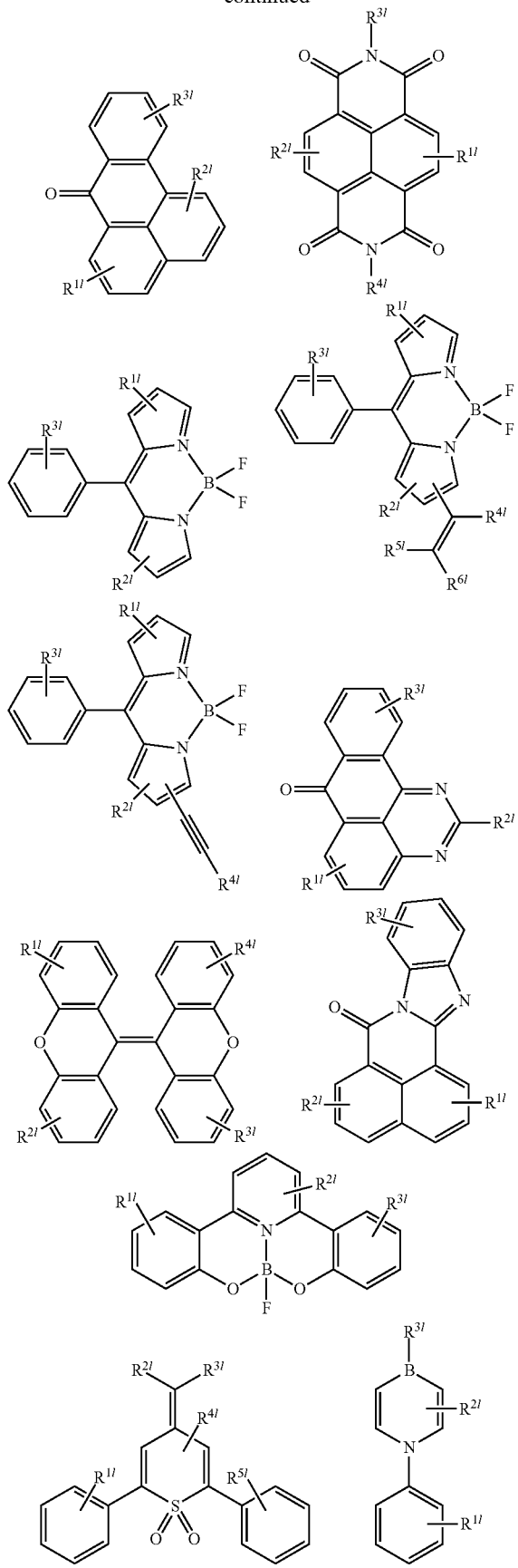
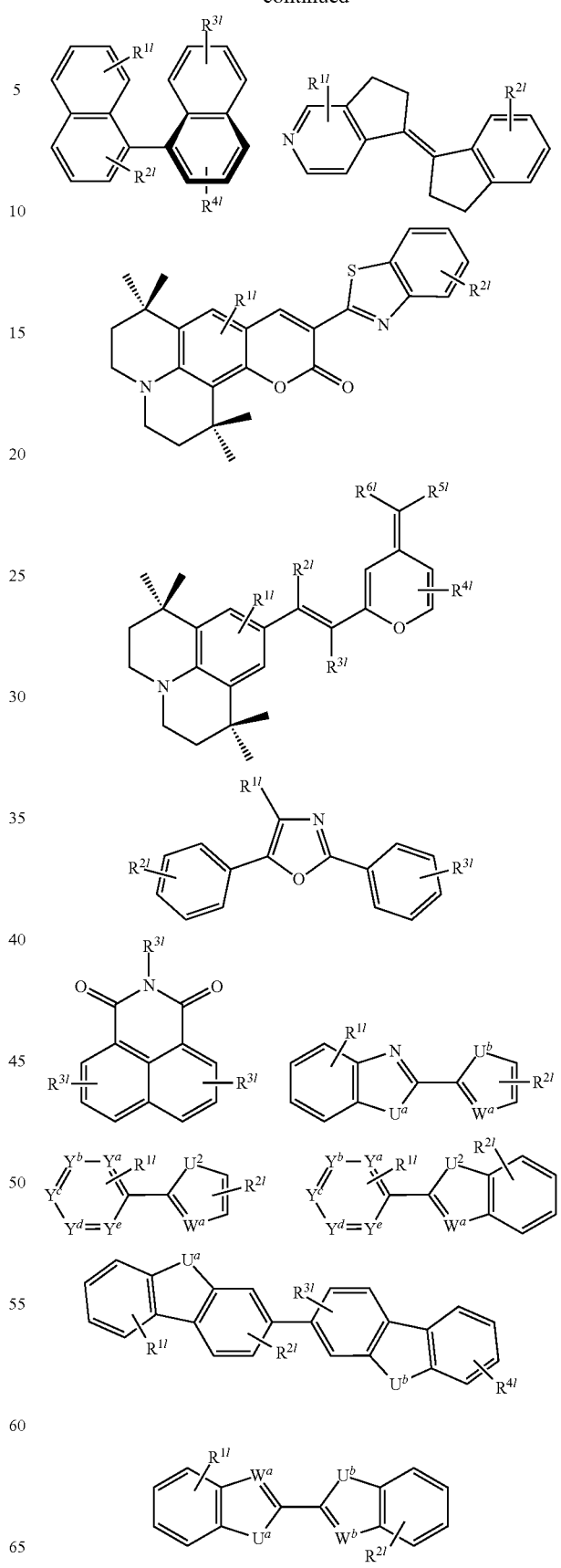

-continued

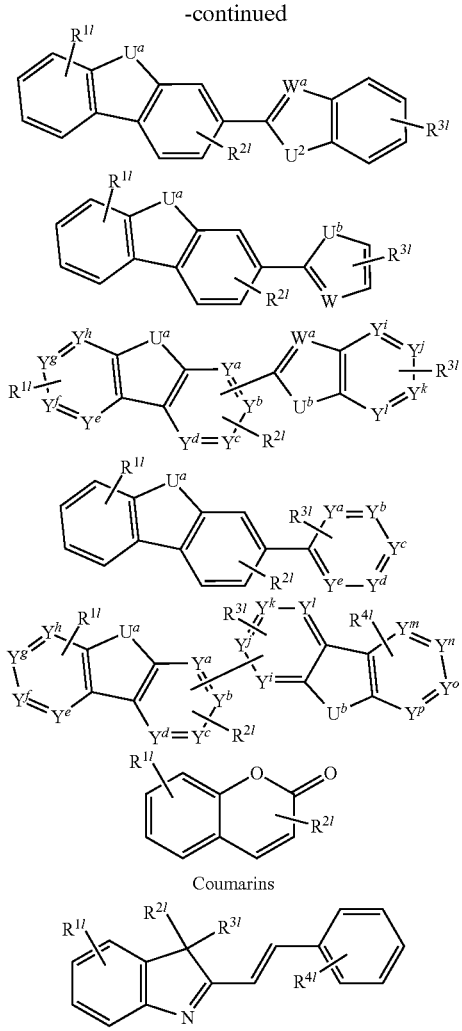

Coumarins wherein:
each of $R^{1l}$, $R^{2l}$, $R^{3l}$, $R^{4l}$, $R^{5l}$, $R^{6l}$, $R^{7l}$ and $R^{8l}$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric, or any conjugate or combination thereof, and
each of $Y^a$, $Y^b$, $Y^c$, $Y^d$, $Y^e$, $Y^f$, $Y^g$, $Y^h$, $Y^i$, $Y^j$, $Y^k$, $Y^l$, $Y^m$, $Y^n$, $Y^o$ and $Y^p$ is independently C, N or B; and
each of $U^a$, $U^b$ and $U^c$ is independently $CH_2$, CRR, C=O, SiRR, $GeH_2$, GeRR, NH, NR, PH, PR, RP=O, AsR, RAs=O, O, S, S=O, $SO_2$, Se, Se=O, $SeO_2$, BH, BR, RBi=O, BiH, or BiR, wherein each R is independently is independently hydrogen, deuterium, halogen, hydroxyl, thiol, nitro, cyano, nitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric, or any conjugate or combination thereof.

EXAMPLES

Device Fabrication: TAPC (di-[4-(N,N-di-toylyl-amino)-phyenyl]cyclohexane), TrisPCz (9,9',9"-triphenyl-9H,9'H, 9"H-3,3':6'3"-tercarbazole), 26mCPy (2,6-bis(N-carbazolyl) pyridine), DPPS (diphenyl-bis[4-(pyridin-3-yl)phenyl]silane), BmPyPB (1,3-bis[3, 5-di(pyridin-3-yl)phenyl]benzene), and BPyTP (2,7-di(2,2'-bipyridin-5-yl)triphenylene) were all synthesized by methods known in the art. HATCN (1,4,5,8,9,11-hexaazatriphenylene-hexacarbonitrile), NPD (N,N'-diphyenyl-N,N'-bis(1-naphthyl)-1,1'-biphenyl-4,4"-diamine), BAlq bis(2-methyl-8-quinolinolato)(biphenyl-4-olato)aluminum, mCBT (9,9'-(2,8-dibenzothiophenediyl) bis-9H-carbazole), mCBP (3,3-di(9H-carbazol-9-yl) biphenyl), and TBPe (2,5,8,11-tetra-tert-butylperylene) were obtained from commercial suppliers. Prior to use all materials were purified via thermal gradient sublimation under high vacuum ($10^{-5}$-$10^{-6}$ Torr). Devices were deposited on pre-patterned ITO substrates cleaned by sonication in deionized water, acetone, and isopropanol. The devices were fabricated by vacuum thermal evaporation at a pressure of less than $10^{-7}$ Torr. Organic layers were deposited at rates of 0.5 to 1.5 Å/s, and the Al cathode was deposited through a shadow mask without breaking vacuum, defining device areas of 0.04 $cm^2$. The current-voltage-luminance characteristics were measured using a Keithley 2400 SourceMeter in conjunction with a Newport 818 Si Photodiode. Electroluminescent spectra were measured with an Horiba Jobin Yvon FluoroLog-3 spectrometer at a driving current of 1 $mA/cm^2$.

Devices A-C. TBPe, a t-butyl-perylene based fluorescent emitter, and PtNON, a phosphorescent platinum emitter, both shown below, were used in this example. These materials were selected due to the high photoluminescence quantum yield (PLQY) for each and favorable overlap between the PtNON emission spectrum, with emission onset as low as 430 nm, and the absorption spectrum of TBPe. Furthermore, the advantage of the emission onset of PtNON at a much higher energy than the room temperature peak emission wavelength (~500 nm) and the small stokes shift in the TBPe emitters will result in an emission primarily from the fluorescent emitter that is bluer than that of the phosphorescent emitter alone.

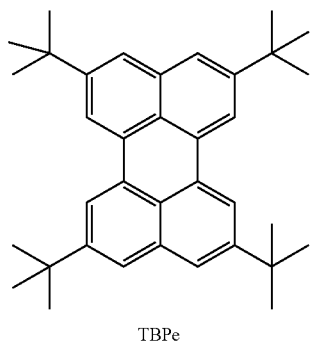

TBPe

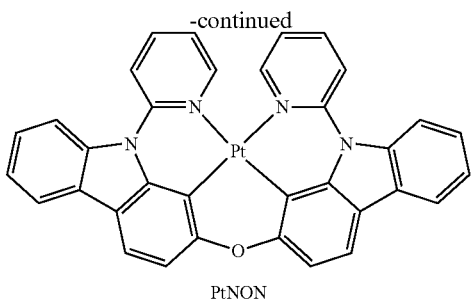

PtNON

OLEDs were fabricated with each general structure depicted FIGS. 3 and 4. For the first case (FIG. 3) devices were fabricated in the structure ITO/HATCN (10 nm)/NPD (40 nm)/TAPC (10 nm)/26mCPy:10% PtNON:x % TBPe (25 nm)/DPPS (10 nm)/BmPyPB (40 nm)/LiF/Al, where HATCN is 1,4,5,8,9,11-hexaazatriphenylene-hexacarbonitrile, NPD is N,N'-diphenyl-N,N'-bis(1-naphthyl)-1,1'-biphenyl-4,4''-diamine, TAPC is di-[4-(N,N-di-tolyl-amino)-phenyl]cyclohexane, 26mCPy is 2,6-bis(N-carbazolyl)pyridine, DPPS is diphenyl-bis[4-(pyridin-3-yl)phenyl]silane, and BmPyPB is 1,3-bis[3,5-di(pyridin-3-yl)phenyl]benzene.

Figure 5A:
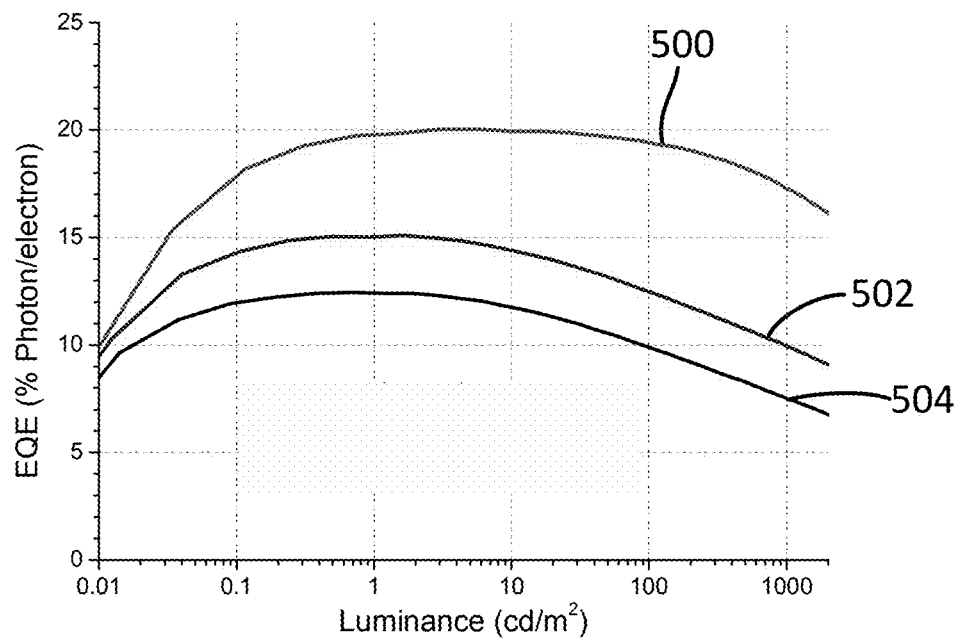
FIGS. 5A-5C show external quantum efficiency versus luminance, current-voltage characteristics, and electroluminescent spectra, respectively, of three devices doped with PtNON and TBPe.
Figure 5B:
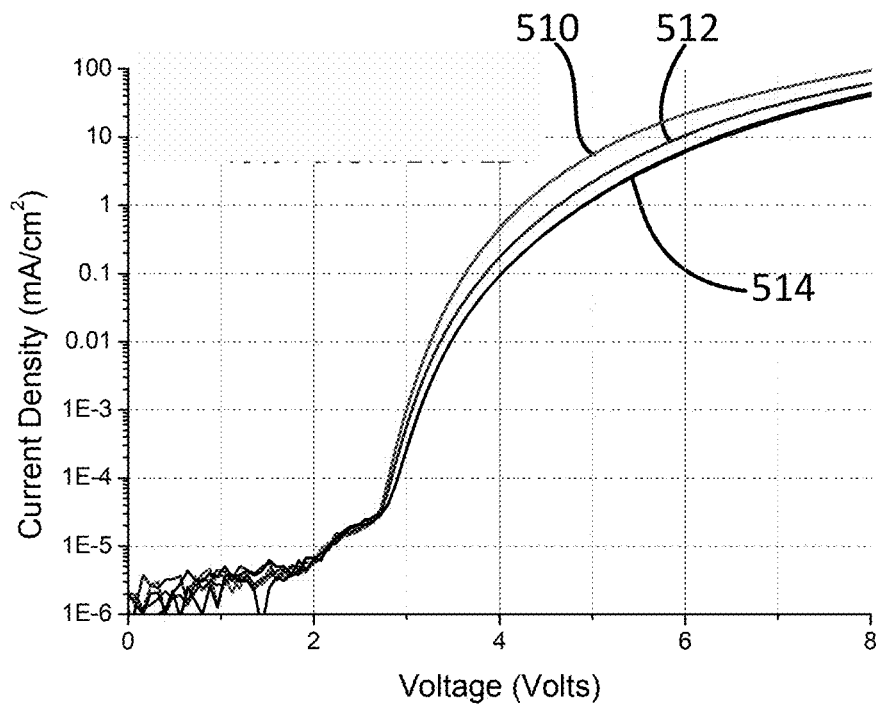
Figure 5C:
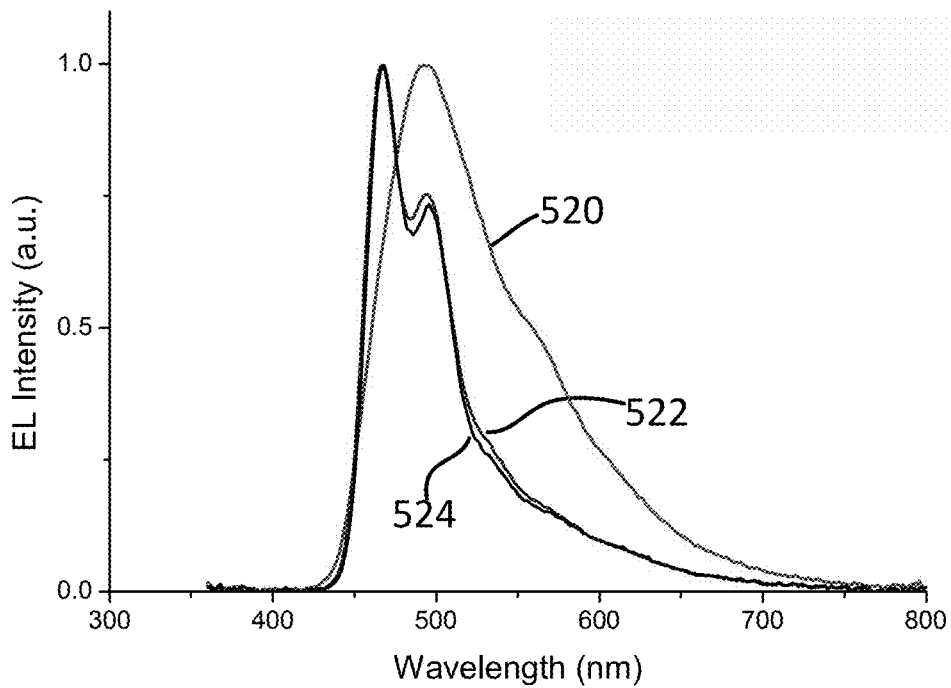
Figure 5D:
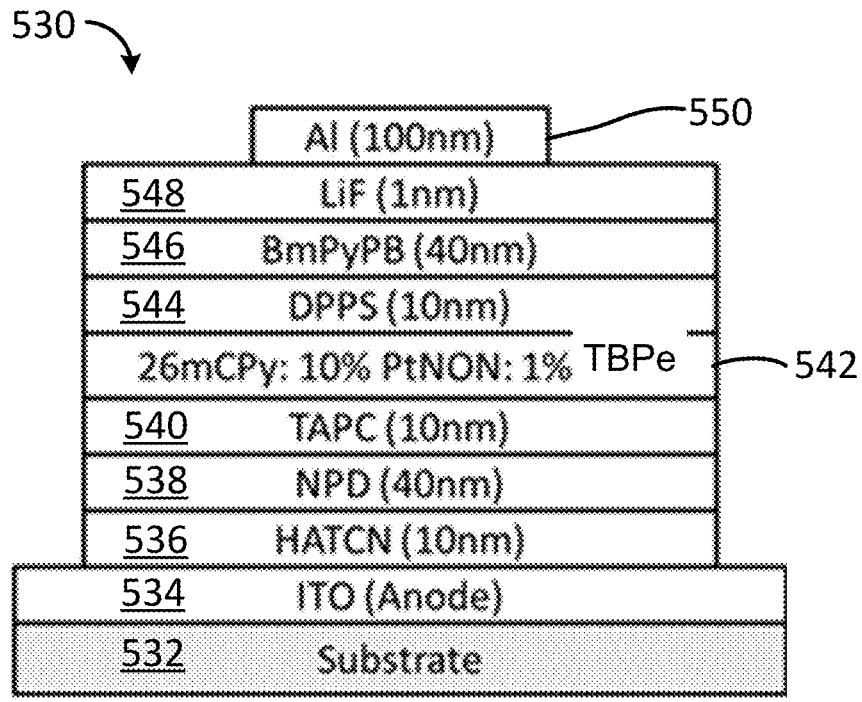
FIG. 5D depicts a cross-sectional view of the structure of the devices corresponding to the data in FIGS. 5A-5C.

FIGS. 5A-5C show external efficiency vs. luminance, current-voltage characteristics, and electroluminescent spectra, respectively, for PtNON Devices A-C having the general structure depicted in FIG. 5D (ITO/HATCN/NPD/TAPc/EML/DPPSBmPyPB/LiF/Al), where the EML for Devices A-C were (1) 10% PtNON:26mCPy; (2) 10% PtNON:1% TBPe:26mCPy; and (3) 10% PtNON:2% TBPe:26mCPy, respectively.

Plots 500, 502, and 504 in FIG. 5A show external quantum efficiency (EQE) versus luminance for Devices A-C, respectively. The moderate EQE of 10-15% indicate that a large portion of the electrogenerated excitons are being harvested (assuming a 100% electron to photon conversion efficiency corresponds to an EQE of 20-30% due to outcoupling losses). Plots 510, 512, and 514 in FIG. 5B show current voltage characteristics of Devices A-C, respectively. Plots 520, 522, and 524 in FIG. 5C show electroluminescent spectra of Devices A-C, respectively. The emission from Devices B and C originated nearly exclusively from the fluorescent emitter. When considering these results, it is understood that excitons are being formed on the phosphorescent PtNON molecules, as evidenced by the high efficiencies, which then transfer to the fluorescent TBPe emitter via FRET as evidenced by the nearly exclusive fluorescent emission. It also appears that precise control of TBPe concentration is important since the device efficiencies vary with the change of fluorescent emitter concentration. This may be due at least in part to the direct formation of excitons on the fluorescent dopant, possibly due to charge trapping as suggested by the change in current-voltage characteristics, although other mechanisms for losses may exist.

Device 530 in FIG. 5D is a cross-sectional view of the general structure of Devices A-C (in particular, Device B). Device 530 includes substrate 532, anode 534, and layers 536, 538, and 540, of HATCN, NPD, and TAPC, respectively, emissive layer 542, layers 544, 546, and 548 of DPPS, BmPyPB, and LiF, respectively, and cathode 550.

Figure 6A:
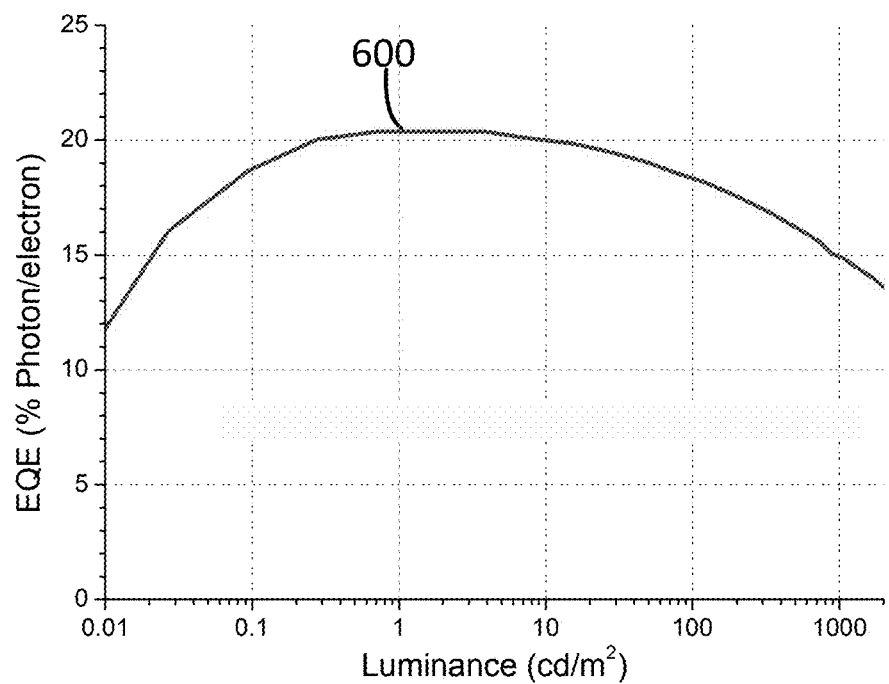
FIGS. 6A-6C show external quantum efficiency versus luminance, current-voltage characteristics, and electroluminescent spectra, respectively, of a device that includes alternating doped layers including PtNON or TBPe.
Figure 6B:
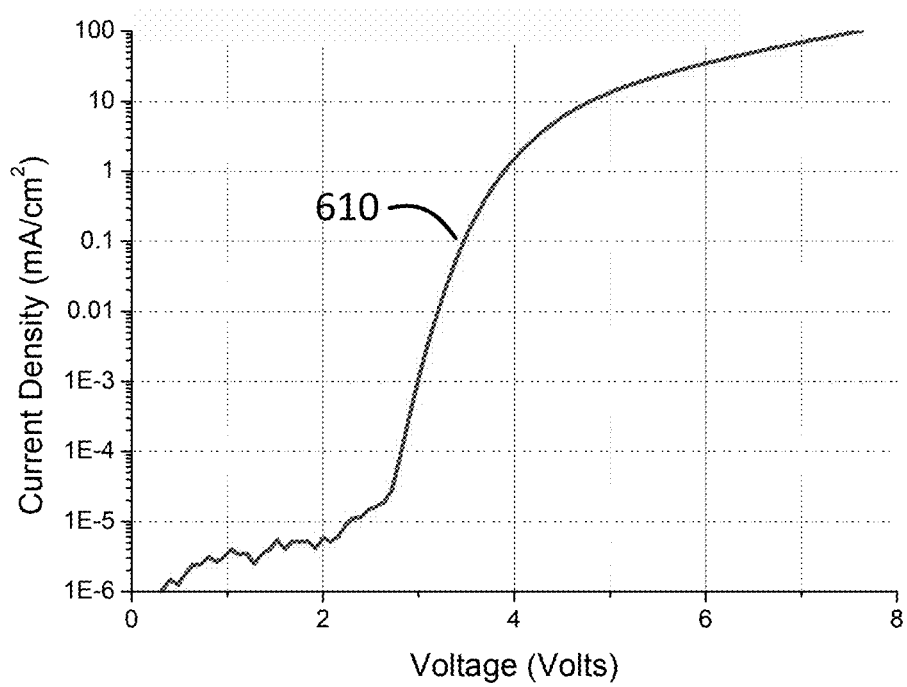
Figure 6C:
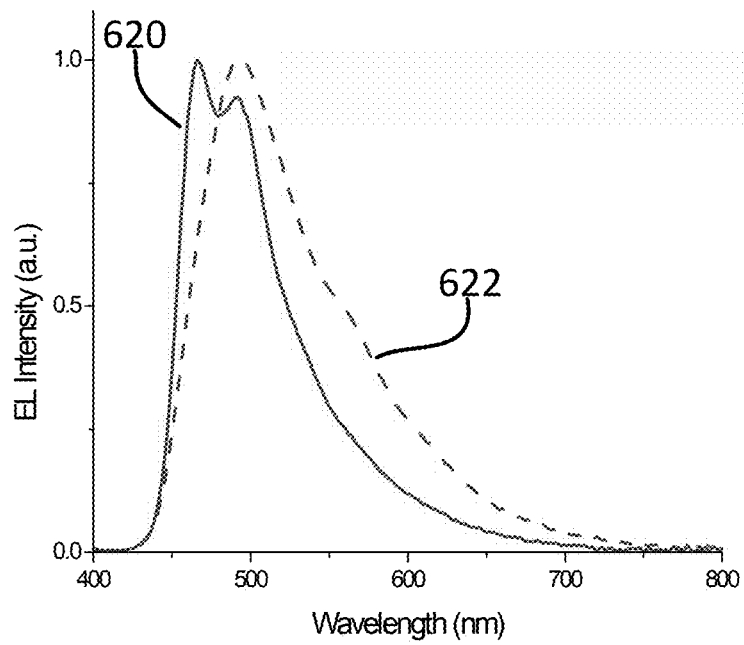
Figure 6D:
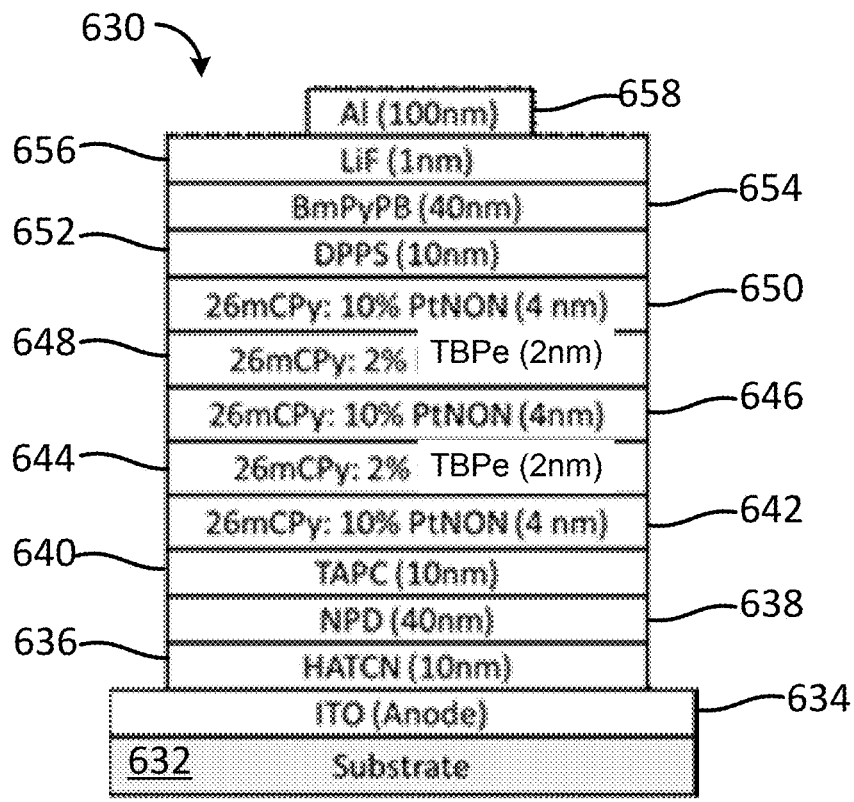
FIG. 6D depicts a cross-sectional view of the device corresponding to the data in FIGS. 6A-6C.

Device D. FIGS. 6A-6C show external efficiency vs. brightness, current-voltage characteristics, and electroluminescent spectra, respectively, for Device D having the general structure ITO/HATCN/NPD/TAPc/EML/DPPSBmPyPB/LiF/Al as depicted in FIG. 6D, where the alternative EMLs for Device D are (1) 10% PtNON:26mCPy and (2) 2% TBPe:26mCPy. The general structure depicted in FIG. 6D was used to circumvent the potential tradeoff between high FRET efficiency and efficiency losses from direct exciton formation on TBPe molecules. Device D was fabricated with the structure ITO/HATCN (10 nm)/NPD (40 nm)/TAPC (10 nm)/26mCPy:10% PtNON (4 nm)/26mCPy:2% TBPe (2 nm)/26mCPy:10% PtNON (4 nm)/26mCPy:2% TBPe (2 nm)/26mCPy:10% PtNON (4 nm)/DPPS (10 nm)/BmPyPB (40 nm)/LiF/Al, with alternating phosphorescent and fluorescent doped layers.

Plot 600 in FIG. 6A shows external quantum efficiency versus luminance for Device D. Plot 610 in FIG. 6B shows current density versus voltage for Device D. Plots 620 and 622 show electroluminescent spectra for Device D and a 10% PtNON reference device, respectively. As shown in FIGS. 6A-6C, Device D exhibited an efficiency of over 20% while still exhibiting emission primarily originating from the fluorescent emitter, thereby demonstrating the capability to manipulate the emission spectrum and emit nearly exclusively from fluorescent emitters while maintaining a high efficiency.

As depicted in FIG. 6D, Device 630 includes substrate 632, anode 634, layers 636, 638, and 640 of HATCN, NPD, and TAPC, respectively, layers 642, 646, and 650 of 26mCPy:10% PtNON 642, layers 644 and 648 of 26mCPy:2% TBPe 644, layers 652, 654, and 656 of DPPS, BmPyPB, and LiF, respectively, and cathode 658. This order was selected with the recombination zone located on the PtNON doped layer so that the majority of the excitons are formed on the PtNON molecules, thereby allowing harvest of 100% of the electrogenerated excitons. The layer thicknesses were also kept low so that there was a sufficiently small distance between the phosphorescent material and the fluorescent emitters to allow rapid FRET to occur.

Figure 7:
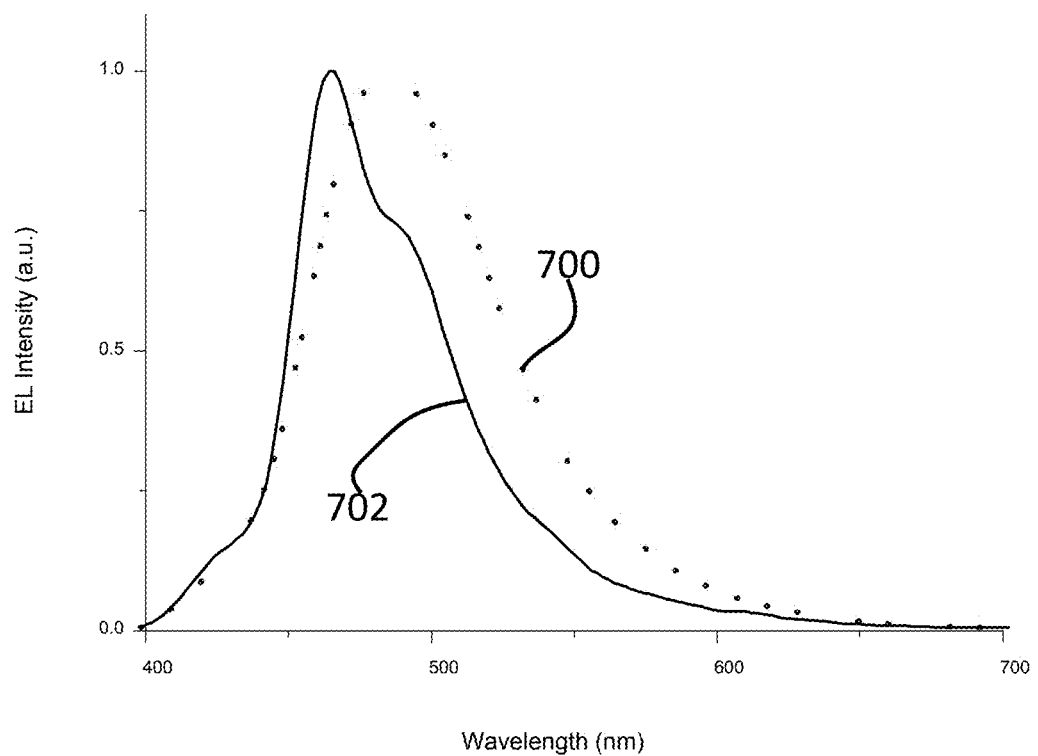
FIG. 7 shows electroluminescent spectra of devices doped with PtNON and with PtNON and TBPe.

Devices 1-2. PtNON can be used to harvest triplet excitons with and subsequently transfer the energy to a fluorescent emitter with high emission energy. Devices 1 and 2 were fabricated with the structure ITO/HATCN (10 nm)/NPD (40 nm)/6% PtNON:mCBP/mCBT (10 nm)/BpyTP (40 nm)/LiF (1 nm)/Al (100 nm) and ITO/HATCN (10 nm)/NPD (40 nm)/6% PtNON:1% TBPe:mCBP (25 nm)/mCBT (10 nm)/BpyTP (40 nm)/LiF (1 nm)/Al (100 nm), respectively, where Device 1 has an EML of 6% PtNON:mCBP and Device 2 has an EML of 6% PtNON:1% TBPe:mCBP (25 nm), where TBPe is 1% 2,5,8,11-tetra-tert-butylperylene (TBPe), a known efficient fluorescent blue emitter. Plots 700 and 702 in FIG. 7 show electroluminescent spectra of Devices 1 and 2, respectively. As shown in plot 702, the electroluminescent spectrum of Device 2 takes on the narrow blue emission character of the fluorescent emitter rather than the broad emission characteristics of PtNON, indicating effective energy transfer to the fluorescent dopant. The emission peak of Device 2 shifts to 464 nm, yielding blue emission with CIE coordinates of (0.15, 0.21). This shift in color between Devices 1 and 2 achieved while maintaining similar efficiencies.

Figure 8:
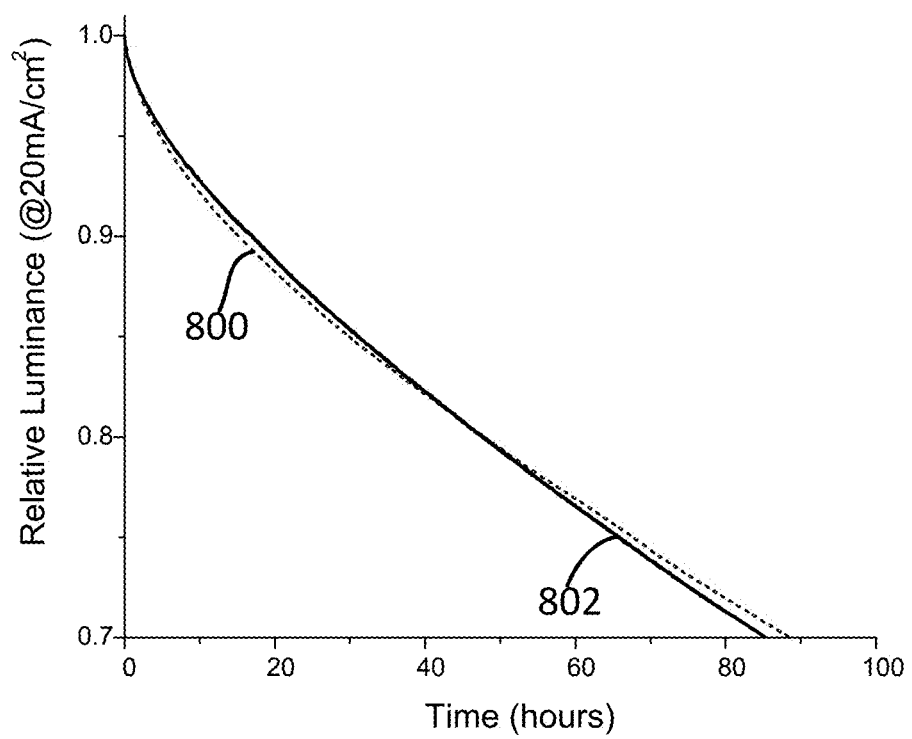
FIG. 8 shows operational lifetimes of devices doped with PtNON and with PtNON and TBPe.

The operational lifetime of Device 2 was also measured at an accelerated constant driving current of 20 mA/cm$^2$. Plots 800 and 802 in FIG. 8 shows relative luminance versus operational time for Devices 1 and 2, respectively. As shown in plot 802, $LT_{70}$ of Device 2 is 85 h at $L_0$=2257 cd/m$^2$, corresponding to nearly 17,000 h at 100 cd/m$^2$.

Figure 9A:
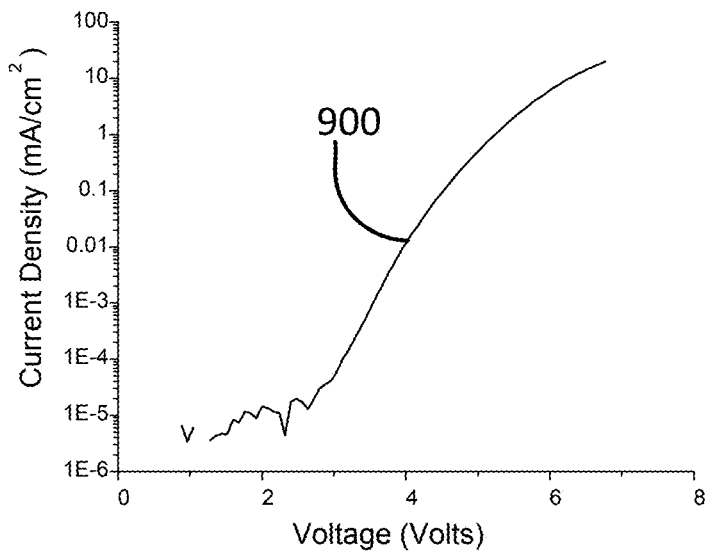
FIGS. 9A and 9B show current-voltage characteristics and external quantum efficiency versus luminance, respectively, of a device doped with PtNON and TBPe.
Figure 9B:
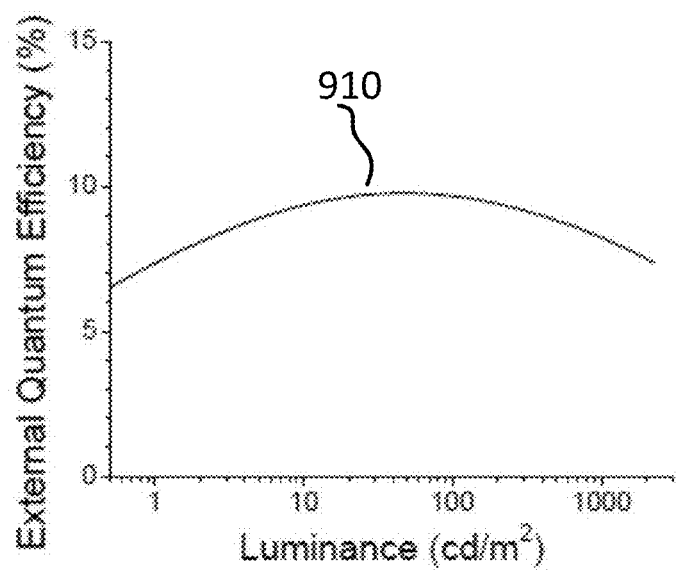

Plot 900 in FIG. 9A shows current density voltage characteristics of Device 2. Plot 910 in FIG. 9B shows a peak EQE of 9.8% for Device 2, and an EQE of 8.2% at 1000 cd/m$^2$. The similar efficiencies of Devices 1 and 2 suggest that PtNON is still effectively harvesting the triplet excitons then transferring the energy to the TBPe molecules. Such a strategy highlights the compatibility of the high triplet energy of PtNON with a deep blue fluorescent emitter such as TBPe.

Devices 3-6. Devices 3-6 were fabricated with the following structures:

Device 3: ITO/HATCN (10 nm)/NPD (40 nm)/6% PtNON:1% TBPe:mCBP (25 nm)/mCBT (10 nm)/ BpyTP (40 nm)/LiF (1 nm)/Al (100 nm);

Device 4: ITO/HATCN (10 nm)/NPD (40 nm)/6% PtNON:1% TBPe:mCBP (25 nm)/1% TBPe:mCBP (2.5 nm)/mCBT (10 nm)/BpyTP (40 nm)/LiF (1 nm)/Al (100 nm);

Device 5: ITO/HATCN (10 nm)/NPD (40 nm)/1% TBPe:mCBP (2.5 nm)/6% PtNON:1% TBPe:mCBP (25 nm)/ mCBT (10 nm)/BpyTP (40 nm)/LiF (1 nm)/Al (100 nm);

Device 6: ITO/HATCN (10 nm)/NPD (40 nm)/1% TBPe: mCBP (2.5 nm)/6% PtNON:1% TBPe:mCBP (25 nm)/ 1% TBPe:mCBP (2.5 nm)/mCBT (10 nm)/BpyTP (40 nm)/LiF (1 nm)/Al (100 nm).

Figure 10A:
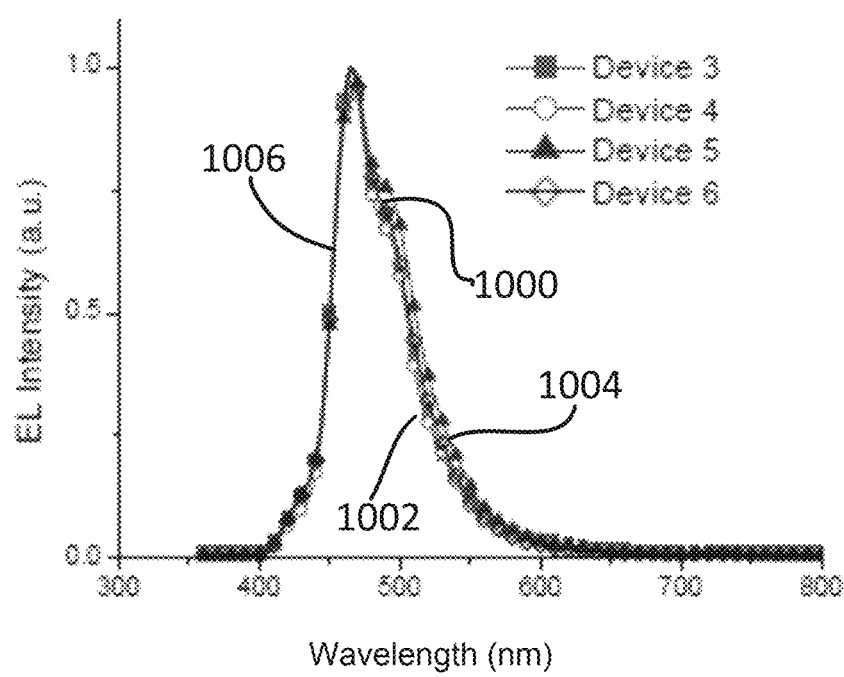
FIGS. 10A-10D show electroluminescent spectra, current-density voltage characteristics, external quantum efficiency versus luminance, and operational lifetimes, respectively, of four devices doped with PtNON and TBPe.
Figure 10B:
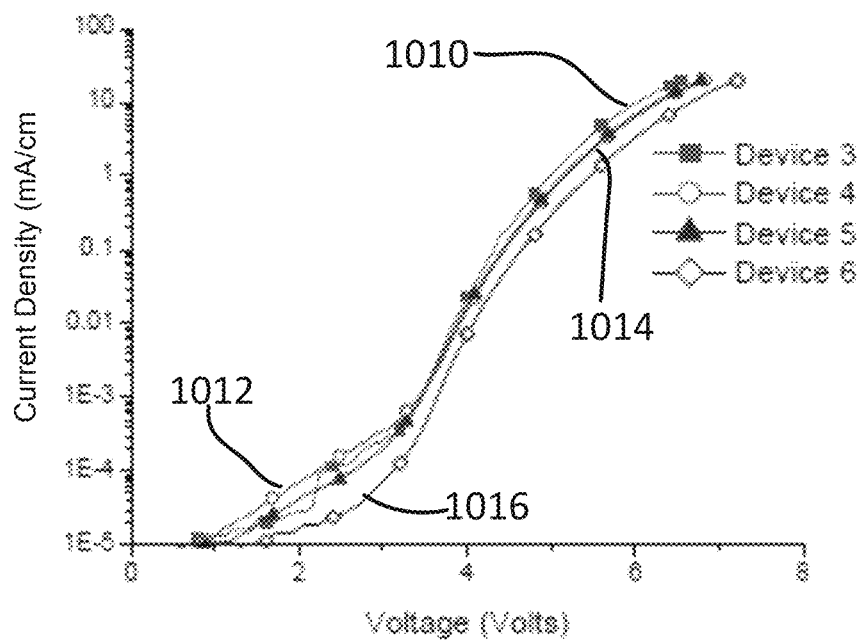
Figure 10C:
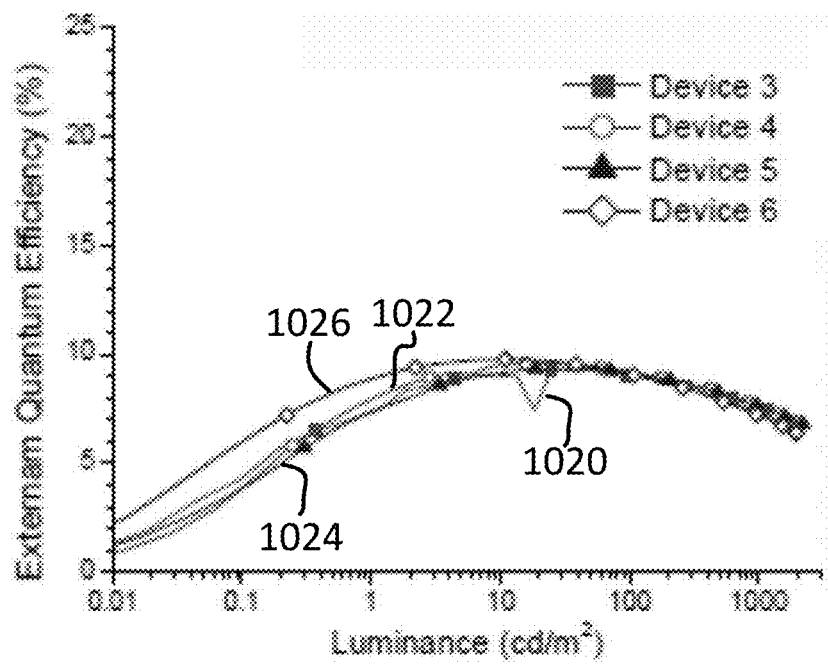
Figure 10D:
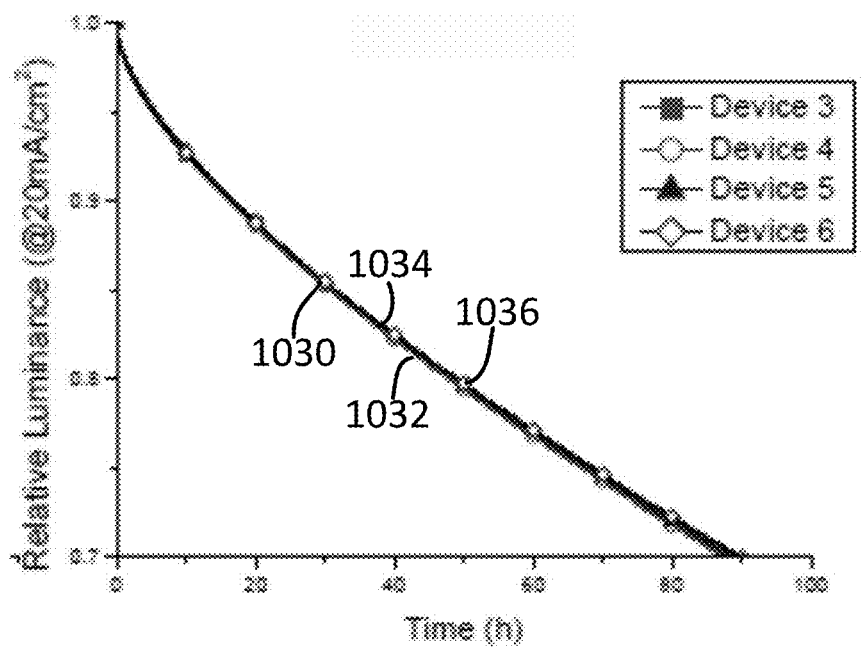
Figure 11A:
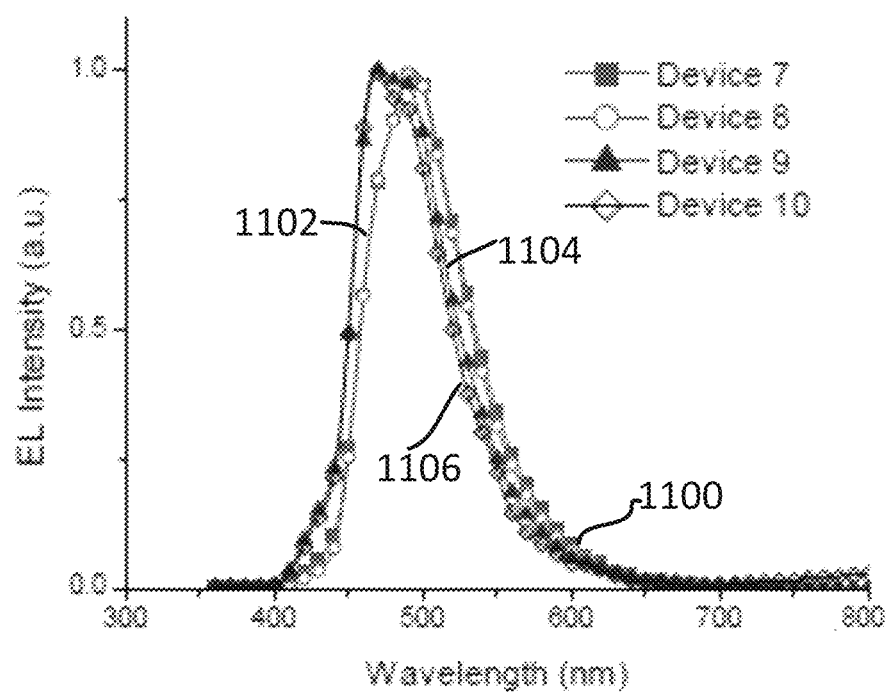
FIGS. 11A-11D show electroluminescent spectra, current-density voltage characteristics, external quantum efficiency versus luminance, and operational lifetimes, respectively, of four devices doped with PtNON and TBPe.
Figure 11B:
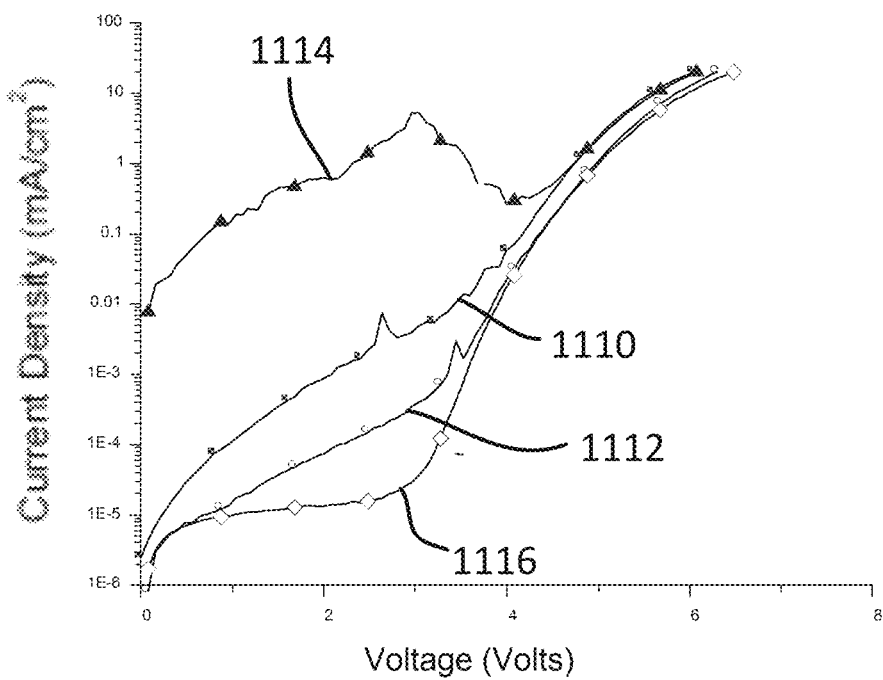
Figure 11C:
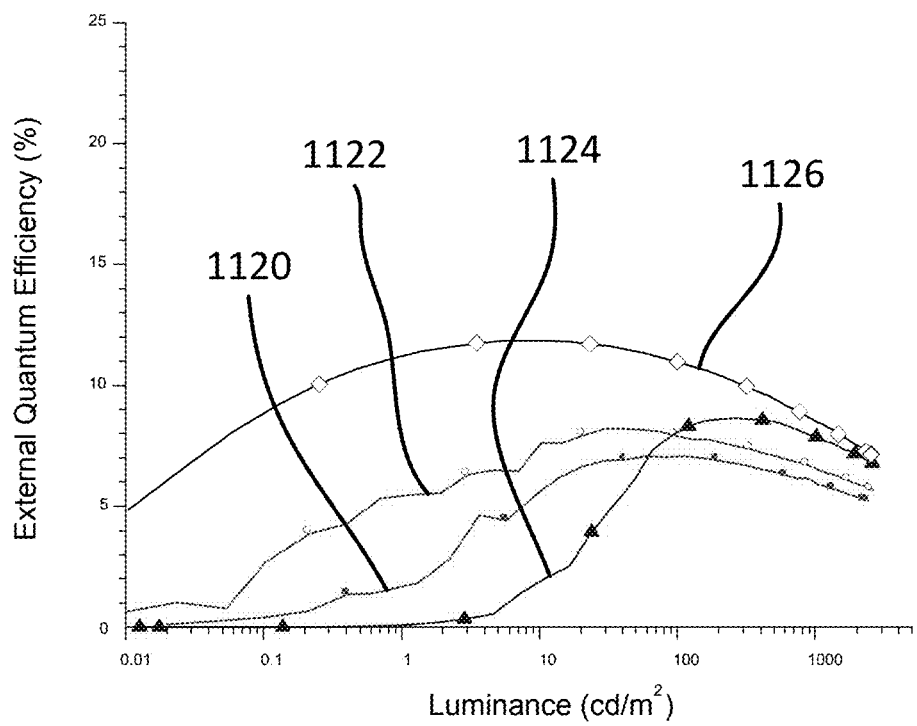
Figure 11D:
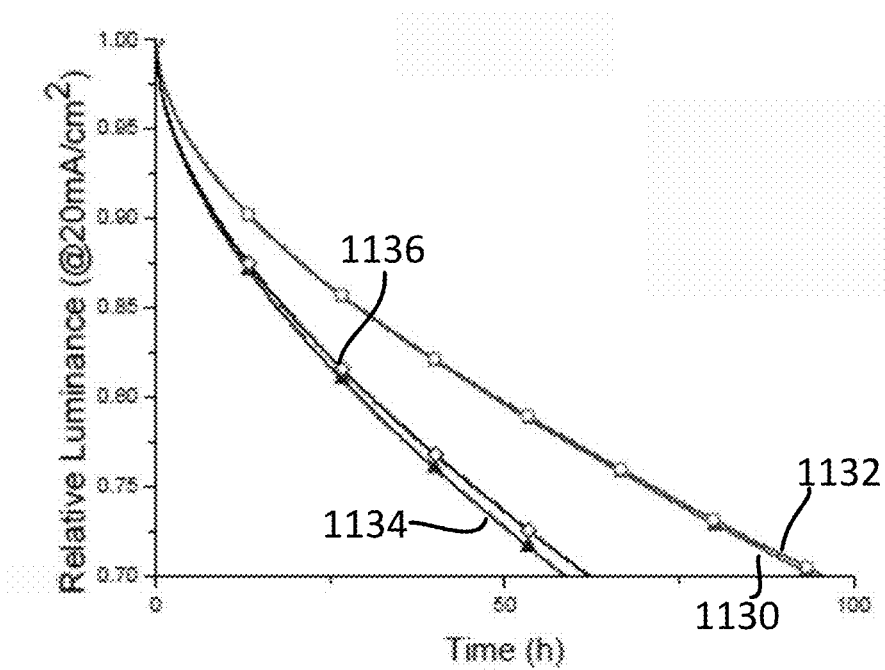

Plots 1000, 1002, 1004, and 1006 in FIG. 10A are electroluminescent spectra of Devices 3-6, respectively. Plots 1010, 1012, 1014, and 1016 in FIG. 10B show current density voltage characteristics for Devices 3-6, respectively. Plots 1020, 1022, 1024, and 1026 in FIG. 10C show EQE versus luminance for Devices 3-6, respectively. Plots 1030, 1032, 1034, and 1036 in FIG. 10D show electroluminescent intensity versus operational time at a constant driving current of 20 mA/cm$^2$ for Devices 3-6, respectively.

Devices 7-10. Devices 7-10 were fabricated with the following structures:

Device 7: ITO/HATCN (10 nm)/NPD (40 nm)/6% PtNON:mCBP (5 nm)/1% TBPe:mCBP (2.5 nm)/6% PtNON:mCBP (5 nm)/1% TBPe:mCBP (2.5 nm)/6% PtNON:mCBP (5 nm)/mCBT (10 nm)/BpyTP (40 nm)/ LiF (1 nm)/Al (100 nm); Device 8: ITO/HATCN (10 nm)/NPD (40 nm)/6% PtNON:mCBP (5 nm)/1% TBPe:mCBP (2.5 nm)/6% PtNON:mCBP (5 nm)/1% TBPe:mCBP (2.5 nm)/6% PtNON:mCBP (5 nm)/1% TBPe:mCBP (2.5 nm)/mCBT (10 nm)/BpyTP (40 nm)/ LiF (1 nm)/Al (100 nm);

Device 9: ITO/HATCN (10 nm)/NPD (40 nm)/1% TBPe: mCBP (2.5 nm)/6% PtNON:mCBP (5 nm)/1% TBPe: mCBP (2.5 nm)/6% PtNON:mCBP (5 nm)/1% TBPe: mCBP (2.5 nm)/6% PtNON:mCBP (5 nm)/mCBT (10 nm)/BpyTP (40 nm)/LiF (1 nm)/Al (100 nm);

Device 10: ITO/HATCN (10 nm)/NPD (40 nm)/1% TBPe:mCBP (2.5 nm)/6% PtNON:mCBP (5 nm)/1% TBPe:mCBP (2.5 nm)/6% PtNON:mCBP (5 nm)/1% TBPe:mCBP (2.5 nm)/6% PtNON:mCBP (5 nm)/1% TBPe:mCBP (2.5 nm)/mCBT (10 nm)/BpyTP (40 nm)/ LiF (1 nm)/Al (100 nm).

Plots 1100, 1102, 1104, and 1106 in FIG. 10A show electroluminescent spectra of Devices 7-10, respectively. Plots 1110, 1112, 1114, and 1116 in FIG. 10B show current density voltage characteristics for Devices 7-10, respectively. Plots 1120, 1122, 1124, and 1126 in FIG. 10C show EQE versus luminance for Devices 7-10, respectively. Plots 1130, 1132, 1134, and 1136 in FIG. 10D show electroluminescent intensity versus operational time at a constant driving current of 20 mA/cm$^2$ for Devices 7-10, respectively.

Table 1 lists device performance of Devices 1-10.

TABLE 1

Device performance of PtNON with TBPe.

| Device | Dopant | CIE | EQE (%) | | | | Lifetime (hours) | | |
| | | | Peak | 100 cd/m$^2$ | 1000 cd/m$^2$ | Lo (cd/m$^2$) | L = L$_0$ | L = 1000 cd/m$^2$ | L = 100 cd/m$^2$ |
| --- | --- | --- | --- | --- | --- | --- | --- | --- | --- |
| 1 | PtNON | (0.17, 0.32) | 10.7 | 10.5 | 9.1 | 3145 | 89 | 624 | 31286 |
| 2 | PtNON + TBPe | (0.15, 0.21) | 9.8 | 9.7 | 8.2 | 2257 | 85 | 340 | 16999 |
| 3 | PtNON + TBPe | | 9.3 | 9.0 | 7.5 | 1987 | 88 | 282 | 14171 |
| 4 | PtNON + TBPe | | 9.5 | 9.1 | 7.6 | 2009 | 87 | 284 | 14275 |
| 5 | PtNON + TBPe | | 9.3 | 9.1 | 7.5 | 2180 | 88 | 331 | 16590 |
| 6 | PtNON + TBPe | | 9.7 | 9.0 | 7.1 | 1935 | 89 | 273 | 13700 |
| 7 | PtNON + TBPe | | 7.0 | 7.0 | 5.9 | 2413 | 94 | 420 | 21060 |
| 8 | PtNON + TBPe | | 8.2 | 7.9 | 6.5 | 2585 | 95 | 477 | 23928 |
| 9 | PtNON + TBPe | | 8.6 | 8.2 | 7.8 | 2581 | 58 | 290 | 14570 |
| 10 | PtNON + TBPe | | 11.8 | 10.9 | 8.5 | 2532 | 62 | 300 | 15075 |

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. A light emitting device comprising, sequentially:
   a first electrode;
   a hole transporting layer;
   an emissive layer;
   an electron transporting layer; and
   a second electrode;
   wherein the emissive layer comprises a phosphorescent material, a fluorescent emitter, and a host, wherein the phosphorescent material harvests electrogenerated excitons and transfers energy to the fluorescent emitter;
   wherein the phosphorescent material comprises a luminophore comprising a six-membered chelation ring;
   wherein the fluorescent emitter comprises a boron atom, wherein the boron atom is comprised within a 6 membered heterocyclic ring and the 6 membered heterocyclic ring is optionally part of a fused ring system containing 3 or more rings; and
wherein the fluorescent emitter is not represented by the following structure

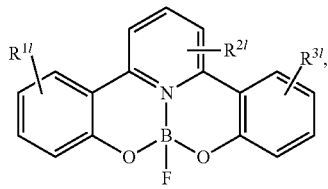

wherein each of $R^{11}$, $R^{21}$, and $R^{31}$ is independently hydrogen or alkyl.

2. The device of claim 1, wherein the phosphorescent material comprises a carbazole.

3. The device of claim 1, wherein the phosphorescent material comprises at least two six-membered chelation rings.

4. The device of claim 1, wherein the phosphorescent material is a platinum complex.

5. A light emitting device comprising, sequentially: a first electrode; a hole transporting layer; an emissive layer; an electron transporting layer; and a second electrode; wherein the emissive layer comprises a phosphorescent material, a fluorescent emitter, and a host, wherein the phosphorescent material harvests electrogenerated excitons and transfers energy to the fluorescent emitter; wherein the phosphorescent material is a tetradentate platinum complex; and wherein the fluorescent emitter comprises a boron atom, wherein the boron atom is comprised within a 6 membered heterocyclic ring and the 6 membered heterocyclic ring is optionally part of a fused ring system containing 3 or more rings: and wherein the fluorescent emitter is not represented by the following structure

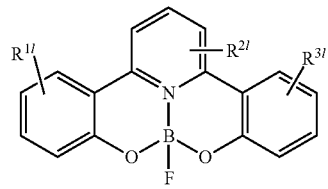

wherein each of $R^{1l}$ $R^{1l}$, and $R^{3l}$ is independently hydrogen or alkyl.

6. The light emitting device of claim 5, wherein the phosphorescent material comprises a compound of General Formula I:

General Formula I

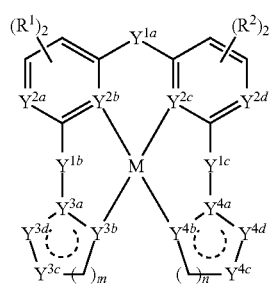

wherein:
each of $Y^{1a}$, $Y^{1b}$, and $Y^{1c}$ is independently O, $NR^3$, $CR^3R^4$, S, $AsR^3$, $BR^3$, $PR^3$, $P(O)R^3$, or $SiR^3R^4$, wherein each of $R^3$ and $R^4$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, amino, alkoxy, haloalkyl, arylalkyl, arylalkenyl, or $R^3$ and $R^4$ together form C=O, wherein each of $R^3$ and $R^4$ is independently optionally linked to an adjacent ring structure, thereby forming a cyclic structure;

each of $Y^{2a}$, $Y^{2b}$, $Y^{2c}$, and $Y^{2d}$ is independently N, C, $NR^5$, or $CR^6$, wherein each $R^5$ and $R^6$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, amino, alkoxy, haloalkyl, arylalkyl, or arylalkenyl;

each of $Y^{3a}$, $Y^{3d}$, $Y^{4a}$, $Y^{4b}$, and $Y^{4d}$ is independently N, C, O, S, $NR^7$, $CR^8$, wherein each $R^7$ and $R^8$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, aminoalkoxy, haloalkyl, arylalkyl, or arylalkenyl; or Z $(R^9)_2$, wherein Z is C or Si, and wherein each $R^9$ is independently hydrogen, halogen, hydroxyl, thiol, substituted or unsubstituted alkyl, alkenyl, alkynyl, aryl, heteroaryl, cycloalkyl, cycloalkenyl, heterocyclic group, amino, alkoxy, haloalkyl, arylalkyl, or arylalkenyl;

each of $Y^{3b}$, $Y^{3c}$, and $Y^{4c}$ is independently N, O, S, $NR^7$, $CR^8$, wherein each $R^7$ and $R^8$ is independently hydrogen, halogen, hydroxyl, thiol, or substituted or unsubstituted alkyl, alkenyl, alkynyl, aryl, heteroaryl, cycloalkyl, cycloalkenyl, heterocyclic group, aminoalkoxy, haloalkyl, arylalkyl, or arylalkenyl; or $Z(R^9)_2$, wherein Z is C or Si, and wherein each $R^9$ is independently hydrogen, halogen, hydroxyl, thiol, substituted or unsubstituted alkyl, alkenyl, alkynyl, aryl, heteroaryl, cycloalkyl, cycloalkenyl, heterocyclic group, amino, alkoxy, haloalkyl, arylalkyl, or arylalkenyl;

each of m and n is independently 1 or 2; and each ⸨⎯⸩ independently represents partial or full unsaturation of the ring with which it is associated.

7. The light emitting device of claim 6, wherein at least one of $Y^{1b}$ and $Y^{1c}$ is independently $NR^3$, $CR^3R^4$, S, $AsR^3$, $BR^3$, $PR^3$, $P(O)R^3$, or $SiR^3R^4$, wherein $R^3$ is covalently linked to at least one of $Y^{2a}$, $Y^{2d}$, $Y^{3d}$, and $Y^{4d}$, thereby forming a cyclic structure.

8. The light emitting device of claim 6, wherein m is 2.

9. The light emitting device of claim 5, wherein the wherein the phosphorescent material comprises a pyridine.

10. The device of claim 1, wherein the fluorescent emitter has a structure selected from the group consisting of:

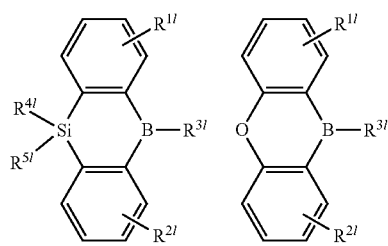

-continued

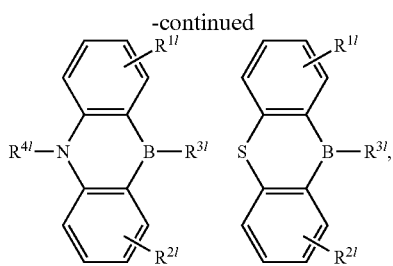

wherein each of $R^{11}$, $R^{21}$, $R^{31}$, $R^{41}$ and $R^{51}$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl. aralkyl, ester. alkoxycarbonyl, acylamino, alkoxycarbonylamino, aryloxycarbonylamino, sulfonylamino, sulfamoyl, carbamoyl, alkylthio, ureido, phosphoramide, silyl, polymeric, or any conjugate or combination thereof.

11. The device of claim 1, wherein the fluorescent emitter comprises a fused ring system containing 5 or more rings.

12. The device of claim 1, wherein the fluorescent emitter comprises the following structure:

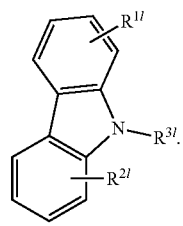

wherein each of $R^{1l}$, $R^{2l}$, and $R^{3l}$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino aryloxycarbonylamino, sulfonylamino, sulfamoyl. carbamoyl, alkylthio, ureido, phosphoramide, silyl, polymeric, or any conjugate or combination thereof.

* * * * *